(12) United States Patent
Ataka et al.

(10) Patent No.: US 8,093,349 B2
(45) Date of Patent: Jan. 10, 2012

(54) TERMINALLY MODIFIED POLYBRANCHED POLYIMIDE, METAL-PLATED TERMINALLY MODIFIED POLYBRANCHED POLYIMIDE, AND METHOD FOR PRODUCING THE SAME

(75) Inventors: Kikuo Ataka, Ube (JP); Tetsurou Tsuji, Ube (JP)

(73) Assignee: Ube Industries, Ltd. (JP)

( * ) Notice: Subject to any disclaimer, the term of this patent is extended or adjusted under 35 U.S.C. 154(b) by 535 days.

(21) Appl. No.: 12/375,211

(22) PCT Filed: Jul. 25, 2007

(86) PCT No.: PCT/JP2007/064611
§ 371 (c)(1),
(2), (4) Date: Jan. 30, 2009

(87) PCT Pub. No.: WO2008/013210
PCT Pub. Date: Jan. 31, 2008

(65) Prior Publication Data
US 2010/0009206 A1    Jan. 14, 2010

(30) Foreign Application Priority Data

| Jul. 25, 2006 | (JP) | 2006-202567 |
| Jul. 25, 2006 | (JP) | 2006-202568 |
| Jul. 25, 2006 | (JP) | 2006-202570 |
| Aug. 18, 2006 | (JP) | 2006-223517 |
| Jul. 12, 2007 | (JP) | 2007-182820 |

(51) Int. Cl.
*C08G 73/10* (2006.01)
*C23C 18/16* (2006.01)
(52) U.S. Cl. ......................... 528/353; 528/310; 428/458
(58) Field of Classification Search ................. 528/353, 528/310; 428/458
See application file for complete search history.

(56) References Cited

U.S. PATENT DOCUMENTS

| 3,498,948 | A | * | 3/1970 | Yoshitaka et al. | 528/126 |
| 5,965,687 | A | * | 10/1999 | Jensen | 528/86 |
| 2003/0064235 | A1 | | 4/2003 | Okawa et al. | |

FOREIGN PATENT DOCUMENTS

| JP | 44-11670 | 5/1969 |
| JP | 10-260531 | 9/1998 |
| JP | 11-130858 | 5/1999 |
| JP | 2002-208768 | 7/2002 |
| JP | 2002-226972 | 8/2002 |
| WO | WO 02/12926 | 2/2002 |

OTHER PUBLICATIONS

Wencai C. Wang, et al., "Electroless Plating of Copper on Fluorinated Polyimide Films Modified by Plasma Graft Copolymerization and UV-induced Graft Copolymerization with 4-Vinylpyridine," Macromol. Mater. Eng. 2003, 288, No. 2, pp. 152-163.

* cited by examiner

Primary Examiner — Kelechi Egwim
(74) Attorney, Agent, or Firm — Knobbe Martens Olson & Bear LLP

(57) ABSTRACT

A terminally-modified polybranched polyimide which can be efficiently complexed with an inorganic material is obtained by reacting a component (a): tetracarboxylic dianhydride; a component (b): as an amine component, a mixture of a triamine and a diamine (which may be composed of a triamine only); and a component (c): as a terminal component, a compound selected from general formulae (1-1) to (1-4).

$$H_2N-X-R^1 \quad (1\text{-}1)$$

(In the formula, X represents a single bond or an alkylene group having 1 to 3 carbon atoms, and $R^1$ represents a nitrogen-containing heterocyclic group).

$$H_2N-X-R^1 \quad (1\text{-}2)$$

(In the formula, X is as defined above, and $R^1$ represents a sulfur-containing heterocyclic group or an aryl group having a thiol or thioether group in the molecule.)

(1-3)

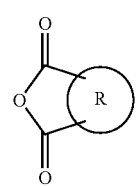

(In the formula, R represents a nitrogen-containing heterocyclic group.)

(1-4)

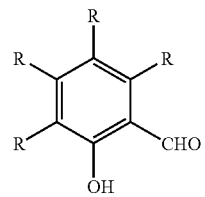

(In the formula, R represents a monovalent residue.)

21 Claims, 12 Drawing Sheets

←copper

←polybranched
 polyimide

Fig. 4·6
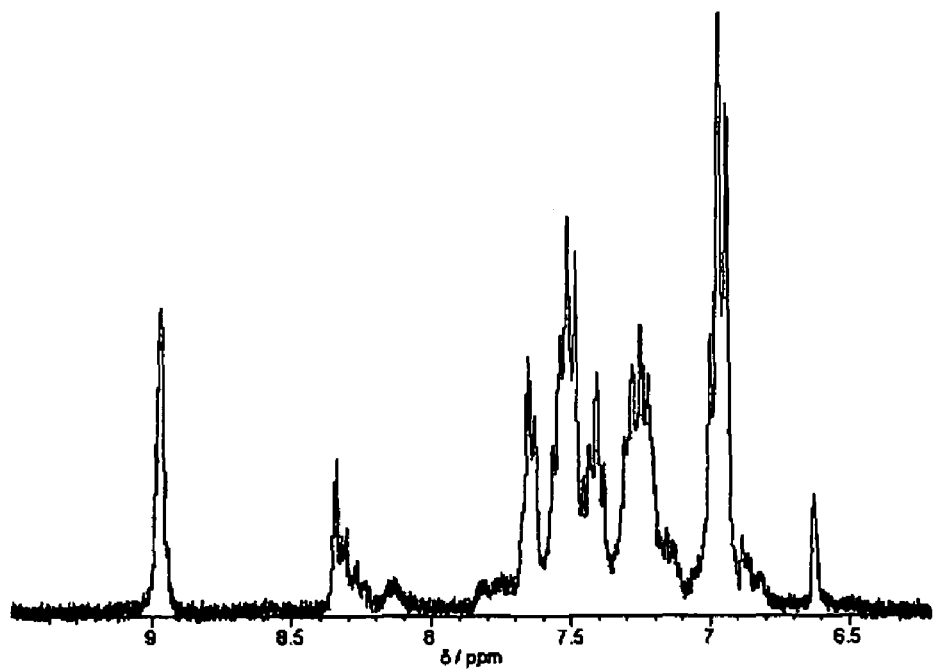
Fig. 4·7
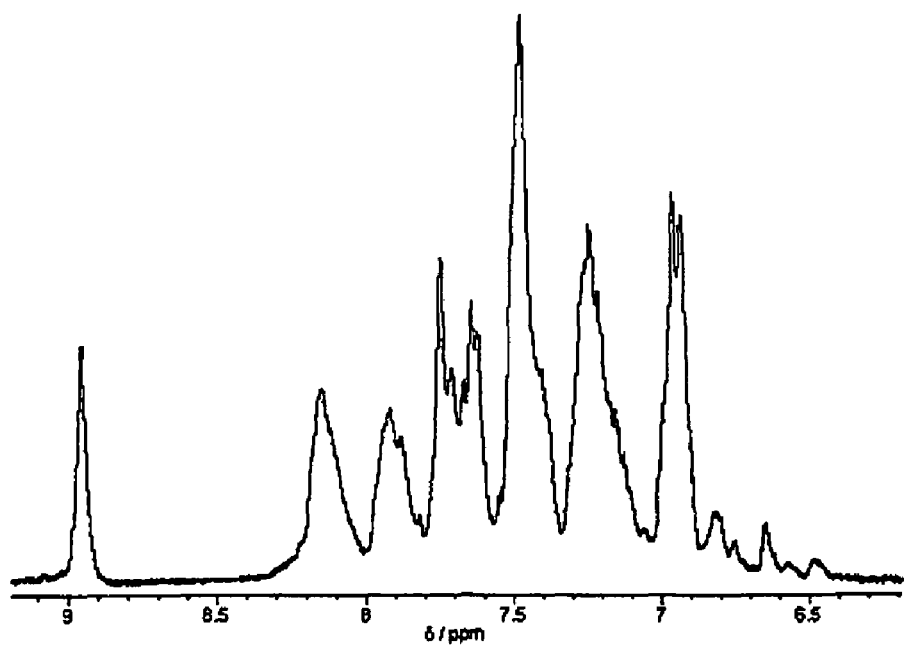

TERMINALLY MODIFIED POLYBRANCHED POLYIMIDE, METAL-PLATED TERMINALLY MODIFIED POLYBRANCHED POLYIMIDE, AND METHOD FOR PRODUCING THE SAME

This application is the U.S. National Phase under 35 U.S.C. §371 of International Application PCT/JP2007/064611, filed Jul. 25, 2007, which claims priority to Japanese Patent Application No. 2006-202567, filed Jul. 25, 2006, Japanese Patent Application No. 2006-202570, filed Jul. 25, 2006, Japanese Patent Application No. 2006-202568, filed Jul. 25, 2006, Japanese Patent Application No. 2006-223517, filed Aug. 18, 2006, Japanese Patent Application No. 2007-182820, filed Jul. 12, 2007. The International Application was published under PCT Article 21(2) in a language other than English.

TECHNICAL FIELD

The present invention relates to a terminally-modified polybranched polyimide having a modified terminal group or a terminally-modified polybranched polyimide which is produced by imidizing a polybranched polyamic acid having a modified terminal group. Furthermore, the invention relates to a metal-plated terminally-modified polybranched polyimide which is produced by subjecting a terminally-modified polybranched polyimide to electroless plating.

BACKGROUND ART

Polyimide is a highly useful polymer material which is excellent in heat resistance, forming property, and mechanical and electric properties, and many types of polyimides have been heretofore developed and widely used in various industrial fields.

Polyimide having aforementioned properties has been used in combination with an inorganic material in many cases. For example, a composite material combining polyimide having an insulation function and a conductive metal has been used as an electronic material. In particular, a metal-coated polyimide material produced by compositing a polyimide film and a metal foil is useful, and has been used for a flexible printed circuit board (FPC) or a board for tape automated bonding (TAB) or the like.

As a method for producing such a metal-coated polyimide material, various methods have been known up to now. For one thing, a method for subjecting polyimide to electroless plating or electroplating has been known. That is, it is a method for forming a metal layer on a surface of the polyimide film by subjecting the polyimide film to electroless plating and subsequently, as necessary, subjecting it to electroplating.

Patent Document 1 discloses an electroless plating method characterized in that a material to be plated is pre-treated with a solution containing alkali metal salts, and then treated with a compound including a silane coupling agent with a substituent having a metal capturing capability in the molecule as an effective ingredient, and subsequently treated with an aqueous solution of a noble metal compound for capturing the noble metal by a silane coupling agent, and then the material to be plated is subjected to electroless plating.

Patent Document 2 discloses a method of preparing a metal-plated film for forming a conductive circuit pattern on the surface of the polyimide substrate characterized in that the surface of the polyimide substrate is treated with a solution containing an organic disulfide compound having a primary amino group or an organic thiol compound having a primary amino group in the presence of an alkaline substance in advance.

In Non-Patent Document 1, there has been reviewed a method for coating the surface of the straight chain polyimide film with a polymer compound having a pyridyl group having a metal coordination capacity in the main chain.

Patent Document 1: Japanese Laid-open Patent Publication No. 2002-226972
Patent Document 2: Japanese Laid-open Patent Publication No. 2002-208768
Non-Patent Document 1: Macromol. Mater. Eng. Vol. 288, pp. 152-163 (2003)

DISCLOSURE OF THE INVENTION

Problems to be Solved by the Invention

An object of the present invention is to provide a polybranched polyimide which can be efficiently complexed with an inorganic material and a method for producing the same.

Furthermore, an object of the present invention is to provide a metal-coated polybranched polyimide excellent in adhesiveness of a metal to polyimide, which is obtained by carrying out the electroless plating after an electroless plating catalyst precursor is added to the polybranched polyimide conveniently, when the polybranched polyimide is subjected to electroless plating; and to provide a convenient method for producing the same.

Means for Solving the Problems

The present invention relates to the items below:

1. A terminally-modified polybranched polyimide obtained by reacting:
   component (a): tetracarboxylic dianhydride;
   component (b): as an amine component, a mixture of a triamine and a diamine, wherein the mixture may be composed of a triamine only; and
   component (c): as a terminal component, a compound selected from general formulae (1-1) to (1-4);
   such that at least a part of polymer terminal is derived from the compound selected from the general formulae (1-1) to (1-4).

wherein, in the general formula (1-1), X represents a single bond or an alkylene group having 1 to 3 carbon atoms; $R^1$ represents a nitrogen-containing heterocyclic group substituted with any group selected from a substituent group α; and the substituent group α represents hydrogen atom, halogen atom, hydroxyl group, nitro group, carboxylic acid group and salt thereof, sulfonic acid group and salt thereof, ester group, amide group, cyano group, alkyl group, alkoxy group or aryl group.

wherein, in the general formula (1-2), X represents a single bond or an alkylene group having 1 to 3 carbon atoms; $R^1$ represents a sulfur-containing heterocyclic group or an aryl group having a thiol or thioether group in the molecule, which are substituted with any group selected from the substituent group α; wherein the substituent group α is as defined in the general formula (1-1).

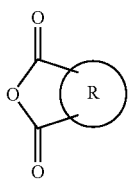

wherein, in the general formula (1-3), R represents a nitrogen-containing heterocyclic group substituted with any group selected from the substituent group α; wherein the substituent group α is as defined in the general formula (1-1).

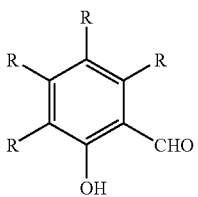

wherein, in the general formula (1-4), R each represents a monovalent residue and have the same meaning as the substituent group α defined in the general formula (1-1); and R may be the same or different each other.

2. The terminally-modified polybranched polyimide according to the above item 1, wherein the terminal component is selected from the compounds represented by the general formulae (1-1) and (1-2) and the amine component is composed of triamine only, and the polyimide is obtained by reacting tetracarboxylic dianhydride and triamine of the molar ratio {the molar ratio of (tetracarboxylic dianhydride)/(triamine)} of not less than 3/2 with a compound selected from those represented by the general formulae (1-1) and (1-2).

3. The terminally-modified polybranched polyimide according to the above item 1, wherein the terminal component is selected from those represented by the general formulae (1-3) and (1-4) and the amine component is composed of a triamine only, and the polyimide is obtained by reacting tetracarboxylic acid dianhydride and triamine of the molar ratio {the molar ratio of (tetracarboxylic dianhydride)/(triamine)} of from 1/2 to less than 3/2 with a compound selected from those represented by the general formulae (1-3) and (1-4).

4. The terminally-modified polybranched polyimide according to any one of the above items 1 to 3, obtained by reacting:

(i) a polyamic acid obtained by reacting the component (a): tetracarboxylic acid dianhydride and the component (b) the amine component and (ii) the component (c): the terminal component.

5. The terminally-modified polybranched polyimide according to any one of the above items 1 to 4, wherein the compound represented by the general formula (1-1) has at least one pyridyl group in the molecule.

6. The terminally-modified polybranched polyimide according to any one of the above items 1 to 4, wherein the compound represented by the general formula (1-2) is a compound having at least one thioether moiety in the molecule.

7. The terminally-modified polybranched polyimide according to any one of the above items 1 to 4, wherein the compound represented by the general formula (1-3) has at least one pyridyl group in the molecule.

8. The terminally-modified polybranched polyimide according to any one of the above items 1 to 4, wherein the compound represented by the general formula (1-4) is salicylaldehyde.

9. The terminally-modified polybranched polyimide according to any one of the above items 1 to 8, which is formed on one side or both sides of a heat resistant polyimide film.

10. The terminally-modified polybranched polyimide according to the above 9, obtained by:

applying a polyamic acid solution capable of forming the terminally-modified polybranched polyimide according to any one of the above items 1 to 8 on a cast layer of the polyamic acid solution or a self-supporting film obtained by heat-drying the cast layer of the polyamic acid solution both of which are capable of forming heat resistant polyimide film, by a coating method, a casting method or a printing method, and then heat-drying and imidizing the resulting film.

11. The terminally-modified polybranched polyimide according to the above items 9 or 10, wherein the heat resistant polyimide film is a polyimide obtained from an acid component containing 3,3',4,4'-biphenyltetracarboxylic dianhydride and a diamine component containing p-phenylene diamine or a polyimide obtained from an acid component containing pyromellitic dianhydride and an amine component containing 4,4'-diaminodiphenyl ether.

12. A terminally-modified polybranched polyimide for accelerating electroless plating, wherein an electroless plating catalyst precursor has been adsorbed on the terminally-modified polybranched polyimide according to any one of the above items 1 to 11.

13. The terminally-modified polybranched polyimide for accelerating electroless plating according to the above item 12, wherein the electroless plating catalyst precursor is a palladium compound.

14. A metal-coated terminally-modified polybranched polyimide, wherein electroless metal plating has been carried out on the terminally-modified polybranched polyimide for accelerating electroless plating according to the above item 12 or 13.

15. A method for producing a metal-coated terminally-modified polybranched polyimide comprising steps of:

(1) producing a terminally-modified polybranched polyimide by reacting:

component (a): tetracarboxylic acid dianhydride;

component (b): as an amine component, a mixture of triamine and diamine, wherein the mixture may be composed of triamine only; and component (c): as a terminal component, a compound selected from general formulae (1-1) to (1-4)

such that at least a part of polymer terminal is derived from the compound selected from general formulae (1-1) to (1-4);

(2) producing a terminally-modified polybranched polyimide for accelerating electroless plating by causing adsorption of an electroless plating catalyst precursor onto the terminally-modified polybranched polyimide; and (3) producing a metal-coated terminally-modified polybranched polyimide by carrying out electroless metal plating on the terminally-modified polybranched polyimide for accelerating electroless plating.

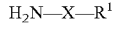 (1-1)

wherein, in the general formula (1-1), X represents a single bond or an alkylene group having 1 to 3 carbon atoms; $R^1$ represents a nitrogen-containing heterocyclic group substituted with any group selected from a substituent group α; and the substituent group α represents hydrogen atom, halogen atom, hydroxyl group, nitro group, carboxylic acid group and salt thereof, sulfonic acid group and salt thereof, ester group, amide group, cyano group, alkyl group, alkoxy group or aryl group.

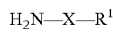  (1-2)

wherein, in the general formula (1-2), X represents a single bond or an alkylene group having 1 to 3 carbon atoms; $R^1$ represents a sulfur-containing heterocyclic group or an aryl group having a thiol or thioether group in the molecule, which are substituted with any group selected from the substituent group α; wherein the substituent group α is as defined in the general formula (1-1).

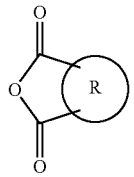  (1-3)

wherein, in the general formula (1-3), R represents a nitrogen-containing heterocyclic group substituted with any group selected from the substituent group α; wherein the substituent group α is as defined in the general formula (1-1).

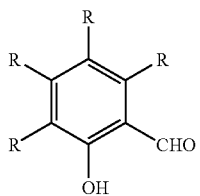  (1-4)

wherein, in the general formula (1-4), R each represent a monovalent residue and have the same meaning as the substituent group α defined in the general formula (1-1); and R may be the same or different each other.

16. The method for producing a metal-coated terminally-modified polybranched polyimide according to the above item 15, in which, in the step (1), the terminal component is selected from the compounds represented by the general formulae (1-1) and (1-2) and the amine component is composed of triamine only, and tetracarboxylic dianhydride and triamine of the molar ratio {the molar ratio of (tetracarboxylic dianhydride)/(triamine)} of not less than 3/2 are reacted with a compound selected from those represented by the general formulae (1-1) and (1-2).

17. The method for producing a metal-coated terminally-modified polybranched polyimide according to the above item 15, in which, in the step (1), the terminal component is selected from those represented by the general formulae (1-3) and (1-4) and the amine component is composed of triamine only, and tetracarboxylic dianhydride and triamine of the molar ratio {the molar ratio of (tetracarboxylic dianhydride)/(triamine)} of from 1/2 to less than 3/2 are reacted with a compound selected from those represented by the general formulae (1-3) and (1-4).

18. The method for producing a metal-coated terminally-modified polybranched polyimide according to any one of the above items 15 to 17, in which, in the step (1) of producing a terminally-modified polybranched polyimide, a polyamic acid obtained by reacting the component (a): tetracarboxylic dianhydride and the component (b): the amine component is reacted with the component (c): the terminal component.

19. The terminally-modified polybranched polyimide according to any one of the above items 1 to 11, wherein the triamine is an aromatic triamine represented by the general formula (I),

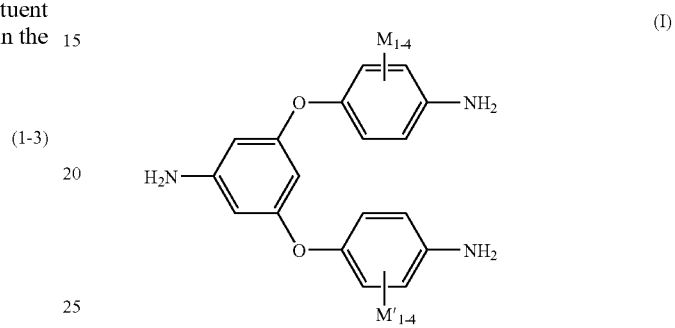  (I)

wherein, in the general formula (I), $M_1$ to $M_4$ and $M'_1$ to $M'_4$ each represent —H, —CN, —OCH$_3$, —COOH, —CH$_3$, —C$_2$H$_5$ or —CF$_3$; and $M_1$ to $M_4$ and $M'_1$ to $M'_4$ may each independently be the same or different.

20. The terminally-modified polybranched polyimide for accelerating electroless plating according to the above item 12 or 13, wherein the triamine is an aromatic triamine represented by the general formula (I).

21. The metal-coated terminally-modified polybranched polyimide according to the above item 14, wherein the triamine is an aromatic triamine represented by the general formula (I).

EFFECT OF THE INVENTION

The polybranched polyimide obtained from diamine containing a triamine as a synthetic raw material is a polyimide with a highly branched molecular chain, and is characterized by having many terminal groups as compared to straight chain polymers. Therefore, by modifying the terminals or introducing amino group in the terminals, electroless plating catalyst precursor becomes easily adsorbed so that electroless plating can be easily performed and a metal-coated polyimide can be simply produced.

In particular, in the terminally-modified polybranched polyimide of the present invention, an acid anhydride terminal group or an amino group of the polybranched polyamic acid obtained from a diamine containing a triamine or the polyimide has been modified with a compound including a group having a high ability to form chemical bonding, such as coordination bonding and the like, with inorganic compounds. Therefore, since it has a high affinity for inorganic compound, an organic-inorganic composite can be easily made. Accordingly, the electroless plating catalyst precursor becomes easily adsorbed so that electroless plating can be easily performed and a metal-coated polyimide can be simply produced.

Further, introduction of a group containing sulfur into the terminal group is expected to attain an effect of lowering the dielectric constant.

BRIEF DESCRIPTION OF THE DRAWINGS

FIG. 1-2 is a spectrum of a portion showing the absorption in the aromatic range of $^1$H-NMR (300 MHz, DMSO-$d_6$) of the terminally-modified polybranched polyimide in Example I-41.

FIG. 1-3 is an ATR-IR spectrum of the terminally-modified polybranched polyimide in Example I-45.

FIG. 1-4 is a TEM photograph of the cross section of the copper-coated polybranched polyimide film in Example I-64.

FIG. 2-1 is a spectrum of a portion showing the absorption in the aromatic range of $^1$H-NMR (300 MHz, DMSO-$d_6$) of the terminally-modified polybranched polyimide in Example II-20.

FIG. 2-2 is an ATR-IR spectrum of the terminally-modified polybranched polyimide in Example II-25.

FIG. 3-1 is a spectrum of a portion showing the absorption in the aromatic range of $^1$H-NMR (300 MHz, DMSO-$d_6$) of the terminally-modified polybranched polyimide in Example III-4.

FIG. 4-1 is a spectrum of a portion showing the absorption in the aromatic range of $^1$H-NMR (300 MHz, DMSO-$d_6$) of the terminal group-modified polybranched polyimide in Example IV-1.

FIG. 4-2 is a spectrum of a portion showing the absorption in the aromatic range of $^1$H-NMR (300 MHz, DMSO-$d_6$) of the terminal group-modified polybranched polyimide in Example IV-2.

FIG. 4-3 is a spectrum of a portion showing the absorption in the aromatic range of $^1$H-NMR (300 MHz, DMSO-$d_6$) of the terminal group-modified polybranched polyimide in Example IV-3.

FIG. 4-4 is a spectrum of a portion showing the absorption in the aromatic range of $^1$H-NMR (300 MHz, DMSO-$d_6$) of the terminal group-modified polybranched polyimide in Example IV-4.

FIG. 4-5 is a spectrum of a portion showing the absorption in the aromatic range of $^1$H-NMR (300 MHz, DMSO-$d_6$) of the terminal group-modified polybranched polyimide in Example IV-5.

FIG. 4-6 is a spectrum of a portion showing the absorption in the aromatic range of $^1$H-NMR (300 MHz, DMSO-$d_6$) of the terminal group-modified polybranched polyimide in Example IV-6.

FIG. 4-7 is a spectrum of a portion showing the absorption in the aromatic range of $^1$H-NMR (300 MHz, DMSO-$d_6$) of the terminal group-modified polybranched polyimide in Example IV-7.

FIG. 4-8 is a spectrum of a portion showing the absorption in the aromatic range of $^1$H-NMR (300 MHz, DMSO-$d_6$) of the terminal group-modified polybranched polyimide in Example IV-8.

FIG. 4-9 is a spectrum of a portion showing the absorption in the aromatic range of $^1$H-NMR (300 MHz, DMSO-$d_6$) of the terminal group-modified polybranched polyimide in Example IV-8.

FIG. 4-10 is an FTIR-ATR spectrum of the terminal group-modified, polybranched polyimide in Example IV-10.

FIG. 5-1 is a chart of an FT-IR spectrum of the polyimide film obtained in Example V-7.

FIG. 5-2 is a chart of an FT-IR spectrum of the polyimide film obtained in Example V-8.

BEST MODE FOR CARRYING OUT THE INVENTION

Figure 1:
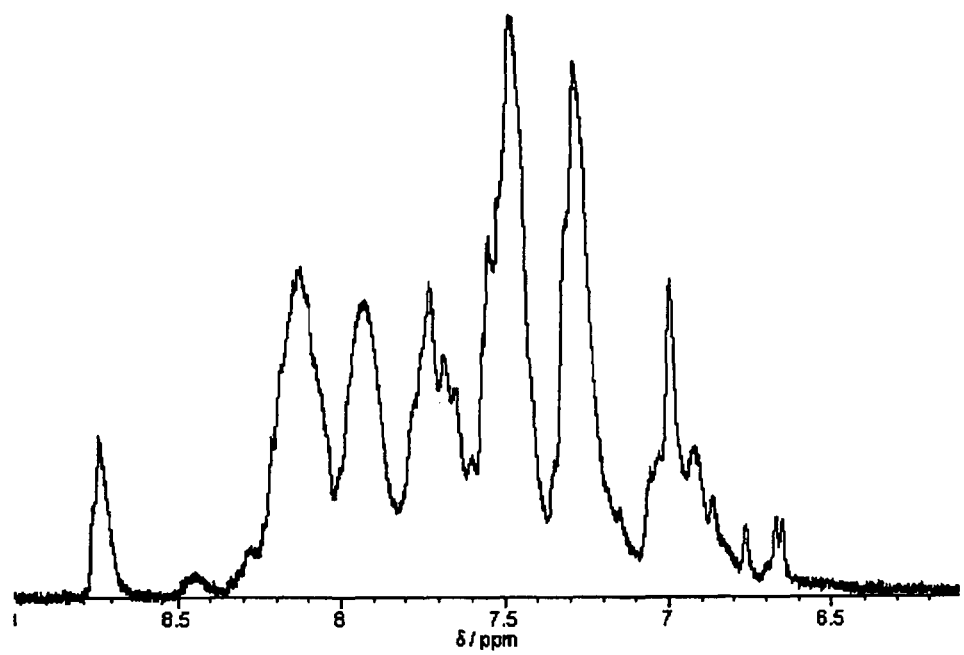
FIG. 1-1 is a spectrum of a portion showing the absorption in the aromatic range of $^1$H-NMR (300 MHz, DMSO-$d_6$) of the terminally-modified polybranched polyimide in Example I-40.

The present invention and the present application include several aspects and are roughly divided into the following first to fifth aspects. Herein, the amine component of the component (b) of the present invention is a mixture of triamine and diamine, wherein triamine is present as an essential ingredient, and diamine may not be present in some cases and it may be composed of 100% triamine. In the following description, the term, "the diamine containing a triamine", may be used including cases in which triamine is contained by 100% as above.

The first aspect of the present invention mainly relates to a terminally-modified polybranched polyimide obtained by reacting tetracarboxylic dianhydride as the component (a), a diamine containing a triamine represented by the general formula (2) as the amine component of the component (b), and a compound having a nitrogen-containing heterocyclic group represented by the general formula (1-1) (hereinafter, may be referred to as the compound of the formula (1-1)) as the terminal component of the component (c).

H$_2$N—X—R$^1$ (1-1)

In the general formula (1-1), X represents a single bond or an alkylene group having 1 to 3 carbon atoms; R$^1$ represents a monovalent residue having a nitrogen-containing heterocyclic group substituted with any group selected from the substituent group α; and the substituent group α represents hydrogen atom, halogen atom, hydroxyl group, nitro group, carboxylic acid group and salt thereof, sulfonic acid group and salt thereof, ester group, amide group, cyano group, alkyl group, alkoxy group or aryl group.

In the first aspect, the terminally-modified polybranched polyimide is preferably obtained by reacting tetracarboxylic dianhydride and triamine of the molar ratio (the molar ratio of tetracarboxylic dianhydride/triamine) of not less than 3/2 with the compound of the general formula (1-1).

The second aspect of the present invention mainly relates to a terminally-modified polybranched polyimide obtained by reacting tetracarboxylic dianhydride as the component (a), a diamine containing a triamine represented by the general formula (2) as the amine component of the component (b), and a sulfur-containing compound represented by the general formula (1-2) (Or may be called a compound having a sulfur-containing heterocyclic group; hereinafter, may be referred to as the compound of the general formula (1-2)) as the terminal component of the component (c).

H$_2$N—X—R$^1$ (1-2)

In the general formula (1-2), X represents a single bond or an alkylene group having 1 to 3 carbon atoms; R$^1$ represents a sulfur-containing heterocyclic group substituted with any group selected from the substituent group α or an aryl group having at least one thioether or thiol group in the molecule; and the substituent group α represents hydrogen atom, halogen atom, hydroxyl group, nitro group, carboxylic acid group and salt thereof, sulfonic acid group and salt thereof, ester group, amide group, cyano group, alkyl group, alkoxy group or aryl group.

In the second aspect, the terminally-modified polybranched polyimide is preferably obtained by reacting tetracarboxylic dianhydride and triamine of the molar ratio (the molar ratio of tetracarboxylic dianhydride/triamine) of not less than 3/2 with the compound of the general formula (1-2).

The third aspect of the present invention mainly relates to a terminally-modified polybranched polyimide obtained by reacting tetracarboxylic dianhydride as the component (a), a diamine containing a triamine represented by the general formula (2) as the amine component of the component (b), and a compound having a nitrogen-containing heterocyclic group represented by the general formula (1-3) (hereinafter referred to as the compound of the general formula (1-3) in some cases) as the terminal component of the component (c).

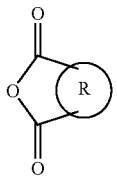

(1-3)

In the general formula (1-3), R represents a nitrogen-containing heterocyclic group substituted with any group selected from the substituent group α; and the substituent group α represents hydrogen atom, halogen atom, hydroxyl group, nitro group, carboxylic acid group and salt thereof, sulfonic acid group and salt thereof, ester group, amide group, cyano group, alkyl group, alkoxy group or aryl group.

In the third aspect, the terminally-modified polybranched polyimide is preferably obtained by reacting tetracarboxylic dianhydride and triamine of the molar ratio (the molar ratio of tetracarboxylic dianhydride/triamine) of from 1/2 to less than 3/2 with the compound of the general formula (1-3).

The fourth aspect of the present invention mainly relates to a terminally-modified polybranched polyimide obtained by reacting tetracarboxylic dianhydride as the component (a), a diamine containing a triamine represented by the general formula (2) as the amine component of the component (b), and aromatic o-hydroxyaldehyde represented by the general formula (1-4) (hereinafter referred to as the compound of the general formula (1-4) in some cases) as the terminal component of the component (c).

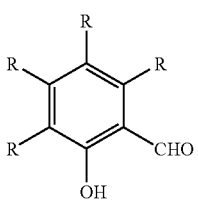

(1-4)

In the general formula (1-4), R represents a monovalent residue, and represents a hydrogen atom, a halogen atom, a hydroxyl group, a nitro group, a carboxylic acid group and a salt thereof, a sulfonic acid group and a salt thereof, an ester group, an amide group, a cyano group, an alkyl group, an alkoxy group or an aryl group; and R may be the same or different.

In the fourth aspect, the terminally-modified polybranched polyimide is preferably obtained by reacting tetracarboxylic dianhydride and triamine of the molar ratio (the molar ratio of tetracarboxylic dianhydride/triamine) of from 1/2 to less than 3/2 with the compound of the general formula (1-4).

To produce the terminally-modified polybranched polyimides of the above first to fourth aspects, preferably used is a method comprising reacting tetracarboxylic acid dianhydride of the component (a) with the amine component of the component (b), whereby synthesizing a polyamic acid, and reacting the polyamic acid with the terminal component of the component (c).

In addition, from the terminally-modified polybranched polyimides of the above first to fourth aspects, there can be obtained a polyimide for accelerating electroless plating by having an electroless plating catalyst precursor adsorbed on the polyimide. Furthermore, a metal-coated polyimide can be obtained by carrying out electroless metal plating on the polyimide for accelerating electroless plating.

The fifth aspect of the present invention relates to the following items.

1. An aromatic triamine represented by the general formula (I),

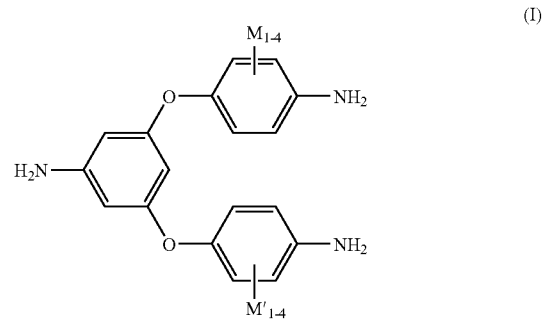

(I)

wherein, in the general formula (I), $M_1$ to $M_4$ and $M'_1$ to $M'_4$ each represent —H, —CN, —OCH$_3$, —COOH, —CH$_3$, —C$_2$H$_5$ or —CF$_3$; and $M_1$ to $M_4$ and $M'_1$ to $M'_4$ may each independently represent the same or different.

2. An aromatic monoamine represented by the general formula (II),

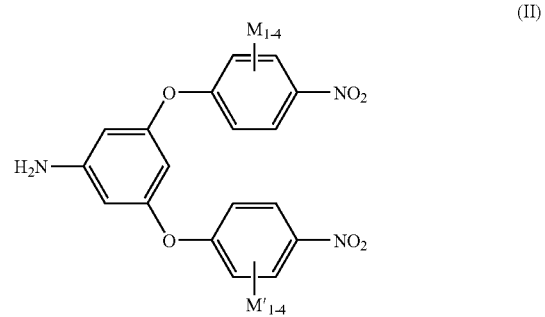

(II)

wherein, in the general formula (II), $M_1$ to $M_4$ and $M'_1$ to $M'_4$ each represent —H, —CN, —OCH$_3$, —COOH, —CH$_3$, —C$_2$H$_5$ or —CF$_3$; and $M_1$ to $M_4$ and $M'_1$ to $M'_4$ may each independently represent the same or different.

3. A method for producing an aromatic triamine represented by the general formula (I) comprising a step of reducing the aromatic monoamine represented by the general formula (II).

4. A polyamic acid obtained from the diamine containing an aromatic triamine represented by the general formula (I) as described in the above 1 and tetracarboxylic dianhydride.

5. A polyimide obtained from the diamine containing an aromatic triamine represented by the general formula (I) as described in the above 1 and tetracarboxylic dianhydride.

The triamine represented by the above general formula (I) is suitable as a triamine used in the first to fifth aspects of the present invention.

The triamine represented by the general formula (2) used in the first to fourth aspects of the present invention has the following structure in common,

YAA'A"  (2)

wherein, in the general formula (2), Y represents a trivalent residue; A, A' and A" are bonded to Y, and each represent a monovalent residue containing an amino group; and A, A' and A" may each independently be the same or different.

As one example of synthesis methods of the triamine represented by the general formula (2), when one, two or three amino group(s) is nitro group(s) in triamines represented by the general formula (2), a triamine can be produced by the reduction of its nitro group or the like.

As a method for reducing a nitro group, known reduction methods can be suitably selected, and the examples include a reduction by tin (II) chloride or sodium dithionate or the catalytic reduction in a solvent. In the catalytic reduction, as a catalyst, there can be used palladium, Raney nickel or platinum, and as a hydrogen source, there can be used molecular hydrogen, hydrazine, formic acid or ammonium formate. In particular, it is economical and preferable to carry out the reduction reaction in an organic solvent using a palladium compound for a catalyst and using molecular hydrogen for a hydrogen source.

The solvent used for the reduction is not restricted as far as it dissolves an amino compound of a reduction product or its raw material nitro compound without hindering the reaction. Examples thereof include alcohols; dioxane; aromatic solvents such as toluene, xylene and the like; sulfoxide solvents such as dimethylsulfoxide, diethylsulfoxide and the like; formamide solvents such as N,N-dimethylformamide, N,N-diethylformamide and the like; acetamide solvents such as N,N-dimethylacetamide, N,N-diethylacetamide and the like; pyrrolidone solvents such as N-methyl-2-pyrrolidone, N-vinyl-2-pyrrolidone and the like; phenol solvents such as phenol, o-, m- or p-cresol, xylenol, halogenated phenol, catechol and the like; hexamethyl phosphoramide, γ-butyrolactone and the like.

As the triamine represented by the general formula (2), known and novel triamines can be used, and an aromatic triamine is particularly preferably used. Further, A, A' and A" represented by the general formula (2) are each preferably a monovalent residue of aminobenzene represented by the general formula (3),

[Chemical Formula 10]

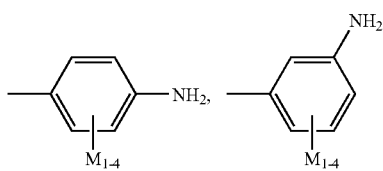

(3)

wherein, in the general formula (3), $M_1$ to $M_4$ each represent —H, —CN, —OCH$_3$, —COOH, —CH$_3$, —C$_2$H$_5$ or —CF$_3$; and $M_1$ to $M_4$ may each independently represent the same or different.

Specific examples of the triamine represented by the general formula (2) include an aromatic triamine represented by the general formula (4) and preferably an aromatic triamine represented by the general formula (6).

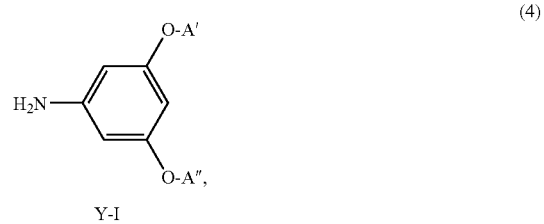

Y-I (4)

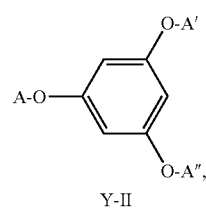

Y-II

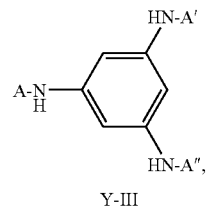

Y-III

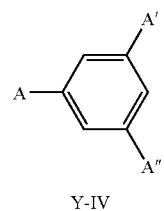

Y-IV

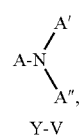

Y-V

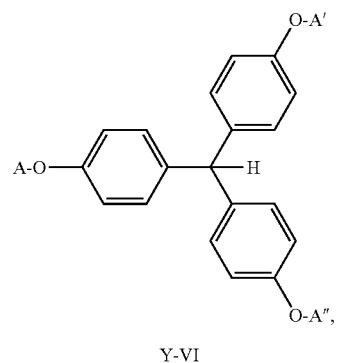

Y-VI

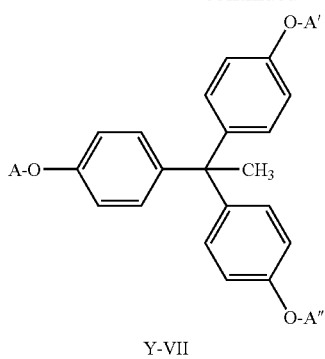

Y-VII wherein, in the general formula (4), A, A' and A" each represent a monovalent residue containing aminobenzene represented by the general formula (5); and A, A' and A" may each independently be the same or different.

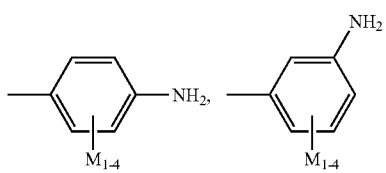
(5)

wherein, in the general formula (5), $M_1$ to $M_4$ each represent —H, —CN, —OCH$_3$, —COOH, —CH$_3$, —C$_2$H$_5$ or —CF$_3$; and $M_1$ to $M_4$ may each independently be the same or different,

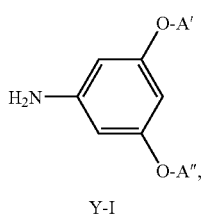
(6)

Y-I

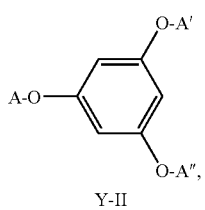

Y-II

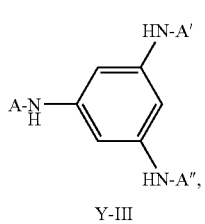

Y-III

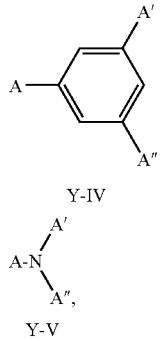

Y-IV

A-N(A')(A"),

Y-V

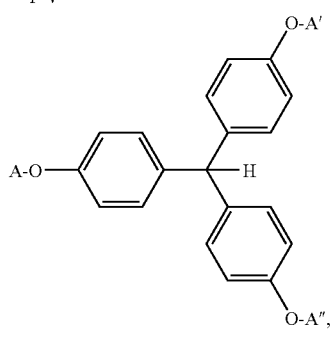

Y-VI

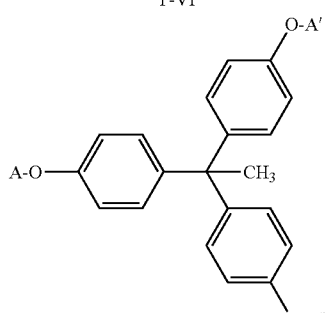

Y-VII wherein, in the general formula (6), A, A' and A" each represent a monovalent residue containing aminobenzene represented by the general formula (7); and A, A' and A" may each independently be the same or different,

[Chemical Formula 14]

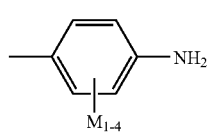
(7)

wherein, in the general formula (7), $M_1$ to $M_4$ each represent —H, —CN, —OCH$_3$, —COOH, —CH$_3$, —C$_2$H$_5$ or —CF$_3$; and $M_1$ to $M_4$ may each independently be the same or different, Examples of the triamine represented by the general formula (2) except for the aromatic triamine represented by the general formula (4) include 1,3,5-triaminobenzene and the like.

Examples of the aromatic triamine represented by Y-I of the general formula (4) include 3,5-di(4-aminophenoxy)

aniline, 3,5-di(3-methyl,4-aminophenoxy)aniline, 3,5-di(3-methoxy,4-aminophenoxy)aniline, 3,5-di(2-methyl,4-aminophenoxy)aniline, 3,5-di(2-methoxy,4-aminophenoxy)aniline, 3,5-di(3-ethyl,4-aminophenoxy)aniline and the like.

Examples of the aromatic triamine represented by Y-II of the general formula (4) include 1,3,5-tri(4-aminophenoxy)benzene, 1,3,5-tri(3-methyl,4-aminophenoxy)benzene, 1,3,5-tri(3-methoxy,4-aminophenoxy)benzene, 1,3,5-tri(2-methyl,4-aminophenoxy)benzene, 1,3,5-tri(2-methoxy,4-aminophenoxy)benzene, 1,3,5-tri(3-ethyl,4-aminophenoxy)benzene and the like.

Examples of the aromatic triamine represented by Y-III of the general formula (4) include 1,3,5-tri(4-aminophenylamino)benzene, 1,3,5-tri(3-methyl,4-aminophenylamino)benzene, 1,3,5-tri(3-methoxy,4-aminophenylamino)benzene, 1,3,5-tri(2-methyl,4-aminophenylamino)benzene, 1,3,5-tri(2-methoxy,4-aminophenylamino)benzene, 1,3,5-tri(3-ethyl,4-aminophenylamino)benzene and the like.

Examples of the aromatic triamine represented by Y-IV of the general formula (4) include 1,3,5-tri(4-aminophenyl)benzene, 1,3,5-tri(3-methyl,4-aminophenyl)benzene, 1,3,5-tri(3-methoxy,4-aminophenyl)benzene, 1,3,5-tri(2-methyl,4-aminophenyl)benzene, 1,3,5-tri(2-methoxy,4-aminophenyl)benzene, 1,3,5-tri(3-ethyl,4-aminophenyl)benzene and the like.

Examples of the aromatic triamine represented by Y-V of the general formula (4) include 1,3,5-tri(4-aminophenyl)amine, 1,3,5-tri(3-methyl,4-aminophenyl)amine, 1,3,5-tri(3-methoxy,4-aminophenyl)amine, 1,3,5-tri(2-methyl,4-aminophenyl)amine, 1,3,5-tri(2-methoxy,4-aminophenyl)amine, 1,3,5-tri(3-ethyl,4-aminophenyl)amine and the like.

Examples of the aromatic triamine represented by Y-VI of the general formula (4) include tris(4-(4-aminophenoxy)phenyl)methane, tris(4-(3-methyl,4-aminophenoxy)phenyl)methane, tris(4-(3-methoxy, 4-aminophenoxy)phenyl)methane, tris(4-(2-methyl,4-aminophenoxy)phenyl)methane, tris(4-(2-methoxy,4-aminophenoxy)phenyl)methane, tris(4-(3-ethyl,4-aminophenoxy)phenyl)methane and the like.

Examples of the aromatic triamine represented by Y-VII of the general formula (4) include tris(4-(4-aminophenoxy)phenyl)ethane, tris(4-(3-methyl,4'-aminophenoxy)phenyl)ethane, tris(4-(3-methoxy,4-aminophenoxy)phenyl)ethane, tris(4-(2-methyl,4-aminophenoxy)phenyl)ethane, tris(4-(2-methoxy,4-aminophenoxy)phenyl)ethane, tris(4-(3-ethyl,4-aminophenoxy)phenyl)ethane and the like.

The diamine is a diamine containing a triamine represented by the general formula (2). The amount of the triamine represented by the general formula (2) can be suitably selected depending on the purpose or the reaction method in use, and the triamine represented by the general formula (2) may be contained in an amount of preferably from 1 to 100 mol %, further preferably from 10 to 100 mol %, more preferably from 20 to 100 mol %, more preferably from 50 to 100 mol % and particularly preferably from 80 to 100 mol % in the diamine.

Examples of the diamine, except for the triamine represented by the general formula (2), include aromatic diamines such as p-phenylene diamine, m-phenylene diamine, 2-methyl-p-phenylene diamine, 3-methyl-m-phenylene diamine, 3,3'-dichlorobenzidine, 3,3'-dimethylbenzidine, 2,2'-dimethylbenzidine, 3,3'-dimethoxybenzidine, 3,3'-diaminodiphenyl ether, 3,4'-diaminodiphenyl ether, 4,4'-diaminodiphenyl ether, 3,3'-diaminodiphenyl sulfide, 3,4'-diaminodiphenyl sulfide, 4,4'-diaminodiphenyl sulfide, 3,3'-diaminodiphenyl sulfone, 3,4'-diaminodiphenyl sulfone, 4,4'-diaminodiphenyl sulfone, 3,3'-diaminobenzophenone, 3,3'-diamino-4,4'-dichlorobenzophenone, 3,3'-diamino-4,4'-dimethoxybenzophenone, 3,3'-diaminodiphenyl methane, 3,4'-diaminodiphenyl methane, 4,4'-diaminodiphenyl methane, 2,2-bis(3-aminophenyl)propane, 2,2-bis(4-aminophenyl)propane, 2,2-bis(3-aminophenyl)-1,1,1,3,3,3-hexafluoropropane, 2,2-bis(4-aminophenyl)-1,1,1,3,3,3-hexafluoropropane, 3,3'-diaminodiphenyl sulfoxide, 3,4'-diaminodiphenyl sulfoxide, 4,4'-diaminodiphenyl sulfoxide, 1,3-bis(3-aminophenyl)benzene, 1,3-bis(4-aminophenyl)benzene, 1,4-bis(3-aminophenyl)benzene, 1,4-bis(4-aminophenyl)benzene, 1,3-bis(4-aminophenoxy)benzene, 1,4-bis(3-aminophenoxy)benzene, 1,4-bis(4-aminophenoxy)benzene, 1,3-bis(3-aminophenoxy)-4-trifluoromethylbenzene, 3,3'-diamino-4-(4-phenyl)phenoxybenzophenone, 3,3'-diamino-4,4'-di(4-phenylphenoxy)benzophenone, 1,3-bis(3-aminophenyl sulfide)benzene, 1,3-bis(4-aminophenyl sulfide)benzene, 1,4-bis(4-aminophenyl sulfide)benzene, 1,3-bis(3-aminophenyl sulfone)benzene, 1,3-bis(4-aminophenyl sulfone)benzene, 1,4-bis(4-aminophenyl sulfone)benzene, 1,3-bis[2-(4-aminophenyl)isopropyl]benzene, 1,4-bis[2-(3-aminophenyl)isopropyl]benzene, 1,4-bis[2-(4-aminophenyl)isopropyl]benzene, 3,3'-bis(3-aminophenoxy)biphenyl, 3,3'-bis(4-aminophenoxy)biphenyl, 4,4'-bis(3-aminophenoxy)biphenyl, 4,4'-bis(4-aminophenoxy)biphenyl, bis[3-(3-aminophenoxy)phenyl]ether, bis[3-(4-aminophenoxy)phenyl]ether, bis[4-(3-aminophenoxy)phenyl]ether, bis[4-(4-aminophenoxy)phenyl]ether, bis[3-(3-aminophenoxy)phenyl]ketone, bis[3-(4-aminophenoxy)phenyl]ketone, bis[4-(3-aminophenoxy)phenyl]ketone, bis[4-(4-aminophenoxy)phenyl]ketone, bis[3-(3-aminophenoxy)phenyl]sulfide, bis[3-(4-aminophenoxy)phenyl]sulfide, bis[4-(3-aminophenoxy)phenyl]sulfide, bis[4-(4-aminophenoxy)phenyl]sulfide, bis[3-(3-aminophenoxy)phenyl]sulfone, bis[3-(4-aminophenoxy)phenyl]sulfone, bis[4-(3-aminophenoxy)phenyl]sulfone, bis[4-(4-aminophenoxy)phenyl]sulfone, bis[3-(3-aminophenoxy)phenyl]methane, bis[3-(4-aminophenoxy)phenyl]methane, bis[4-(3-aminophenoxy)phenyl]methane, bis[4-(4-aminophenoxy)phenyl]methane, 2,2-bis[3-(3-aminophenoxy)phenyl]propane, 2,2-bis[3-(4-aminophenoxy)phenyl]propane, 2,2-bis[4-(3-aminophenoxy)phenyl]propane, 2,2-bis[4-(4-aminophenoxy)phenyl]propane, 2,2-bis[3-(3-aminophenoxy)phenyl]-1,1,1,3,3,3-hexafluoropropane, 2,2-bis[3-(4-aminophenoxy)phenyl]-1,1,1,3,3,3-hexafluoropropane, 2,2-bis[4-(3-aminophenoxy)phenyl]-1,1,1,3,3,3-hexafluoropropane, 2,2-bis[4-(4-aminophenoxy)phenyl]-1,1,1,3,3,3-hexafluoropropane and the like. These may be used alone or in combination of two or more kinds.

As the diamine, in addition to the above aromatic diamines, there may be used aliphatic, alicyclic and siloxane-containing diamines in the ranges in which the characteristics of the present invention are not impaired.

Examples of the tetracarboxylic dianhydride include aromatic tetracarboxylic dianhydrides such as pyromellitic dianhydride, 3,3',4,4'-biphenyltetracarboxylic dianhydride, 2,3,3',4'-biphenyltetracarboxylic dianhydride, oxydiphthalic dianhydride, diphenyl sulfone-3,4,3',4'-tetracarboxylic dianhydride, bis(3,4-dicarboxyphenyl)sulfide dianhydride, 2,2-bis(3,4-dicarboxyphenyl)-1,1,1,3,3,3-hexafluoropropane dianhydride, 3,3',4,4'-benzophenonetetracarboxylic dianhydride, bis(3,4-dicarboxyphenyl)methane dianhydride, 2,2-bis(3,4-dicarboxyphenyl)propane dianhydride, p-phenylene bis(trimellitic acid monoester anhydride), p-biphenylene bis(trimellitic acid monoester anhydride), m-terphenyl-3,4,3',4'-tetracarboxylic dianhydride, p-terphenyl-3,4,3',4'-tetracarboxylic dianhydride, 1,3-bis(3,4-dicarboxyphenoxy)benzene dianhydride, 1,4-bis(3,4-dicarboxyphenoxy)benzene dianhydride, 1,4-bis(3,4-dicarboxyphenoxy)

biphenyl dianhydride, 2,2-bis[(3,4-dicarboxyphenoxy)phenyl]propane dianhydride, 2,3,6,7-naphthalene tetracarboxylic dianhydride, 1,4,5,8-naphthalene tetracarboxylic dianhydride and the like. These may be used alone or in combination of two or more kinds.

As the tetracarboxylic dianhydride, in addition to the above aromatic tetracarboxylic dianhydride, there may be used aliphatic, alicyclic and siloxane-containing tetracarboxylic dianhydrides in the ranges in which the characteristics of the present invention are not impaired.

Next, the compounds of the general formulae (1-1) to (1-4) used in each aspect of the present invention and a method for producing a terminal group-modified, polybranched polyimide in each aspect will be described.

In the first aspect of the present invention, the compound having a nitrogen-containing heterocyclic group represented by the general formula (1-1) is a compound having one amino group and at least one nitrogen-containing heterocyclic group in the molecule, and a compound having an amino group capable of reacting with tetracarboxylic acid dianhydride used in the present invention.

$$H_2N—X—R^1 \qquad (1\text{-}1)$$

wherein, in the general formula (1-1), X represents a single bond or an alkylene group having 1 to 3 carbon atoms; $R^1$ represents a monovalent residue having a nitrogen-containing heterocyclic group substituted with any group selected from the substituent group α; and the substituent group α represents hydrogen atom, halogen atom, hydroxyl group, nitro group, carboxylic acid group and salt thereof, sulfonic acid group and salt thereof, ester group, amide group, cyano group, alkyl group, alkoxy group or aryl group.

In the general formula (1-1), $R^1$ is a monovalent residue having at least one nitrogen-containing heterocyclic group; and examples thereof include 5- to 14-membered (monocyclic, dicyclic or tricyclic) aromatic heterocyclic group, 5- to 10-membered non-aromatic heterocyclic group and the like, which may be substituted with any group selected from the substituent group α, and which may contain a sulfur atom and an oxygen atom in addition to a nitrogen atom as a hetero atom constituting the ring. Preferably used are 5- to 14-membered aromatic heterocyclic groups and particularly preferably used is a pyridyl group since it can be efficiently complexed with an inorganic compound. Specific examples thereof include aromatic heterocyclic groups such as pyridyl, hydroxypyridyl, pyridinecarboxylic acid amide, pyrazinyl, pyrimidinyl, quinolyl, isoquinolyl, bipyridyl, phenanthryl, oxazolyl, benzoxazolyl, isoxazolyl, thiazolyl, isothiazolyl, benzothiazolyl, imidazolyl, benzoimidazolyl, pyrrolyl, pyrazolyl, triazolyl, tetrazolyl, pyridazinyl, indolyl and the like. Further, examples include non-aromatic heterocyclic groups such as pyrrolidinyl, oxazolidinyl, imidazolinyl, piperidinyl, piperazinyl, morpholinyl, thiomorpholinyl and the like. These may be used alone or in combination of two or more kinds.

In the general formula (1-1), X represents a single bond or an alkylene group having 1 to 3 carbon atoms, for example, —$CH_2$—, —$CH_2CH_2$—, —$CH_2CH_2CH_2$— or —$CH(CH_3)CH_2$—.

In the general formula (1-1), examples of the alkyl group, the alkoxy group or the aryl group in the substituent group α include an alkyl group (particularly an alkyl group having 1, 2, 3, 4 or 5 carbon atoms), an alkoxy group (particularly an alkoxy group having 1, 2, 3, 4 or 5 carbon atoms) or an aryl group (particularly an aryl group having 6, 7, 8, 9 or 10 carbon atoms), each of which may have substituent(s).

Specific examples of the compound having a nitrogen-containing heterocyclic group represented by the general formula (1-1) include aminopyridine, (aminomethyl)pyridine, (aminoethyl)pyridine, (aminopropyl)pyridine, aminohydroxypyridine, aminochloropyridine, aminobromopyridine, aminoiodopyridine, aminonicotinamide, aminopyrazine, aminopyrimidine, aminoquinoline, aminoisoquinoline, aminobipyridyl, aminophenanthroline, aminopyrazole, aminoimidazole, aminobenzimidazole and the like.

Examples of the method for producing a terminally-modified polybranched polyimide include:

a method (1) for obtaining a terminally-modified polybranched polyimide by reacting tetracarboxylic dianhydride with the diamine containing a triamine for producing a polyamic acid, and then reacting the polyamic acid with the compound of the general formula (1-1) for producing a terminally modified polyamic acid, and subjecting the polyamic acid to chemical or thermal ring closing reaction for imidization;

a method (2) for obtaining a terminally-modified polybranched polyimide by reacting tetracarboxylic dianhydride, the diamine containing a triamine and the compound of the general formula (1-1) for producing a terminally, modified polyamic acid, and subjecting the polyamic acid to chemical or thermal ring closing reaction for imidization;

a method (3) for obtaining a terminally-modified polybranched polyimide by subjecting tetracarboxylic dianhydride and the diamine containing a triamine to chemical or thermal ring closing reaction for imidization for preparing a polyimide, and then reacting the imide with the compound of the general formula (1-1) for preparing a polyimide having terminal amic acid, and further subjecting the polyimide to chemical or thermal ring closing reaction for imidization;

a method (4) for obtaining a terminally-modified polybranched polyimide by subjecting tetracarboxylic dianhydride and the diamine containing a triamine to chemical or thermal ring closing reaction for imidization for preparing a polyimide, and then subjecting the imide and the compound of the general formula (1-1) to chemical or thermal ring closing reaction for imidization;

a method (5) for obtaining a terminally-modified polybranched polyimide by reacting tetracarboxylic dianhydride, the diamine containing a triamine and the compound of the general formula (1-1) for preparing a terminally modified polyamic acid, and subjecting the polyamic acid to chemical or thermal ring closing reaction for imidization; and a method (6) for obtaining a terminally-modified polybranched polyimide by subjecting tetracarboxylic dianhydride, the diamine containing a triamine and the compound of the general formula (1-1) to chemical or thermal ring closing reaction for imidization.

When the diamine is composed of 100 mol % of a triamine, the reaction is carried out with tetracarboxylic dianhydride and triamine of the molar ratio (the molar ratio=tetracarboxylic dianhydride/triamine) of not less than 3/2.

The polyamic acid is prepared by a known method. For example, the polyamic acid is prepared by reacting tetracarboxylic dianhydride with the diamine containing a triamine, or tetracarboxylic dianhydride, the diamine containing a triamine and the compound of the general formula (1-1), in an organic polar solvent at a reaction temperature of not more than about 100° C., preferably not more than 80° C. and particularly from 0 to 50° C.

The reaction is preferably carried out in an inert gas such as nitrogen, argon or the like, but it may also be carried out under other conditions.

The terminally-modified polybranched polyimide can be produced by a known method for synthesizing a polyimide. The terminally-modified polybranched polyimide can be produced, for example, by:

a method (1) comprising reacting tetracarboxylic dianhydride with the diamine containing a triamine, or tetracarboxylic dianhydride, the diamine containing a triamine and the compound of the general formula (1-1) in an organic polar solvent at a reaction temperature of not more than about 100° C., preferably not more than 80° C. and particularly from 0 to 50° C. for preparing a polyamic acid, and subjecting the polyamic acid to chemical ring closing reaction for imidization by using a dehydrating agent such as acid anhydride and amine, or the like and an imidization agent of a catalyst at a low temperature of from about 0 to 140° C., or subjecting the polyamic acid to heating at a temperature of from 140 to 250° C., as necessary, with an azeotropic agent to effect dehydrocyclization for imidization;

a method (2) comprising heating tetracarboxylic dianhydride and the diamine containing a triamine, or tetracarboxylic dianhydride, the diamine containing a triamine and the compound of the general formula (1-1), in an organic polar solvent at a temperature of from 140 to 250° C. to effect polymerization, dehydrocyclization and ring closing for imidization; or a method (3) comprising reacting tetracarboxylic dianhydride with the diamine containing a triamine, or tetracarboxylic dianhydride, the diamine containing a triamine and the compound of the general formula (1-1) in an organic polar solvent at a reaction temperature of not more than about 100° C., preferably not more than 80° C. and particularly from 0 to 50° C. for preparing a polyamic acid, and heating the polyamic acid in a gas at a temperature of not less than 150° C. and preferably from 180 to 450° C.

After the polyimide was prepared, the polyimide may be precipitated in a poor solvent and dried, which may be re-fed to dissolve thereof into other soluble organic polar solvent to give a solution. The polyimide may also be used in a form of solution, which may be obtained.

The reaction is preferably carried out in an inert gas such as nitrogen, argon or the like, but may also be carried out under other conditions.

Tetracarboxylic dianhydride and the diamine containing a triamine are gelated in some cases if they are added to a solvent at a time for carrying out the polymerization reaction in case of the synthesis of the polyamic acid or the polyimide, and further the synthesis of the polyamic acid or the polyimide including the compound of the general formula (1-1). Preferably used is:

a method (1) comprising adding the diamine containing a triamine which may be in a form of powder or dissolved in a solvent, to a solvent containing tetracarboxylic dianhydride at a time or slowly, or several times in order, or a method (2) comprising adding tetracarboxylic dianhydride which may be in a form of powder or dissolved in a solvent, to a solvent containing a triamine at a time or slowly, or several times in order.

The compound of the general formula (1-1) may be added as it is or may be added after dissolved in an organic solvent such as a reaction solvent or the like, to a solution containing a polybranched polyamic acid obtained by the reaction of tetracarboxylic dianhydride with the diamine containing a triamine.

When the compound of the general formula (1-1) is reacted with the polyamic acid and the polyimide, the reaction can be carried out in the same manner as in the method for the aforementioned polyamic acid or polyimide.

Terminal modification of acid anhydride or a carboxylic acid terminal present in the polyamic acid or the polyimide by the compound of the general formula (1-1) may be properly selected depending on the application or purpose. For example, the compound of the general formula (1-1) is contained in an amount of preferably from 0.1 to 20 equivalents, preferably from 0.2 to 10 equivalents, further preferably from 0.5 to 5 equivalents, more preferably from 0.8 to 3 equivalents and particularly preferably from 1 to 2 equivalents, based on half the number of acid anhydride terminals and/or carboxylic acid terminals present in the polyamic acid or the polyimide. When the amount is not more than 0.1 equivalent, the efficiency in complexing with an inorganic compound becomes lowered; therefore, it is not considered preferable.

When the polyamic acid is chemically imidized using a dehydrating agent and a catalyst, as the dehydrating agent, there can be used organic acid anhydrides such as acetic anhydride, propionic acid anhydride and the like, while, as the catalyst, there can be used amine such as pyridine, picoline, triethylamine and the like together. The dehydrating agents and catalysts may each be used alone or in combination of two or more kinds.

The polymer concentration in the production of a polyamic acid and a polyimide is not particularly limited, but it is preferably from 1 to 50% by mass, further preferably from 2 to 30% by mass and particularly preferably from 2 to 5% by mass.

When the polyamic acid is imidized by baking (heating) in the gas, the baking temperature for imidizing is preferably from 200 to 600° C. and further preferably from 300 to 450° C. in the ranges in which the imidizing reaction proceeds and a polymer is not deteriorated. The heating time is not particularly limited, but it is preferably from 30 minutes to 10 hours. The baking atmosphere is not particularly limited, but baking may be carried out in atmospheric air in the presence of a reducing gas or an inert gas. It is preferably carried out in atmospheric air from the viewpoint of economical efficiency. An apparatus for sintering is not limited, but a tubular furnace or a muffle furnace can be suitably used.

As the organic polar solvent used for the polyamic acid, the polyimide or the reaction of terminal modification by the compound of the general formula (1-1), there can be used known organic polar solvents for dissolving polyamic acids and/or polyimides. Examples of the organic solvent used for the production of a polyamic acid and/or a polyimide include aprotic polar solvents such as N,N-dimethylacetamide (DMAc), N,N-diethylacetamide, N-methyl-2-pyrrolidone (NMP), N-methyl-caprolactam, N,N-dimethylformamide, N,N-diethylformamide, 1,3-dimethyl-2-imidazolidinone, hexamethyl phosphoramide, phenol, cresol, o-chlorophenol, p-chlorophenol, dimethylsulfoxide, dimethylsulfone, sulfolane, γ-butyrolactone, diglyme, dimethyltriglyme, diethyltriglyme, tetrahydrofuran, dioxane and the like. Preferably used are DMAc and NMP from the fact that they are easily available and a high molecular weight polyamic acid can be prepared. These solvents may be used alone or in combination of two or more kinds.

When is used the diamine containing a triamine that contains X mol % of the triamine in the diamine, the molar ratio of tetracarboxylic acid dianhydride and the diamine containing a triamine in use {(tetracarboxylic acid dianhydride)/(diamine containing a triamine)} is required to be higher than $(2+X/100)/2$, and the molar ratio is preferably from $(5\times(2+X/100)+1)/10$ to $3/1$ and more preferably in the range of $((2+X/100)+1)/2$ to $3/1$. This is because that the polybranched polyamic acid prepared by the reaction of tetracarboxylic dianhydride with the diamine containing a triamine has a structure in which unreacted acid anhydride group(s) and/or a carboxylic acid group(s) from the starting material tetracarboxylic dianhydride is present at the terminal group of the polyamic acid.

When 100 mol % of a triamine is contained in the diamine containing a triamine, the molar ratio of tetracarboxylic acid dianhydride and triamine in use {(tetracarboxylic acid dianhydride)/(triamine)} is required to be higher than 3/2, since the polybranched polyamic acid prepared by the reaction of tetracarboxylic dianhydride with the triamine has a structure in which unreacted acid anhydride group(s) and/or carboxylic acid group(s) of the starting material tetracarboxylic dianhydride is present at the terminal group of the polyamic acid. The molar ratio is preferably from 8/5 to 3/1, more preferably from 2/1 to 3/1 and particularly preferably 1/2, in which the polybranched polyimide can be efficiently complexed with an inorganic compound since the amount of the acid anhydride group andlor carboxylic acid group in the polybranched polyamic acid is high, and the amount of the heterocyclic group in the polybranched polyimide produced after reacting with the compound having a nitrogen-containing heterocyclic group represented by the general formula (1-1) becomes high. When the molar ratio oftetracarboxylic dianhydride/triamine is smaller than 8/5, the amount of the acid anhydride group and/or carboxylic acid group in the polymer in the polybranched polyamic acid becomes small and, therefore, the amount of the heterocyclic group in the polybranched polyimide produced after reacting with the compound of the general formula (1-1) becomes small, which cause a problem of insufficient complexing with an inorganic compound in some cases. Furthermore, when the molar ratio of tetracarboxylic dianhydride/triamine is greater than 3/1, the molecular weight of the polyamic acid becomes lowered and physical properties such as heat resistance or the like of the produced terminally-modified polybranched polyimide are deteriorated in some cases; therefore, it is not preferable.

Next, in the second aspect of the present invention, the compound having a sulfur-containing group represented by the general formula (1-2) is compound having one amino group and at least one sulfur-containing group in the molecule, and is at the same time a compound having an amino group capable of reacting with tetracarboxylic dianhydride to be used in the present invention.

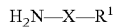
(1-2)

wherein, in the general formula (1-2), X represents a single bond or an alkylene group having 1 to 3 carbon atoms; $R^1$ represents a sulfur-containing heterocyclic group or an aryl group having a thiol or thioether group in the molecule, which are substituted with any group selected from the substituent group α; and the substituent group α represents hydrogen atom, halogen atom, hydroxyl group, nitro group, carboxylic acid group and salt thereof, sulfonic acid group and salt thereof, ester group, amide group, cyano group, alkyl group, alkoxy group or aryl group.

In the general formula (1-2), $R^1$ is a monovalent residue having at least one sulfur-containing group, and there can be exemplified a 5- to 13-membered (monocyclic, dicyclic or tricyclic) sulfur-containing heterocyclic group, or an aryl group having a thiol or thioether group in the molecule, which is substituted with any group selected from the substituent group α, and the like. Preferably used are a 5- to 13-membered sulfur-containing aromatic heterocyclic group and an aryl group having a thioether group in the molecule, and particularly preferably used are a thiophen-yl group, a methylthiophenyl group and a phenylthiophenyl group because it can be efficiently complexed with an inorganic compound.

Specific examples of the 5- to 13-membered sulfur-containing heterocyclic group include thiophen-yl, benzothiophen-yl, dibenzothiophen-yl and the like. Furthermore, specific examples of the aryl group having a thiol or thioether group in the molecule include thiolphenyl, methylthiophenyl, ethylthiophenyl, propylthiophenyl, butylthiophenyl, pentylthiophenyl, phenylthiophenyl, thianthrenyl, phenoxathiinyl, phenothiazinyl, thioxanthonyl and the like. These may be used alone or in combination of two or more kinds.

In the general formula (1-2), X represents a single bond or an alkylene group having 1 to 3 carbon atoms, and represents, for example, —CH$_2$—, —CH$_2$CH$_2$—, —CH$_2$CH$_2$CH$_2$— or —CH(CH$_3$)CH$_2$—. In the general formula (1-2), examples of the alkyl group, the alkoxy group or the aryl group in the substituent group cl include an alkyl group (particularly an alkyl group having 1, 2, 3, 4 or 5 carbon atoms), an alkoxy group (particularly an alkoxy group having 1, 2, 3, 4 or 5 carbon atoms) or an aryl group (particularly an aryl group having 6, 7, 8, 9 or 10 carbon atoms), each of which may have substituent(s).

Specific examples of the compound having a sulfur-containing group represented by the general formula (1-2) include (aminomethyl)thiophene, methylthioaniline, phenylthioaniline and the like.

In the second aspect, the terminally-modified polybranched polyimide is prepared in the same manner as disclosed in the aforementioned first aspect in which the compound of the general formula (1-2) is used instead of the compound of the general formula (1-1).

In the third aspect of the present invention, the compound having a nitrogen-containing heterocyclic group represented by the general formula (1-3) is a compound having one acid anhydride group and at least one nitrogen-containing heterocyclic group in the molecule, and is at the same time a compound having an acid anhydride group capable of reacting with the diamine containing a triamine of the present invention.

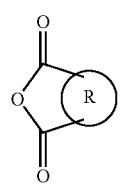
(1-3)

wherein, in the general formula (1-3), R represents a nitrogen-containing heterocyclic group substituted with any group selected from the substituent group α; and the substituent group α represents hydrogen atom, halogen atom, hydroxyl group, nitro group, carboxylic acid group and salt thereof, sulfonic acid group and salt thereof, ester group, amide group, cyano group, alkyl group, alkoxy group or aryl group.

In the general formula (1-3), R is a divalent residue having at least one nitrogen-containing heterocyclic group, and examples thereof include 5- to 14-membered (monocyclic, dicyclic or tricyclic) aromatic heterocyclic groups, 5- to 10-membered non-aromatic heterocyclic groups and the like, which may be substituted with any group selected from the substituent group α, and which, in addition, may contain a sulfur atom and an oxygen atom in addition to a nitrogen atom as the hetero atom constituting the ring. Preferably used is a 5- to 14-membered aromatic heterocyclic group and particularly preferably used is a pyridyl group since it can be efficiently complexed with an inorganic compound. Specific examples thereof include aromatic heterocyclic groups such as pyridyl, hydroxypyridyl, pyridinecarboxylic acid amide, pyrazinyl, pyrimidinyl, quinolyl, isoquinolyl, bipyridyl, phenanthryl, oxazolyl, benzooxazolyl, isoxazolyl, thiazolyl, isothiazolyl, benzothiazolyl, imidazolyl, benzoimidazolyl, pyrrolyl, pyrazolyl, triazolyl, tetrazolyl, pyridazinyl, indolyl and the like. Furthermore, examples thereof include non-aromatic heterocyclic groups such as pyrrolidinyl, oxazolidinyl, imidazolinyl, piperidinyl, piperazinyl, morpholinyl, thiomorpholinyl and the like. These may be used alone or in combination of two or more kinds.

In the general formula (1-3), examples of the alkyl group, the alkoxy group or the aryl group in the substituent group α include an alkyl group (particularly an alkyl group having 1, 2, 3, 4 or 5 carbon atoms), an alkoxy group (particularly an alkoxy group having 1, 2, 3, 4 or 5 carbon atoms) or an aryl group (particularly an aryl group having 6, 7, 8, 9 or 10 carbon atoms), each of which may have substituent(s).

Specific examples of the compound having a nitrogen-containing heterocyclic group represented by the general formula (1-3) include pyridinedicarboxylic anhydride, pyrazinedicarboxylic anhydride, pyrimidinedicarboxylic anhydride, quinolinedicarboxylic anhydride, isoquinolinedicarboxylic anhydride, imidazoledicarboxylic anhydride, benzimidazoledicarboxylic anhydride, pyrroledicarboxylic anhydride and the like.

Examples of the method for producing a terminally-modified polybranched polyimide in the third aspect include:

a method (1) for obtaining a terminally-modified polybranched polyimide by reacting tetracarboxylic dianhydride with the diamine containing a triamine for preparing a polyamic acid, and then reacting the polyamic acid with the compound of the general formula (1-3) for preparing a terminally modified polyamic acid, and subjecting the polyamic acid to chemical or thermal ring closing reaction for imidization;

a method (2) for obtaining a terminally-modified polybranched polyimide by reacting tetracarboxylic dianhydride, the diamine containing a triamine and the compound of the general formula (1-3) for preparing a terminally modified polyamic acid, and subjecting the polyamic acid to chemical or thermal ring closing reaction for imidization;

a method (3) for obtaining a terminally-modified polybranched polyimide subjecting tetracarboxylic dianhydride and the diamine containing a triamine to chemical or thermal ring closing reaction for imidization for preparing a polyimide, and then reacting the imide with the compound of the general formula (1-3) for preparing a polyimide having terminal amic acid, and further subjecting the polyimide to chemical or thermal ring closing reaction for imidization;

a method (4) for obtaining a terminally-modified polybranched polyimide by subjecting tetracarboxylic dianhydride and the diamine containing a triamine to chemical or thermal ring closing reaction for imidization for preparing a polyimide, and then subjecting the imide and the compound of the general formula (1-3) to chemical or thermal ring closing reaction for imidization;

a method (5) for obtaining a terminally-modified polybranched polyimide by reacting tetracarboxylic dianhydride, the diamine containing a triamine and the compound of the general formula (1-3) for preparing a terminally modified polyamic acid, and subjecting the polyamic acid to chemical or thermal ring closing reaction for imidization; and a method (6) for obtaining a terminally-modified polybranched polyimide by subjecting tetracarboxylic dianhydride, the diamine containing a triamine and the compound having a nitrogen-containing heterocyclic group represented by the general formula (1-3) to chemical or thermal ring closing reaction for imidization.

Examples of another method for producing a terminally-modified polybranched polyimide in the third aspect include:

a method (1) for obtaining a terminally-modified polybranched polyimide by reacting tetracarboxylic dianhydride with triamine of the molar ratio {the molar ratio of (tetracarboxylic dianhydride)/(triamine)} of from 1/2 to less than 3/2 for preparing a polyamic acid, and then reacting the polyamic acid with the compound of the general formula (1-3) for preparing a terminally modified polyamic acid, and subjecting the polyamic acid to chemical or thermal ring closing reaction for imidization;

a method (2) for obtaining a terminally-modified polybranched polyimide by reacting tetracarboxylic dianhydride and triamine of the molar ratio {the molar ratio of (tetracarboxylic dianhydride)/(triamine)} of from 1/2 to less than 3/2 with the compound having a nitrogen-containing heterocyclic group represented by the general formula (1-3) for preparing a terminally modified polyamic acid, and subjecting the polyamic acid to chemical or thermal ring closing reaction for imidization;

a method (3) for obtaining a terminally-modified polybranched polyimide by subjecting tetracarboxylic dianhydride and triamine of the molar ratio {the molar ratio of (tetracarboxylic dianhydride)/(triamine)} of from 1/2 to less than 3/2 to chemical or thermal ring closing reaction for imidization for preparing a polyimide, and then reacting the imide with the compound of the general formula (1-3) for preparing a polyimide having terminal amic acid, and further subjecting the polyimide to chemical or thermal ring closing reaction for imidization;

a method (4) for obtaining a terminally-modified polybranched polyimide by subjecting tetracarboxylic dianhydride and triamine of the molar ratio {the molar ratio of (tetracarboxylic dianhydride)/(triamine)} of from 1/2 to less than 3/2 to chemical or thermal ring closing reaction for imidization for preparing a polyimide, and then subjecting the imide and the compound of the general formula (1-3) to chemical or thermal ring closing reaction for imidization;

a method (5) for obtaining a terminally-modified polybranched polyimide by reacting tetracarboxylic dianhydride and triamine of the molar ratio {the molar ratio of (tetracarboxylic dianhydride)/(triamine)} of from 1/2 to less than 3/2 with the compound of the general formula (1-3) for preparing a terminally modified polyamic acid, and subjecting the polyamic acid to chemical or thermal ring closing reaction for imidization; and a method (6) for obtaining a terminally-modified polybranched polyimide by subjecting tetracarboxylic dianhydride and triamine of the molar ratio {the molar ratio of (tetracarboxylic dianhydride)/(triamine)} of from 1/2 to less than 3/2 and the compound of the general formula (1-3) to chemical or thermal ring closing reaction for imidization.

The polyamic acid is prepared by a known method. For example, the polyamic acid is prepared by reacting tetracarboxylic dianhydride with the diamine containing a triamine, or tetracarboxylic dianhydride, the diamine containing a triamine and the compound having a nitrogen-containing heterocyclic group represented by the general formula (1-3) in an organic polar solvent at a reaction temperature of not more than about 100° C., preferably not more than 80° C. and particularly from 0 to 50° C.

The reaction is preferably carried out in an inert gas such as nitrogen, argon or the like, but it may also be carried out under other conditions.

The terminally-modified polybranched polyimide can be produced by a known method for synthesizing a polyimide. The terminally-modified polybranched polyimide can be produced, for example, by:

a method (1) comprising reacting tetracarboxylic dianhydride with the diamine containing a triamine, or tetracarboxylic dianhydride, the diamine containing a triamine and the compound of the general formula (1-3) in an organic polar solvent at a reaction temperature of not more than about 100° C., preferably not more than 80° C. and particularly from 0 to 50° C. for preparing a polyamic acid, and subjecting the polyamic acid to chemical ring closing reaction for imidization by using a dehydrating agent such as acid anhydride and amine, or the like and an imidization agent of a catalyst at a low temperature of from about 0 to 140° C., or subjecting the polyamic acid to heating at a temperature of from 140 to 250° C., as necessary, with an azeotropic agent to effect dehydrocyclization for imidization;

a method (2) comprising heating tetracarboxylic dianhydride and the diamine containing a triamine, or tetracarboxylic dianhydride, the diamine containing a triamine and the compound of the general formula (1-3), in an organic polar solvent at a temperature of from 140 to 250° C. to effect polymerization, dehydrocyclization and ring closing for imidization; or a method (3) comprising reacting tetracarboxylic dianhydride with the diamine containing a triamine, or tetracarboxylic dianhydride, the diamine containing a triamine and the compound of the general formula (1-3) in an organic polar solvent at a reaction temperature of not more than about 100° C., preferably not more than 80° C. and particularly from 0 to 50° C. for preparing a polyamic acid, and heating the polyamic acid in a gas at a temperature of not less than 150° C. and preferably from 180 to 450° C.

After the polyimide was prepared, the polyimide may be precipitated in a poor solvent and dried, which may be re-fed to dissolve thereof into other soluble organic polar solvent to give a solution. The polyimide may also be used in a form of solution, which may be obtained.

The reaction is preferably carried out in an inert gas such as nitrogen, argon or the like, but can also be carried out under other conditions.

When the diamine is composed of 100 mol % of a triamine, the reaction is carried out with tetracarboxylic dianhydride and triamine of the molar ratio {the molar ratio of (tetracarboxylic dianhydride)/(triamine)} of from 1/2 to less than 3/2.

Tetracarboxylic dianhydride and the diamine containing a triamine are gelated in some cases if they are added to a solvent at a time for carrying out the polymerization reaction in case of the synthesis of the polyamic acid or the polyimide, and further the synthesis of the polyamic acid or the polyimide including the compound of the general formula (1-3). Preferably used is:

a method (1) comprising adding the diamine containing a triamine which may be in a form of powder or dissolved in a solvent, to a solvent containing tetracarboxylic dianhydride at a time or slowly, or several times in order, or a method (2) comprising adding tetracarboxylic dianhydride which may be in a form of powder or dissolved in a solvent, to a solvent containing a triamine at a time or slowly, or several times in order.

When the diamine is composed of 100 mol % of a triamine, the reaction is carried out with tetracarboxylic dianhydride and triamine of the molar ratio {the molar ratio of (tetracarboxylic dianhydride)/(triamine)} of from 1/2 to less than 3/2.

The compound of the general formula (1-3) may be added as it is or may be added after dissolved in an organic solvent such as a reaction solvent or the like, to a solution containing a polybranched polyamic acid obtained by the reaction of tetracarboxylic dianhydride with the diamine containing a triamine.

When the compound of the general formula (1-3) is reacted with the polyamic acid and the polyimide, the reaction can be carried out in the same manner as in the method for the aforementioned polyamic acid or polyimide.

Terminal modification of the amino-group terminal present in the polyamic acid or the polyimide by the compound of the general formula (1-3) may be properly selected depending on the application or purpose. For example, the compound of the general formula (1-3) is contained in an amount of preferably from 0.1 to 20 equivalents, preferably from 0.2 to 10 equivalents, further preferably from 0.5 to 5 equivalents, more preferably from 0.8 to 3 equivalents and particularly preferably from 1 to 2 equivalents, based on the number of amino-group terminals present in the polyamic acid or the polyimide. When the amount is not more than 0.1 equivalent, the efficiency in complexing with an inorganic compound becomes lowered; therefore, it is not considered preferable.

When the polyamic acid is chemically imidized using a dehydrating agent and a catalyst, as the dehydrating agent, there can be used organic acid anhydrides such as acetic anhydride, propionic anhydride and the like, while as the catalyst, there can be used amine such as pyridine, picoline, triethylamine and the like together. The dehydrating agents and catalysts may each be used alone or in combination of two or more kinds.

The polymer concentration in the production of a polyamic acid and a polyimide is not particularly limited, but it is preferably from 1 to 50% by mass, further preferably from 2 to 30% by mass and particularly preferably from 2 to 5% by mass.

When the polyamic acid is imidized by baking (heating) in the gas, the baking temperature for imidizing is preferably from 200 to 600° C. and further preferably from 300 to 450° C. in the ranges in which the imidizing reaction proceeds and a polymer is not deteriorated. The heating time is not particularly limited, but it is preferably from 30 minutes to 10 hours. The baking atmosphere is not particularly limited, but baking may be carried out in atmospheric air in the presence of a reducing gas or an inert gas. It is preferably carried out in atmospheric air from the viewpoint of economical efficiency. An apparatus for sintering is not restricted, but a tubular furnace or a muffle furnace can be suitably used.

As the organic polar solvent used for the polyamic acid, the polyimide or the reaction of terminal modification by the compound having a nitrogen-containing heterocyclic group represented by the general formula (1-3), there can be used known organic polar solvents for dissolving polyamic acids and/or polyimides. Examples of the organic solvent used for the production of a polyamic acid and/or a polyimide include aprotic polar solvents such as N,N-dimethylacetamide (DMAc), N,N-diethylacetamide, N-methyl-2-pyrrolidone (NMP), N-methyl-caprolactam, N,N-dimethylformamide, N,N-diethylformamide, 1,3-dimethyl-2-imidazolidinone, hexamethyl phosphoramide, phenol, cresol, o-chlorophenol, p-chlorophenol, dimethylsulfoxide, dimethylsulfone, sulfolane, γ-butyrolactone, diglyme, dimethyltriglyme, diethyltriglyme, tetrahydrofuran, dioxane and the like. Preferably used are DMAc and NMP from the fact that they are easily available and a high molecular weight polyamic acid can be prepared. These solvents may be used alone or in combination of two or more kinds.

When is used as the diamine containing a triamine that contains X mol % of the triamine in the diamine, for the polybranched polyamic acid prepared by the reaction of tetracarboxylic acid dianhydride with the diamine containing a triamine, the molar ratio of tetracarboxylic acid dianhydride and the diamine containing a triamine in use {(tetracarboxylic dianhydride)/(diamine containing a triamine)} is required to be less than (2+X/100)/2. The molar ratio is preferably from 1/2 to less than (2+X/100)/2, more preferably from 1/2 to (5×(2+X/100)−1)/10 and further preferably from 1/2 to ((2+X/100)−1)/2.

When 100 mol % of the aromatic triamine represented by the general formula (2) is used as a diamine, the molar ratio of tetracarboxylic dianhydride and the aromatic triamine {(tetracarboxylic dianhydride)/(triamine)} used for the production of the polyamic acid, i.e., the polyimide precursor of the present invention is required to be less than 3/2. The molar ratio is preferably from 1/2 to less than 3/2, more preferably from 1/2 to 7/5, further preferably from 1/2 to 1/1 and particularly preferably 1/1 because the polyimide can be efficiently complexed with an inorganic compound. When the molar ratio of tetracarboxylic dianhydride and triamine is greater than 7/5, the amount of triamine in the polymer becomes small and, therefore, the amount of the heterocyclic group in the polybranched polyimide produced after reacting with the compound having a nitrogen-containing heterocyclic group represented by the general formula (1-3) becomes small, which cause a problem of insufficient complexing with an inorganic compound in some cases. Furthermore, when the molar ratio of tetracarboxylic dianhydride and triamine is smaller than 1/2, the molecular weight of the polyamic acid becomes lowered and physical properties such as heat resistance or the like of the produced terminally-modified polybranched polyimide are deteriorated in some cases; therefore, it is not preferable.

In the fourth aspect of the present invention, examples of the aromatic o-hydroxyaldehyde represented by the general formula (1-4) include salicylaldehyde, 2,3-dihydroxybenzaldehyde, 2,6-dihydroxybenzaldehyde, o-vanillin, 2-hydroxy-4-methoxybenzaldehyde, 2-hydroxy-5-methoxybenzaldehyde, 2-hydroxy-3-ethoxybenzaldehyde, 2-hydroxy-3-nitrobenzaldehyde, 2-hydroxy-5-nitrobenzaldehyde, 3-isopropylsalicylaldehyde, 3-sec-butylsalicylaldehyde, 3-t-butylsalicylaldehyde, 3-t-butyl-5-chlorosalicylaldehyde, 5-bromo-3-t-butylsalicylaldehyde, 3-t-butyl-5-methoxysalicylaldehyde, 3-t-butyl-5-methylsalicylaldehyde, 3,5-di-t-butylsalicylaldehyde, 5-chloro-3-i-propylsalicylaldehyde, 4-chloro-3-i-propylsalicylaldehyde, 4-methyl-3-i-propylsalicylaldehyde, 5-methyl-3-i-propylsalicylaldehyde, 6-methyl-3-i-propylsalicylaldehyde, 3-t-butyl-4-methylsalicylaldehyde, 3-t-butyl-6-methylsalicylaldehyde, 3-sec-butyl-4-methylsalicylaldehyde, 3-sec-butyl-5-methylsalicylaldehyde, 3-sec-butyl-6-methylsalicylaldehyde and the like. Particularly preferably used is salicylaldehyde because it is cheap and easily available from the market. These may be used alone or in combination of two or more kinds.

In the general formula (1-4), examples of the alkyl group, the alkoxy group or the aryl group include an alkyl group (particularly an alkyl group having 1, 2, 3, 4 or 5 carbon atoms), an alkoxy group (particularly an alkoxy group having 1, 2, 3, 4 or 5 carbon atoms) or an aryl group (particularly an aryl group having 6, 7, 8, 9 or 10 carbon atoms), each of which may have substituent(s).

Terminal group modification of the amino-group terminal present in the polyamic acid or the polyimide by the aromatic o-hydroxyaldehyde represented by the general formula (1-4) may be properly selected depending on the application or purpose. For example, the aromatic o-hydroxyaldehyde can be used in an amount of from 0.1 to 10 equivalents, preferably from 0.5 to 8 equivalents, further preferably from 0.8 to 5 equivalents, more preferably from 1 to 2 equivalents and particularly preferably from 1 to 1.5 equivalents, based on the number of amino terminal groups of the polybranched polyamic acid obtained by the reaction of tetracarboxylic acid dianhydride with the diamine containing a triamine. When it is less than 0.1 equivalent, the solubility of the obtained terminal group-modified, polybranched polyimide into an organic solvent becomes lowered in some cases. When it exceeds 10 equivalents, a side reaction occurs in some cases; therefore, it is not preferable.

When 100 mol % of a triamine is used as a diamine, terminal group modification of the amino-group terminal present in the polyamic acid or the polyimide by the aromatic o-hydroxyaldehyde represented by the general formula (1-4) may be properly selected depending on the application or purpose. For example, the aromatic o-hydroxyaldehyde can be used in an amount of from 0.1 to 10 equivalents, preferably from 0.5 to 8 equivalents, further preferably from 0.8 to 5 equivalents, more preferably from 1 to 2 equivalents and particularly preferably 1 to 1.5 equivalents, based on the number of amino terminal groups of the branched polyamic acid obtained by the reaction of tetracarboxylic acid dianhydride with the triamine calculated according to Equation (1). When it is less than 0.1 equivalent, the solubility of the obtained terminal group-modified, polybranched polyimide into an organic solvent becomes lowered in some cases. When it exceeds 10 equivalents, a side reaction occurs in some cases; therefore, it is not preferable.

Equation (1):

Number of amino terminal groups=3×number of triamine equivalents−2×number of tetracarboxylic dianhydride equivalents When X mol % of a triamine in the diamine is used as the diamine containing a triamine, for the polybranched polyamic acid prepared by the reaction of tetracarboxylic dianhydride with the diamine containing a triamine, the molar ratio of tetracarboxylic dianhydride and the diamine containing a triamine in use {(tetracarboxylic dianhydride)/(triamine)} is required to be less than (2+X/100)/2. The molar ratio is preferably from 1/2 to less than (2+X/100)/2, more preferably from 1/2 to (5×(2+X/100)−1)/10 and further preferably from 1/2 to ((2+X/100)−1)/2.

When 100 mol % of a triamine is used as a diamine, for the polybranched polyamic acid prepared by the reaction of tetracarboxylic dianhydride with the triamine, the molar ratio of tetracarboxylic dianhydride and the aromatic triamine {(tetracarboxylic dianhydride)/(triamine)} used for the production of the polyamic acid, i.e., the polyimide precursor of the present invention is required to be less than 3/2. The molar ratio is preferably from 1/2 to less than 3/2, more preferably from 1/2 to 7/5 and further preferably from 1/2 to 1/1 and particularly preferably 1/1, in which the solubility of the polybranched polyimide into an organic solvent becomes high and it can be efficiently complexed with an inorganic compound since the amount of the triamine in the polybranched polyamic acid is high and, therefore, the amount of a Schiff base group in the polybranched polyimide obtained after the reaction with the aromatic o-hydroxyaldehyde represented by the general formula (1-4) becomes high. When the molar ratio of tetracarboxylic dianhydride and triamine is higher than 7/5, there are problems such that the solubility of the polybranched polyimide into an organic solvent becomes lowered and it is not efficiently complexed with an inorganic compound in some cases since the amount of the triamine in the polybranched polyamic acid is small and the amount of a Schiff base group in the polybranched polyimide obtained after the reaction with the aromatic o-hydroxylaldehyde represented by the general formula (1-4) becomes small. Further, when the molar ratio of tetracarboxylic dianhydride and triamine is smaller than 1/2, the molecular weight of the polyamic acid becomes lowered and physical properties such as heat resistance or the like of the produced terminally-modified polybranched polyimide are deteriorated in some cases; therefore, it is not preferable.

Examples of the method for producing a terminally-modified polybranched polyimide in the fourth aspect include:

a method (1) for obtaining a terminally-modified polybranched polyimide by reacting tetracarboxylic dianhydride with the diamine containing a triamine for preparing a polyamic acid, and then reacting an amino group of the polyamic acid with the aromatic o-hydroxyaldehyde represented by the general formula (1-4) for preparing a terminally modified polyamic acid, and subjecting the polyamic acid to chemical or thermal ring closing reaction for imidization; and a method (2) for obtaining a terminally-modified polybranched polyimide by subjecting tetracarboxylic dianhydride and the diamine containing a triamine to chemical or thermal ring closing reaction for imidization for preparing a polyimide, and then reacting an amino group of the imide with the aromatic o-hydroxylaldehyde represented by the general formula (1-4).

Another examples of the method for producing a terminally-modified polybranched polyimide in the fourth aspect include:

a method (1) for obtaining a terminally-modified polybranched polyimide by reacting tetracarboxylic dianhydride with triamine of the molar ratio {the molar ratio of (tetracarboxylic dianhydride)/(triamine)} of from 1/2 to less than 3/2 for preparing a polyamic acid, and then reacting an amino group of the polyamic acid with the aromatic o-hydroxyaldehyde represented by the general formula (1-4) for preparing a terminally modified polyamic acid, and subjecting the polyamic acid to chemical or thermal ring closing reaction for imidization; and a method (2) for obtaining a terminally-modified polybranched polyimide by subjecting tetracarboxylic acid dianhydride and triamine of the molar ratio {the molar ratio of (tetracarboxylic dianhydride)/(triamine)} of from 1/2 to less than 3/2 to chemical or thermal ring closing reaction for imidization for producing a polyimide, and then reacting an amino group of the imide with the aromatic o-hydroxyaldehyde represented by the general formula (1-4).

The polyamic acid can be prepared by a known method. For example, the polyamic acid can be prepared by reacting tetracarboxylic dianhydride with the diamine containing a triamine in an organic polar solvent at a reaction temperature of not more than about 100° C., preferably not more than 80° C. and particularly from 0 to 50° C.

The reaction is preferably carried out in an inert gas such as nitrogen, argon or the like, but it may also be carried out under other conditions.

The polyimide can be produced by a known method. For examples, the polyimide can be produced, for example, by:

a method (1) comprising reacting tetracarboxylic dianhydride with the diamine containing a triamine in an organic polar solvent at a reaction temperature of not more than about 100° C., preferably not more than 80° C. and particularly from 0 to 50° C. for preparing a polyamic acid, and subjecting the polyamic acid to chemical ring closing reaction for imidization by using a dehydrating agent such as an acid anhydride and amine, or the like and an imidization agent of a catalyst at a low temperature of from about 0 to 140° C., or subjecting the polyamic acid to heating at a temperature of from 140 to 250° C., as necessary, with an azeotropic agent to effect dehydrocyclization for imidization;

a method (2) comprising heating tetracarboxylic dianhydride and the diamine containing a triamine in an organic polar solvent at a temperature of from 140 to 250° C. to effect polymerization, dehydrocyclization and ring closing for imidization; or a method (3) comprising reacting tetracarboxylic dianhydride with the diamine containing a triamine in an organic polar solvent at a reaction temperature of not more than about 100° C., preferably not more than 80° C. and particularly from 0 to 50° C. for preparing a polyamic acid, and heating the polyamic acid in a gas at a temperature of not less than 150° C. and preferably from 180 to 450° C.

After the polyimide was prepared, the polyimide may be precipitated in a poor solvent and dried, which may be re-fed to dissolve thereof into other soluble organic polar solvent to give a solution. The polyimide may also be used in a form of solution, which may be obtained.

The reaction is preferably carried out in an inert gas such as nitrogen, argon or the like, but may also be carried out under other conditions.

When the diamine is composed of 100 mol % of a triamine, the reaction is preferably carried out with tetracarboxylic dianhydride and triamine of the molar ratio {the molar ratio of (tetracarboxylic dianhydride/(triamine)} of from 1/2 to less than 3/2.

In the synthesis of the polyamic acid or the polyimide, and further the synthesis of the polyamic acid or the polyimide accompanying the aromatic O-hydroxyaldehyde represented by the general formula (1-4), tetracarboxylic acid dianhydride and the diamine containing a triamine may be handled, for example, preferably by:

a method (1) comprising adding the diamine containing a triamine which may be in a form of powder or dissolved in a solvent to a solvent containing tetracarboxylic dianhydride at a time or slowly, or several times in order, or a method (2) comprising adding tetracarboxylic dianhydride which may be in a form of powder or dissolved in a solvent to a solvent of the diamine containing a triamine at a time or slowly, or several times in order.

The aromatic o-hydroxyaldehyde represented by the general formula (1-4) may be added as it is or may be added after dissolved in an organic solvent such as a reaction solvent or the like in case of adding to a solution containing the polybranched polyamic acid obtained by the reaction of tetracarboxylic dianhydride with the diamine containing a triamine.

The terminally-modified polybranched polyamic acid, a polymer in which a terminal group is modified as represented by the general formula (8), is produced by reacting the polybranched polyamic acid and/or the polybranched polyimide with the aromatic o-hydroxylaldehyde represented by the general formula (1-4), whereby causing a reaction of amino group(s) of the polybranched polyamic acid and/or the polybranched polyimide with the aromatic o-hydroxylaldehyde to form Schiff base.

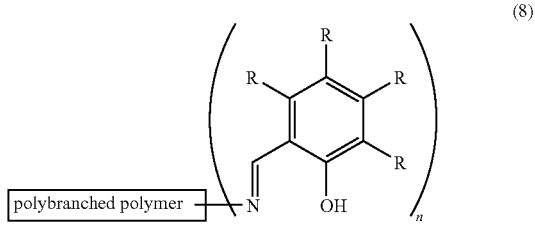

(8)

wherein, in the general formula (8), n is a real number of 1 or larger.

When the polyamic acid is chemically imidized using a dehydrating agent and a catalyst, as the dehydrating agent, there can be used organic acid anhydrides such as acetic anhydride, propionic anhydride and the like, while as the catalyst, there can be used amine such as pyridine, picoline, triethylamine and the like together. The dehydrating agents and catalysts may each be used alone or in combination of two or more kinds.

The polymer concentration in the production of a polyamic acid and a polyimide is not particularly limited, but it is preferably from 1 to 50% by mass, further preferably from 2 to 30% by mass and particularly preferably from 2 to 5% by mass.

When the polyamic acid is imidized by baking (heating) in the gas, the baking temperature for imidizing is preferably from 200 to 600° C. and further preferably from 300 to 450° C. in the ranges in which the imidizing reaction proceeds and a polymer is not deteriorated. The heating time is not particularly limited, but it is preferably from 30 minutes to 10 hours. The baking atmosphere is not particularly limited, and baking may be carried out in atmospheric air in the presence of a reducing gas or an inert gas. However, it is preferably carried out in atmospheric air from the viewpoint of economical efficiency. An apparatus for sintering is not restricted, but a tubular furnace or a muffle furnace can be suitably used.

As the organic polar solvent used for the polyamic acid, the polyimide or the reaction of terminal group modification by the polyamic acid, the polyimide or the aromatic o-hydroxyaldehyde represented by the general formula (1-4), there can be used known organic polar solvents for dissolving polyamic acids and/or polyimides. Examples of the organic solvent used for the production of a polyamic acid and/or a polyimide include aprotic polar solvents such as N,N-dimethylacetamide (DMAc), N,N-diethylacetamide, N-methyl-2-pyrrolidone (NMP), N-methyl-caprolactam, N,N-dimethylformamide, N,N-diethylformamide, 1,3-dimethyl-2-imidazolidinone, hexamethyl phosphoramide, phenol, cresol, o-chlorophenol, p-chlorophenol, dimethylsulfoxide, dimethylsulfone, sulfolane, γ-butyrolactone, diglyme, dimethyltriglyme, diethyltriglyme, tetrahydrofuran, dioxane and the like. Preferably used are DMAc and NMP from the fact that they are easily available and a high molecular weight polyamic acid can be prepared. These solvents may be used alone or in combination of two or more kinds.

The polyimide, the terminally-modified polybranched polyimide, the polyamic acid or the terminal group-modified, polybranched polyamic acid (all hereinafter referred to as the terminally-modified polybranched polyimide and the like) in the above first to fourth aspects may be in any shape, and may be a powder such as particle or the like, those formed in the form of a film or those formed by molding. The polyimide formed in the form of a film can be suitably produced by imidizing those formed in a film form from the polyamic acid, and its thickness may be any thickness as long as there is no problem in handling. The thickness is preferably from 1 to 200 μm and more preferably from 5 to 100 μm.

The terminally-modified polybranched polyimide and the like may contain other polyimides or other polymers in addition to the polyimide of the present invention or the like, or may contain other components such as lubricants such as silica and the like, inorganic fillers, reinforcing agents such as reinforcing glass fibers and the like or release agents.

The terminally-modified polybranched polyimide and the like may be used after formed on a base material such as plastics such as polyimide, glass, silicon wafer, ceramics, metals such as copper, silver, gold and the like.

The terminally-modified polybranched polyimide or the like may be further heated, prior to use, at a temperature of from 200 to 600° C. and preferably from 300 to 450° C. in which deterioration does not occur, for 30 minutes to 10 hours though the heating time it is not particularly limited.

The terminally-modified polybranched polyimide of the present invention can be used as materials for electronic components or electronic devices such as a printed circuit board, a flexible printed circuit board, COF, COB, a TAB tape and the like; or conductive base materials for a conductive particle, a conductive film and the like.

The terminally-modified polybranched polyimide of the present invention, in a state of polyamic acid-dissolved solution, is coated or printed on a heat resistant polyimide film which is used as materials of electronic components such as a printed circuit board, a flexible printed circuit board, a TAB tape and the like, and thereafter the solution is removed, and the polyamic acid is dehydrated and imidized. Thus, a polyimide film (that is, a terminally-modified polybranched polyimide having a heat resistant polyimide film) with the terminally-modified polybranched polyimide formed on one side or both sides of the heat resistant polyimide film can be obtained.

Furthermore, the aforementioned polyamic acid-dissolved solution of the terminally-modified polybranched polyimide is coated or printed on a cast layer of the polyamic acid or a self-supporting film capable of peeling away from a support formed by drying the cast layer of the polyamic acid, both of which are capable of forming heat resistant polyimide film, instead of the heat resistant polyimide film. Thus, a polyimide film (that is, a terminally-modified polybranched polyimide having a heat resistant polyimide film) with the terminally-modified polybranched polyimide formed on one side or both sides of the heat resistant polyimide film can be obtained likewise.

When the terminally-modified polybranched polyimide of the present invention is formed on one side or both sides of the heat resistant polyimide film, the terminally-modified polybranched polyimide may be formed on the whole surface or a part of the heat resistant polyimide film. For example, the terminally-modified polybranched polyimide may be formed on the heat resistant polyimide film in the form of wiring by a printing method or the like. If the terminally-modified polybranched polyimide is formed on the heat resistant polyimide film in the form of wiring, only wiring portion undergoes electroless plating. Hence, there is provided a heat resistant polyimide film having a metal-wired terminally-modified polybranched polyimide in a form of wiring on one side or both sides.

The terminally-modified polybranched polyimide of the present invention, in a state of polyamic acid-dissolved solution, is coated or printed on a part or the whole surface of the heat resistant polyimide film and/or a metal foil which is used as materials of electronic components such as a printed circuit board, a flexible printed circuit board, a TAB tape and the like, and thereafter the solution is removed, and the polyamic acid is dehydrated and imidized. Intervening the layer obtained from the polyamic acid of the present invention, the heat resistant polyimide film and the metal foil can be laminated by a method of pressing, heat-pressing or the like, directly or additionally via other adhesive. In this process, the same treatment may be repeated using, instead of the heat resistant polyimide film, a cast layer of the polyamic acid or a self-supporting film capable of peeling away from a support formed by drying the cast layer of the polyamic acid, both of which are capable of forming heat resistant polyimide film.

The polyamic acid of the terminally-modified polybranched polyimide may be co-extruded with a dope solution of a polyamic acid capable of forming a heat resistant polyimide film.

The terminally-modified polybranched polyimide of the present invention, in as state of polyimide-dissolved solution, is coated or printed on a part or the whole surface of the heat resistant polyimide film and/or a metal foil which is used as materials of electronic components such as a printed circuit board, a flexible printed circuit board, a TAB tape and the like, and thereafter the solution is removed. Intervening the polyimide of the present invention, the heat resistant polyimide film and the metal foil are laminated directly or additionally via other adhesive using a laminating apparatus or the like, whereby a laminate of the heat resistant polyimide film and the metal foil is obtained. In this process, the same treatment may be repeated using, instead of the heat resistant polyimide film, a cast layer of the polyamic acid or a self-supporting film capable of peeling away from a support formed by drying the cast layer of the polyamic acid, both of which are capable of forming heat resistant polyimide film.

The laminate of a heat resistant polyimide film and a metal foil can be used for materials for electronic components or electronic devices such as a printed circuit board, a flexible printed circuit board, COF, COB, a TAB tape and the like.

The heat resistant polyimide film is such a heat resistant polyimide film that used as materials for electronic components such as a printed circuit board, a flexible printed circuit board, a TAB tape and the like. Specific examples thereof include polyimide films such as "Upilex" (trade name; a product of Ube Industries, Ltd.), "Kapton" (trade name; a product of DuPont-TORAY Co., Ltd., a product of Du Pont Kabushiki Kaisha), "Apical" (trade name; a product of Kaneka Corporation) and the like; and polyimides obtained from an acid component and a diamine component constituting these films, for example, an acid component (for example, a component containing 3,3',4,4'-biphenyltetracarboxylic dianhydride, pyromellitic acid or the like) and a diamine component (a component containing p-phenylene diamine, 4,4-diaminodiphenyl ether, m-tolidine, 4,4'-diaminobenzanilide or the like).

As a method of applying a polyamic acid solution and a polyimide solution, there can be used known methods. Examples thereof include known coating methods such as a gravure coating method, a spin coating method, a silk screening method, a dip coating method, a spray coating method, a bar coating method, a knife coating method, a roll coating method, a blade coating method, a die coating method, a casting method and the like.

Examples of the laminating apparatus include a pair of pressure metal rollers (a compression part may be made of any of a metal or a ceramic spray-coated metal), a vacuum laminator, a double belt press, a hot press and the like. Particularly, preferred are those capable of performing thermo-compression bonding and cooling under pressurizing, and, particularly among them, a hydraulic double belt press.

As the metal foil, there can be used various metal foils of copper, aluminum, gold, alloy and the like. Suitably preferably used are copper foils such as a rolled copper foil, an electrolytic copper foil and the like.

The metal foil may have any surface roughness, but the surface roughness Rz is preferably not less than 0.5 μm. Further, the surface roughness Rz of the metal foil is preferably not more than 7 μm and particularly preferably not more than 5 μm. Such a metal foil, for example, a copper foil, is known as VLP and LP (or HTE).

A thickness of the metal foil is not particularly limited, but it is preferably from 2 to 35 μm and particularly preferably from 5 to 18 μm. As the metal foil having a thickness of from 0.5 to 5 μm, a metal foil with a carrier, for example, a copper foil with an aluminum foil carrier or a copper foil with a copper foil carrier, is used.

A metal foil preferably used is that particularly used for circuit circuits.

To obtain a metal-coated (terminally modified) polybranched polyimide from the (terminally modified) polybranched polyimide of the present invention, an electroless plating catalyst precursor is adsorbed on a solid or liquid (terminally modified) polybranched polyimide for producing a (terminally modified) polybranched polyimide for accelerating electroless plating, and then the polyimide is subjected to electroless metal plating, whereby a metal-coated (terminally modified) polybranched polyimide is obtained.

Electroless plating catalyst precursors are each adsorbed to a nitrogen-containing heterocyclic group derived from the compound of the general formula (1-1) in the first aspect, a sulfur-containing group derived from the compound of the general formula (1-2) in the second aspect, a nitrogen-containing heterocyclic group derived from the compound of the general formula (1-3) in the third aspect, and a Schiff base produced by the reaction of the compound of the general formula (1-4) with an amino group in the fourth aspect.

In the production of the terminally-modified polybranched polyimide for accelerating electroless plating, adsorption of an electroless plating catalyst precursor onto the terminally-modified polybranched polyimide is carried out by immersing the terminally-modified polybranched polyimide in a solution of the electroless plating catalyst precursor dissolved in water or organic solvents, or in a colloidal solution dispersed in an organic solvent.

The electroless plating catalyst precursor is a metal compound for accelerating electroless plating and is, for example, a palladium compound. The palladium compound may be zerovalent, divalent or tetravalent in terms of the oxidation number, and may be a metal complex or a metal microparticle. Specific examples thereof include palladium complexes such as palladium acetate, palladium chloride, palladium bromide, palladium nitrate, palladium sulfate, tetrachloropalladous acid, sodium tetrachloropalladate, potassium tetrachloropalladate, hexachloropalladous acid, sodium hexachloropalladate, potassium hexachloropalladate, tetrabromopalladous acid, sodium tetrabromopalladate, potassium tetrabromopalladate, hexabromopalladous acid, sodium hexabromopalladate, potassium hexabromopalladate, sodium bis(oxalato)palladate, potassium bis(oxalato)palladate, tetraammine palladium chloride, bis(ethylenediamine) palladium chloride, dichloro(ethylenediamine)palladium, dichloro(bipyridyl)palladium, dichloro(phenanthroline)palladium, tetrakis(triphenylphosphine)palladium, bis(dibenzylideneacetone)palladium, tris(dibenzylideneacetone)dipalladium, tetranitropalladous acid, sodium tetranitropalladate, potassium tetranitropalladate, sodium tetracyanopalladate, potassium tetracyanopalladate, tetrakis(acetonitrile)palladium tetrafluoroborate and the like; palladium microparticles such as palladium nanoparticle and the like; and palladium colloids prepared from a tin compound and a palladium compound. Among these, preferably used are palladium acetate, palladium chloride, palladium nitrate, tetrachloropalladous acid, sodium tetrachloropalladate, tetraammine palladium chloride, tetrakis(acetonitrile)palladium tetrafluoroborate, palladium nanoparticle and palladium colloids prepared from a tin compound and a palladium compound, because they are easily available and they are highly effective in accelerating electroless plating. These palladium compounds may be used alone or in combination of two or more kinds.

The solvent used for the preparation of a solution containing an electroless plating catalytic material may be an aqueous solvent or an organic solvent. As the aqueous solvent, there can be used deionized water and the like. As the organic solvent, suitably used are, for example, alcohols such as methyl alcohol, ethyl alcohol, propyl alcohol and the like; ketones such as acetone and the like; esters such as ethyl acetate and the like; ethers such as tetrahydrofuran, dioxane and the like; and aromatic solvents such as benzene, toluene, xylene and the like. These solvents may be used alone or in combination of a plurality of kinds.

The concentration of the electroless plating catalytic material in the solution containing an electroless plating catalytic material may be suitably selected prior to use. For example, it is preferably from $10^{-6}$ to 1 mol·dm$^{-3}$ and further preferably from $10^{-5}$ to $10^{-2}$ mol·dm$^{-3}$. When it is smaller than $10^{-6}$ mol·dm$^{-3}$, it requires a long time for adsorbing an electroless plating catalytic material on the polybranched polyimide in some cases. When it is greater than 1 mol·dm$^{-3}$, it becomes economically unfavorable in some cases because the amount of the electroless plating catalytic material used becomes high and the production cost thus becomes high.

Acids such as hydrochloric acid, sulfuric acid, nitric acid and the like; bases such as ammonia, sodium hydroxide, potassium hydroxide, sodium hydrogen carbonate, potassium carbonate and the like; inorganic salts such as sodium chloride, potassium chloride, ammonium chloride and the like; and organic salts such as tetrabutylammonium chloride and the like may be preferably added to the solution containing an electroless plating catalytic material, because the adsorption of the electroless plating catalytic material on the terminally-modified polybranched polyimide may be accelerated in some cases.

In the terminally-modified polybranched polyimide for accelerating electroless plating, the time required for immersing the terminally-modified polybranched polyimide in the solution containing an electroless plating catalytic material may be properly selected, but it is preferably form 5 seconds to 1 hour and further preferably from 30 seconds to 30 minutes. When the immersion time is shorter than 5 seconds, the electroless plating catalytic material is not fully adsorbed on the polybranched polyimide in some cases. When it is longer than 1 hour, it is economically unfavorable because the treatment time becomes long.

In the terminally-modified polybranched polyimide for accelerating electroless plating, the temperature for immersing the terminally-modified polybranched polyimide in the solution containing an electroless plating catalytic material may be properly selected, but it is preferably in the range of 0 to 100° C. and further preferably in the range of room temperature to 60° C. At a temperature lower than 0° C., a solvent is frozen in some cases. When the temperature is higher than 100° C., a solvent is evaporated in some cases; therefore, it is not preferable.

In the terminally-modified polybranched polyimide for accelerating electroless plating, after having immersed the terminally-modified polybranched polyimide in the solution containing an electroless plating catalytic material, and it may be washed with an aqueous solvent, an organic solvent or a mixture thereof, and further may be dried by air-dry or the like.

The terminally-modified polybranched polyimide for accelerating electroless plating is subjected to electroless metal plating in a known method such as immersion in an electroless plating solution, whereby a metal-coated terminally-modified polybranched polyimide can be produced.

For the conditions of electroless metal plating, known conditions can be properly selected.

As the electroless plating solution, various conventionally known electroless plating solutions containing metal compounds can be used. As the metal compound, there can be used metal elements belonging to Periods 4, 5 and 6 of the Periodic Table, and preferably used are metal elements belonging to Groups 1B, 2B and VIII. In particular, cobalt, nickel, palladium, platinum, copper, silver, gold and zinc are preferable because the usefulness of the metal-coated polybranched polyimide produced therefrom is high.

The concentration of the metal compound in the electroless plating solution can be properly selected, but it is preferably, for example, from $10^{-3}$ to 1 mol·dm$^{-3}$ and further preferably from $10^{-2}$ to $10^{-1}$ mol·dm$^{-3}$. When it is smaller than $10^{-3}$ mol·dm$^{-3}$, it requires a long time for electroless plating in some cases. When it is greater than 1 mol·dm$^{-3}$, the amount of the metal compound used becomes high and the production cost thus becomes high; therefore, it is not economically favorable.

The electroless plating solution may contain, in addition to metal compounds, reducing agents such as formaldehyde, dimethylamine borane, sodium borohydride, hydrazine, hydroxylamine, sodium hypophosphite and the like; complexing agents such as organic acids, i.e., acetic acid, lactic acid, oxalic acid, succinic acid, malonic acid, phthalic acid, tartaric acid, citric acid, salicylic acid, thioglycolic acid and metal salts thereof, amino acids, i.e., glycine, alanine, asparagine, glutamic acid, ethylenediaminetetraacetic acid and metal salts thereof, or organic bases, i.e., ammonia, hydrazine, triethanolamine, ethylenediamine and the like; buffer agents such as organic acids, i.e., acetic acid, propionic acid, oxalic acid, glycolic acid, citric acid, tartaric acid, lactic acid or inorganic acids, i.e., boric acid and metal salts thereof, stabilizers such as cyanide, thiourea, bypyridyl, phenanthroline, neocuproin and the like; promoters such as adenine, guanine, 8-hydroxy-7-iodo-5-quinolinesulfonic acid and the like; and surfactants such as polyethylene glycol and the like.

The time required for immersing the terminally-modified polybranched polyimide for accelerating electroless plating in the electroless plating solution can be properly selected, but it is preferably from 30 seconds to 12 hours and further preferably 1 minute to 6 hours. When the immersion time is shorter than 30 seconds, plating becomes insufficient in some cases, and when it is longer than 12 hours, the treatment time becomes long; therefore, it is not economically favorable.

The temperature for immersing the terminally-modified polybranched polyimide for accelerating electroless plating in the electroless plating solution is preferably in the range of 0 to 100° C. and further preferably in the range of room temperature to 80° C. At a temperature lower than 0° C. the electroless plating solution is frozen in some cases, and when it is higher than 100° C., the electroless plating solution might be deteriorated or the electroless plating solution is evaporated in some cases; therefore, it is not preferable.

After immersed in the electroless plating solution, the obtained metal-coated terminally-modified polybranched polyimide may be washed with an aqueous solvent, an organic solvent or a mixture thereof, and further may be dried by air-dry or the like.

The metal-coated terminally-modified polybranched polyimide in the form of a film can be used as substrates of electronic components or electronic devices such as a printed circuit board, a flexible printed circuit board, COF, COB, a TAB tape and the like.

The metal-coated terminally-modified polybranched polyimide in the form of particle can be used as a conductive binder or a conductive particle.

The aromatic triamine represented by the general formula (I) according to the fifth aspect of the present invention can be produced by reducing a nitro group of the aromatic monoamine represented by the general formula (II).

As a method of reducing a nitro group, a method comprising conducting the reduction by tin (II) chloride or sodium dithionate, or catalytic reduction, in a solvent. In the catalytic reduction, as a catalyst, there can be used palladium, Raney nickel or platinum, while molecular hydrogen, hydrazine, formic acid and ammonium formate can be used as a hydrogen source. In particular, it is economical and preferable to perform the reduction reaction in an organic solvent using a palladium compound for a catalyst and using molecular hydrogen for a hydrogen source.

The solvent used for the reduction is not restricted as far as it dissolves a diamine or dinitride without hindering the reaction. Examples thereof include alcohols; dioxane; aromatic solvents such as toluene, xylene and the like; sulfoxide solvents such as dimethylsulfoxide, dimethylsulfoxide and the like; formamide solvents such as N,N-dimethylformamide, N,N-diethylformamide and the like; acetamide solvents such as N,N-dimethylacetamide, N,N-diethylacetamide and the like; pyrrolidone solvents such as N-methyl-2-pyrrolidone, N-vinyl-2-pyrrolidone and the like; phenol solvents such as phenol, o-, m- or p-cresol, xylenol, halogenated phenol, catechol and the like; hexamethyl phosphoramide, γ-butyrolactone and the like.

Examples of the aromatic monoamine represented by the general formula (II) include 3,5-di(4-nitrophenoxy)aniline, 3,5-di(3-methyl,4-nitrophenoxy)aniline, 3,5-di(3-methoxy, 4-nitrophenoxy)aniline, 3,5-di(2-methyl,4-nitrophenoxy) aniline, 3,5-di(2-methoxy,4-nitrophenoxy)aniline, 3,5-di(3-ethyl,4-nitrophenoxy)aniline and the like. The synthesis method of these compounds include, for example, a method comprising reacting 3,5-dihydroxyaniline with substituted or unsubstituted p-fluoronitrobenzene as shown in Examples.

Examples of the aromatic triamine represented by the general formula (I) include 3,5-di(4-aminophenoxy)aniline, 3,5-di(3-methyl,4-aminophenoxy)aniline, 3,5-di(3-methoxy,4-aminophenoxy)aniline, 3,5-di(2-methyl,4-aminophenoxy) aniline, 3,5-di(2-methoxy, 4-aminophenoxy)aniline, 3,5-di (3-ethyl,4-aminophenoxy)aniline and the like.

EXAMPLES

The present invention is now illustrated in detail below with reference to Examples. However, the present invention is not restricted to those as described in these Examples.

Incidentally, main analysis methods and measurement methods used in the following Examples are described below.

1) Molecular Weight Distribution: The number average molecular weight (Mn) of a polyamic acid was measured by the gel permeation chromatography (GPC). The measurement method is illustrated below.

(1) Measuring Device: A HLC-8220 device manufactured by Tosoh Corporation was used.

(2) Measuring Sample: A polyamic acid solution was dissolved in a solvent (N-methyl-2-pyrrolidone, NMP) at room temperature at a concentration of 0.3 weight/volume %.

(3) Measurement of Molecular Weight Distribution: 0.3 ml of the above (2) measuring sample was injected into GPC column (Shodex KD-806M x 2) and analyzed with a solvent of NMP at a temperature of 40° C. at a flow rate of 1.0 ml/min. The measurement according to GPC was carried out for 35 minutes. The polymer concentration in a solution separated by a GPC column was measured using a refractive index detector (RI). The molecular weight was calculated by means of a polystyrene standard.

(4) Data Processing: Data was processed using a software attached to a HLC-8220 device manufactured by Tosoh Corporation.

2) Thermo Gravimetry Differential Thermal Analysis (TG-DTA): Measurement was carried out in the range of a measurement temperature of 200 to 800° C. at a temperature elevation rate of 10° C./min. in a nitrogen gas atmosphere at a flow rate of the gas atmosphere of 30 mL/min. using TG/DTA320 manufactured by Seiko Instruments Inc.

3) X-ray Photoelectron Spectroscopy Analysis (XPS): Measurement was carried out with an X-ray source of MgKα using 1600S manufactured by PHI, Inc.

4) Measurement of Electric Conductivity: Measurement was carried out with a measuring probe of PSP using Rolesta MCP-T610 manufactured by Mitsubishi Chemical Corporation.

5) X-ray Diffraction Analysis (XRD): Measurement was carried out with an X-ray source of CuKα using a wide angle X-ray diffraction instrument of RAD-RX manufactured by Rigaku Corporation.

6) Transmission Electron Microscopy Analysis (TEM): Measurement was carried out using a field emission transmission electron microscope of JEM-2010F manufactured by JEOL Ltd.

7) Inductively Coupled Plasma Atomic Emission Spectrometry Analysis (ICP-AES): Measurement was carried out using SPS4000 manufactured by Seiko Instruments Inc.

8) Measurement of Fourier Transform Infrared Spectroscopy (FT-IR): Measurement was carried out using a measuring equipment: FTS7000e manufactured by VARIAN, Inc., by a measuring method: micro-ATR method, with a detector: MCT.

9) Measurement of Dielectric Constant: The electrostatic capacity at a frequency of 1 MHz was measured with LCR Meter 4192A manufactured by Hewlett-Packard Company at room temperature to obtain a dielectric constant (∈) according to the following equation, $$\in = C \cdot d / (\in^0 \cdot A)$$

wherein, C is an electrostatic capacity, d is a film thickness of the sample, $\in^0$ is a dielectric constant in a vacuum and A is an electrode area.

Hereinafter, Examples of the present invention are illustrated in Parts I to IV and synthesis of novel compounds is illustrated in Part V.

Acid dianhydrides, triamines, diamines and terminal modifying agents used in Examples and Comparative Examples are described below.

1) Acid Dianhydride Components
Acid A: 3,3',4,4'-biphenyltetracarboxylic dianhydride
Acid B: pyromellitic dianhydride
Acid C: 4,4'-(hexafluoroisopropylidene)diphthalic anhydride
Acid D: 4,4'-oxydiphthalic dianhydride
2) Triamine Components
Triamine A: 3,5-di(4-aminophenoxy)aniline
Triamine B: tri(4-aminophenyl)amine
Triamine C: 1,3,5-tri(4-aminophenoxy)benzene
3) Diamine Component
Diamine A: 1,4-phenylene diamine
4) Terminal Modifying Agent Components
Modifying agent A1: 4-aminopyridine
Modifying agent A2: 4-(aminomethyl)pyridine
Modifying agent A3: 2-amino-3-hydroxypyridine
Modifying agent A4: 6-aminonicotinamide
Modifying agent A5: 2-aminopyrimidine
Modifying agent A6: 3-aminopyrazole
Modifying agent A7: 2-aminobenzimidazole
Modifying agent A8: 5-amino-1,10-phenanthroline
Modifying agent A9: 2-aminothiazole
Modifying agent B1: 2-(phenylthio)aniline
Modifying agent B2: 4-(methylthio)aniline
Modifying agent B3: 4-aminothiophenol
Modifying agent B4: 2-(aminomethyl)thiophene
Modifying agent C1: 2,3-pyridinedicarboxylic anhydride
Modifying agent C2: 3,4-pyridinedicarboxylic anhydride
Modifying agent D1: salicylaldehyde
Modifying agent D2: 2-hydroxy-5-nitrobenzaldehyde
Modifying agent D3: o-vanillin Part I Examples of the First Aspect Reference Examples I-1 to I-6

Synthesis of Polybranched Polyamic Acid

To a 4-necked flask equipped with a dropping funnel were added acid dianhydride illustrated in Table 1 and anhydrous N,N-dimethylacetamide (hereinafter abbreviated as DMAc). While the resulting mixture was stirred at room temperature, a solution obtained by dissolving a triamine and/or a diamine illustrated in Table 1 in anhydrous DMAc was gradually added over 5 to 7 hours. The mixture was stirred at room temperature through the night, whereby a DMAc solution of 2.5 weight % polybranched polyamic acid was obtained. The number average molecular weight of the polybranched polyamic acid was analyzed by GPC and the results are shown in Table 1.

Reference Example 1-7

Synthesis of polybranched polyamic acid A7

To a flask equipped with a dropping funnel were added 3,3',4,4'-biphenyltetracarboxylic acid dianhydride (4.76 mmol) and anhydrous DMAc. While the resulting mixture was stirred at room temperature, a solution obtained by dissolving 3,5-di(4-aminophenoxy)aniline (0.952mmol) and 1,4- phenylene diamine (2.85 mmol) in anhydrous DMAc was gradually added over 7hours. The mixture was stirred at room temperature through the night, whereby a DMAc solution of 2.5 weight % polybranched polyamic acid A7 was obtained. According to GPC analysis of the polybranched polyamic acid, the number average molecular weight was $2.7 \times 10^4$.

TABLE 1

| | Polybranched Polyamic acid | | Acid dianhydride Component | | Triamine Component | | Diamine component | |
|---|---|---|---|---|---|---|---|---|
| | number average molecular weight | polymer concentration | | | | | | |
| kind | (Mn) | (mass %) | kind | mmol | kind | mmol | kind | mmol |
| Reference Example I-1 | A1 | $1.7 \times 10^4$ | 2.5 | Acid A | 11.2 | triamine A | 5.58 | | |
| Reference Example I-2 | A2 | $2.7 \times 10^4$ | 2.5 | Acid A | 11.2 | triamine B | 5.58 | | |
| Reference Example I-3 | A3 | $2.0 \times 10^4$ | 2.5 | Acid A | 11.2 | triamine C | 5.58 | | |
| Reference Example I-4 | A4 | $1.9 \times 10^4$ | 2.5 | Acid B | 11.2 | triamine A | 5.58 | | |
| Reference Example I-5 | A5 | $1.7 \times 10^4$ | 2.5 | Acid C | 11.2 | triamineA | 5.58 | | |
| Reference Example I-6 | A6 | $1.7 \times 10^4$ | 2.5 | Acid D | 11.2 | triamine A | 5.58 | | |
| Reference Example I-7 | A7 | $2.7 \times 10^4$ | 2.5 | Acid A | 4.76 | triamine A | 0.952 | diamine A | 2.85 |

Examples I-1 to I-22

Synthesis of Terminally Modified Polyamic Acid

To a recovery flask were added the DMAc solution of 2.5 weight % polybranched polyamic acid synthesized in Reference Examples I-1 to I-7 in an amount by mass as illustrated in Table 2, and a terminal group modifying agent in an amount by mass as illustrated in Table 2. The resulting mixture was stirred at room temperature through the night, whereby a DMAc solution of 2.5 weight % terminally modified polybranched polyamic acids illustrated in Table 2 were obtained.

TABLE 2

| | Terminally-modified polyamic acid | | Polybranched polyamic acid solution | | | Terminal group modifying agent | |
|---|---|---|---|---|---|---|---|
| | kind | polymer concentration (mass %) | kind of polybranched polyamic acid | Mass (g) | Number of acid anhydride group (mmol) | kind | mmol |
| Example I-1 | A1-1 | 2.5 | A1 | 20 | 0.558 | modifying agent A1 | 0.558 |
| Example I-2 | A1-2 | 2.5 | A1 | 20 | 0.558 | modifying agent A1 | 2.79 |
| Example I-3 | A1-3 | 2.5 | A1 | 20 | 0.558 | modifying agent A2 | 0.558 |
| Example I-4 | A1-4 | 2.5 | A1 | 20 | 0.558 | modifying agent A2 | 0.837 |
| Example I-5 | A1-5 | 2.5 | A1 | 20 | 0.558 | modifying agent A3 | 0.558 |
| Example I-6 | A1-6 | 2.5 | A1 | 20 | 0.558 | modifying agent A4 | 0.558 |
| Example I-7 | A1-7 | 2.5 | A1 | 20 | 0.558 | modifying agent A5 | 0.558 |
| Example I-8 | A1-8 | 2.5 | A1 | 20 | 0.558 | modifying agent A6 | 0.558 |
| Example I-9 | A1-9 | 2.5 | A1 | 20 | 0.558 | modifying agent A7 | 0.558 |
| Example I-10 | A1-10 | 2.5 | A1 | 20 | 0.558 | modifying agent A8 | 0.558 |
| Example I-11 | A1-11 | 2.5 | A1 | 20 | 0.558 | modifying agent A9 | 0.558 |
| Example I-12 | A2-1 | 2.5 | A2 | 20 | 0.570 | modifying agent A1 | 0.570 |
| Example I-13 | A2-2 | 2.5 | A2 | 15 | 0.427 | modifying agent A2 | 0.633 |
| Example I-14 | A3-1 | 2.5 | A3 | 15 | 0.380 | modifying agent A1 | 0.379 |
| Example I-15 | A3-2 | 2.5 | A3 | 15 | 0.380 | modifying agent A2 | 0.569 |
| Example I-16 | A4-1 | 2.5 | A4 | 20 | 0.672 | modifying agent A1 | 0.676 |
| Example I-17 | A4-2 | 2.5 | A4 | 15 | 0.504 | modifying agent A2 | 0.748 |
| Example I-18 | A5-1 | 2.5 | A5 | 20 | 0.418 | modifying agent A1 | 0.417 |
| Example I-19 | A5-2 | 2.5 | A5 | 5 | 0.105 | modifying agent A2 | 0.154 |
| Example I-20 | A6-1 | 2.5 | A6 | 10 | 0.269 | modifying agent A1 | 0.272 |
| Example I-21 | A6-2 | 2.5 | A6 | 10 | 0.269 | modifying agent A2 | 0.407 |
| Example I-22 | A7-1 | 2.5 | A7 | 17.5 | 0.208 | modifying agent A1 | 0.210 |

Examples I-23 to I-44

Synthesis of Terminally-Modified Polybranched Polyimide

To a recovery flask equipped with a Dean-Stark trap were added the DMAc solution (5.00 g) of 2.5 weight % terminally modified polybranched polyamic acid illustrated in Table 3 and xylene (2.5 mL), and the resulting mixture was heated and stirred at a temperature of 150 to 160° C. for 3 hours. After completion of the reaction, ethanol and hexane were added to precipitate a solid, and the precipitated solid was obtained by filtration. The solid was washed with ethanol and hexane, and vacuum-dried, whereby a terminally-modified polybranched polyimide illustrated in Table 3 was obtained. According to TG-DTA analysis, the 10% weight loss temperature of the terminally-modified polybranched polyimides were obtained and the results are shown in Table 3.

TABLE 3

| | Terminally-modified polyimide | | Terminally-modified polyamic acid |
|---|---|---|---|
| | kind | 10 mass % loss temperature (° C.) | |
| Example I-23 | AP1-1 | 570 | A1-1 |
| Example I-24 | AP1-2 | 482 | A1-2 |
| Example I-25 | AP1-3 | 549 | A1-3 |
| Example I-26 | AP1-4 | 505 | A1-4 |
| Example I-27 | AP1-5 | 577 | A1-5 |
| Example I-28 | AP1-6 | 600 | A1-6 |
| Example I-29 | AP1-7 | 597 | A1-7 |
| Example I-30 | AP1-8 | 575 | A1-8 |
| Example I-31 | AP1-9 | 576 | A1-9 |
| Example I-32 | AP1-10 | 607 | A1-10 |
| Example I-33 | AP1-11 | 531 | A1-11 |
| Example I-34 | AP2-1 | 516 | A2-1 |
| Example I-35 | AP2-2 | 577 | A2-2 |
| Example I-36 | AP3-1 | 575 | A3-1 |
| Example I-37 | AP3-2 | 547 | A3-2 |
| Example I-38 | AP4-1 | 525 | A4-1 |
| Example I-39 | AP4-2 | 521 | A4-2 |
| Example I-40 | AP5-1 | 531 | A5-1 |
| Example I-41 | AP5-2 | 509 | A5-2 |
| Example I-42 | AP6-1 | 565 | A6-1 |
| Example I-43 | AP6-2 | 430 | A6-2 |
| Example I-44 | AP7-1 | 605 | A7-1 |

Figures 1, 2:
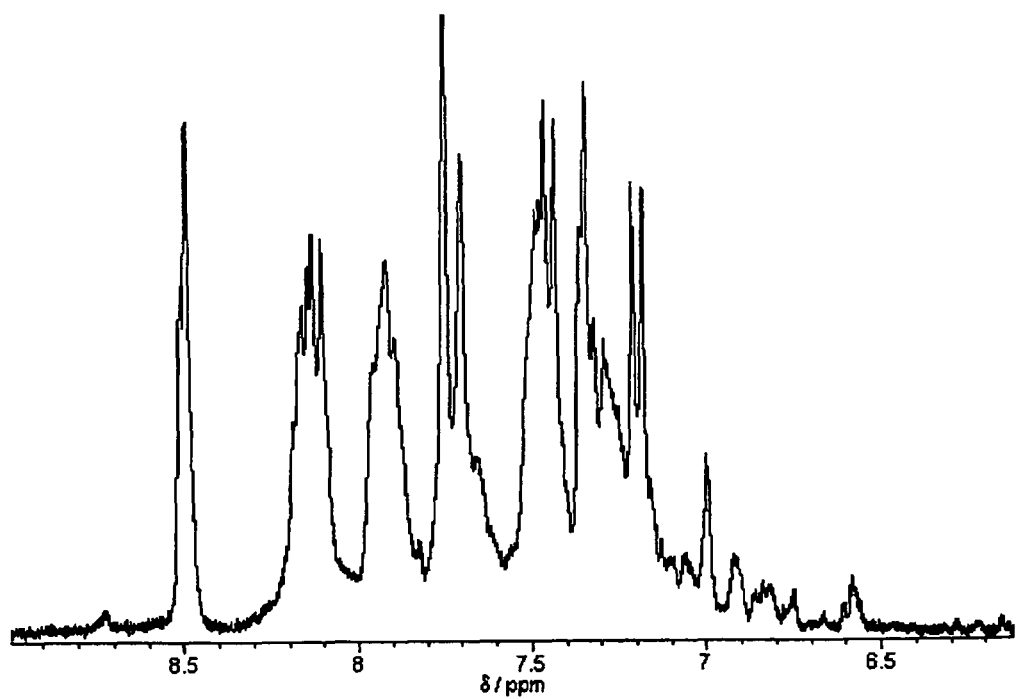

With respect to the terminally-modified polybranched polyimides of Examples I-40 and I-41, $^1$H-NMR analysis (300 MHz, DMSO-$d_6$) was conducted, and the respective results are shown in FIGS. 1-1 and 1-2. From $^1$H-NMR analysis (300 MHz, DMSO-$d_6$) illustrated in FIG. 1-1, absorption of α-positioned hydrogen of nitrogen of a pyridyl group derived from 4-aminopyridine incorporated into the terminally-modified polybranched polyimide AP 5-1 was observed at 8.6 to 8.8 ppm. From $^1$H-NMR analysis (300 MHz, DMSO-$d_6$) illustrated in FIG. 1-2, absorption of α-positioned hydrogen of nitrogen of a pyridyl group derived from 4-(aminomethyl)pyridine incorporated into the terminally-modified polybranched polyimide AP 5-2 was observed at 8.4 to 8.6 ppm.

Examples I-45 to I-51

Preparation of Terminally-Modified Polybranched Polyimide Film

The DMAc solution of 2.5 weight % terminally modified polybranched polyamic acid was concentrated under a reduced pressure, whereby a DMAc solutions of the terminally modified polybranched polyamic acid having a concentration illustrated in Table 4 were prepared. The DMAc solution of the concentrated terminally modified polybranched polyamic acid was coated on a glass substrate according to a spin coating method such that a thickness of the imidized film was to be a thickness shown in Table 4. Subsequently, the resulting material was baked using a firing furnace in atmospheric air at a temperature of 350° C., whereby a terminally-modified polybranched polyimide film was formed on the glass substrate. According to the optical microscope observation of the cross section of the film, the thickness of the terminally-modified polybranched polyimide film was measured.

TABLE 4

|  | Terminally-modified polyimide film | | Terminally-modified polyamic acid solution | |
| --- | --- | --- | --- | --- |
|  | Kind of film | Film thickness (μm) | Kind of polyamic acid | Polymer concentration (mass %) |
| Example I-45 | AF1-1 | 5 | A1-1 | 22 |
| Example I-46 | AF1-1' | 80 | A1-1 | 22 |
| Example I-47 | AF1-2 | 5 | A1-2 | 22 |
| Example I-48 | AF1-4 | 5 | A1-4 | 22 |
| Example I-49 | AF1-11 | 5 | A1-11 | 22 |
| Example I-50 | AF4-1 | 80 | A4-1 | 22 |
| Example I-51 | AF7-1 | 5 | A7-1 | 15 |
| Example I-52 | AF8-1 | — | A1-1 | 10 |

Figures 1, 2, 3:
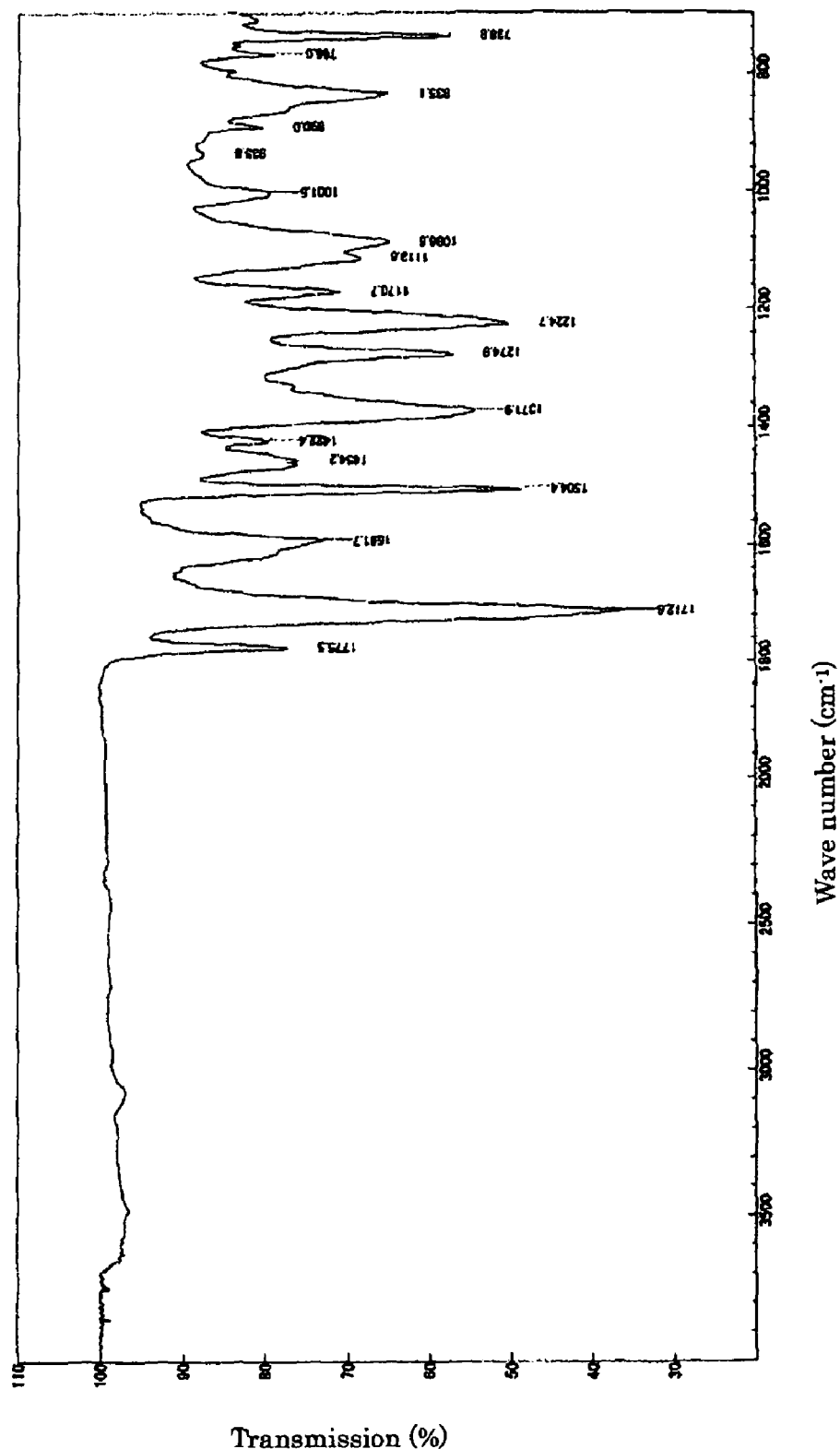

With respect to the film of Example I-45, from FTIR-ATR analysis illustrated in FIG. 1-3, absorption of carbonyl group of the terminal group-modified, polybranched polyimide was observed at 1713 cm$^{-1}$.

With respect to other films, from FTIR-ATR analysis in the same manner as for the film of Example I-45, absorption of carbonyl group of the terminal group-modified, polybranched polyimide was observed at 1713 cm$^{-1}$.

Example I-52

Preparation of Multi-Layered Terminally-Modified Polybranched Polyimide Film 3,3',4,4'-biphenyltetracarboxylic dianhydride and p-phenylene diamine in equimolar amounts were reacted in a N,N-dimethylacetamide solvent at room temperature, whereby a 10 weight % polyamic acid solution was prepared. This solution was coated on a glass substrate by a casting method, and then the DMAc solution of 10 weight % terminally modified polybranched polyamic acid A1-1 obtained by concentrating the DMAc solution of 2.5 weight % terminally modified polybranched polyamic acid A1-1 under a reduced pressure was coated thereon by a casting method. Subsequently, the resulting material was baked using a firing furnace in atmospheric air at a temperature of 350° C., whereby a terminally-modified polybranched polyimide film AF8-1 was formed on the glass substrate. When a side on which the terminally modified polybranched polyamic acid of the terminally-modified polybranched polyimide film AF8-1 was coated was analyzed by FTIR-ATR, absorption of a carbonyl group of the terminal group-modified, polybranched polyimide was observed at 1714 cm$^{-1}$.

Examples I-53, I-56 to I-61

Synthesis of terminally-modified polybranched polyimide for accelerating electroless plating The terminally-modified polybranched polyimide film formed on the glass substrate was immersed in a sodium tetrachloropalladate-containing aqueous solution (pH 4.3) of $1.0\times10^{-3}$ mol-dm$^{31\,3}$ containing a small amount of sodium chloride at room temperature for 3 minutes. Next, the polyimide film was peeled away from the substrate, washed with water for 30 minutes and then air-dried to obtain a terminally-modified polybranched polyimide for accelerating electroless plating. According to the surface analysis by XPS, the amount of palladium attached to the terminally-modified polybranched polyimide for accelerating electroless plating was measured and the results are shown in Table 5.

Example I-54

Synthesis of terminally-modified polybranched polyimide for accelerating electroless plating.

The terminally-modified polybranched polyimide film formed on the glass substrate was peeled away from the substrate and immersed in a solution containing tin chloride dihydrate (2.0g), concentrated hydrochloric acid (1 mL) and water (50 mL) at a temperature of 40° C. for 2minutes. Next, the film was immersed in water at a temperature of 40° C. for 10 seconds, and further immersed in a solution containing palladium chloride (25 mg), concentrated hydrochloric acid (0.25 mL) and water (50 mL) at 40° C. for 2 minutes. Thereafter, the polyimide film was lightly washed with running water and then air-dried to obtain a terminally-modified polybranched polyimide for accelerating electroless plating illustrated in Table 6. According to the surface analysis by XPS, the amount of palladium attached to the terminally-modified polybranched polyimide for accelerating electroless plating was measured and the results are shown in Table 5.

Example I-55

Synthesis of terminally-modified polybranched polyimide for accelerating electroless plating The terminally-modified polybranched polyimide film formed on the glass substrate was immersed in a toluene solution containing 1.5 g/L of palladium nanoparticle at room temperature for 3 minutes. Next, the polyimide film was peeled away from the substrate, washed with ethanol and water for 30 minutes and then dried up by air to obtain a terminally-modified polybranched polyimide for accelerating electroless plating. According to the surface analysis by XPS, the amount of palladium attached to the terminally-modified polybranched polyimide for accelerating electroless plating was measured and the results are shown in Table 5.

TABLE 5

| | Terminally-modified polybranched polyimide film | Terminally-modified polybranched polyimide for accelerating electroless plating | |
|---|---|---|---|
| | | kind | amount of attached palladium; surface atom concentration (%) |
| Example I-53 | AF1-1 | AB1-1 | 0.46 |
| Example I-54 | AF1-1' | AB1-1' | 0.93 |
| Example I-55 | AF1-1 | AB1-111 | 1.52 |
| Example I-56 | AF1-2 | AB1-2 | 0.40 |
| Example I-57 | AF1-4 | AB1-4 | 0.64 |
| Example I-58 | AF1-11 | AB1-11 | 0.71 |
| Example I-59 | AF4-1 | AB4-1 | 0.4 |
| Example I-60 | AF7-1 | AB7-1 | 0.41 |
| Example I-61 | AF7-1 | AB7-11 | 0.33 |
| Example I-62 | AF8-1 | AB8-1 | 0.24 |
| Example I-63 | AF8-1 | AB8-11 | 0.67 |

Example I-62

Synthesis of Multi-Layered Terminally-Modified Polybranched Polyimide for Accelerating Electroless Plating A polybranched polyimide for accelerating electroless plating, AB8-1, was obtained in the same manner as in Example I-53, except that the terminally-modified polybranched polyimide film AF8-1 was used as a terminally-modified polybranched polyimide film. According to the surface analysis by XPS, it was turned out that palladium with a surface atomic concentration of 0.24% was attached to a side on which the terminally modified polybranched polyamic acid A-1 of the terminally-modified polybranched polyimide for accelerating electroless plating AB8-1 was coated.

Example I-63

Synthesis of Multi-Layered Terminally-Modified Polybranched Polyimide For Accelerating Electroless Plating A polybranched polyimide for accelerating electroless plating, AB8-11, was obtained in the same manner as in Example I-54, except that the terminally-modified polybranched polyimide film AF8-1 was used as a terminally-modified polybranched polyimide film. According to the surface analysis by XPS, it was turned out that palladium with a surface atomic concentration of 0.67% was attached to a side on which the terminally modified polybranched polyamic acid A-1 of the terminally-modified polybranched polyimide for accelerating electroless plating AB8-11 was coated.

Comparative Example I-1

Polyimide Film A 3,3',4,4'-biphenyltetracarboxylic dianhydride and p-phenylene diamine in equimolar amounts were reacted in a N,N-dimethylacetamide solvent at room temperature, whereby a 10 weight % polyamic acid solution was prepared. This solution was spin-coated on a glass substrate and then the resulting material was baked at a temperature of 350° C., whereby a polyimide film A was obtained.

The linear-chain polyimide film A formed on the glass substrate was immersed in a sodium tetrachloropalladate-containing aqueous solution (pH 4.3) of $1.0 \times 10^{-3}$ mol·dm$^{-3}$ containing a small amount of sodium chloride at room temperature for 3 minutes. Next, the polyimide film was peeled away from the substrate, washed with water for 30 minutes and then air-dried to obtain a polyimide film A for accelerating electroless plating. According to the surface analysis by XPS, it was turned out that palladium with a surface atomic concentration of 0.18% was attached to the polyimide film A for accelerating electroless plating and the amount was smaller than a case in which a polybranched polyimide film was used.

Examples I-64 to I-72

Preparation of Copper-Coated Terminally-Modified Polybranched Polyimide

The terminally-modified polybranched polyimide for accelerating electroless plating was subjected to electroless copper plating. As a result, a copper thin film having a thickness of about 0.1 μm was formed without unevenness on a surface of every terminally-modified polybranched polyimide for accelerating electroless plating, whereby a copper-coated terminally-modified polybranched polyimide with a copper thin film formed thereon was obtained. The surface resistance of the copper-coated terminally-modified polybranched polyimide was measured and the results are shown in Table 6. The obtained copper-coated terminally-modified polybranched polyimide was subjected to a peel test using a cellophane tape manufactured by Nichiban Co., Ltd. and as a result, copper was not peeled away from each of the polyimide films, exhibiting good adhesiveness (In Examples I-73 and I-74, adhesiveness on the terminally-modified polybranched polyimide-coated surface was evaluated).

TABLE 6

| | Copper-coated terminally-modified polybranched polyimide | | Terminally-modified polybranched polyimide for accelerating electroless plating | |
|---|---|---|---|---|
| | surface resistance (Ω/□) | film adhesiveness | kind | amount of attached palladium; surface atom concentration (%) |
| Example I-64 | AC1-1 | $6.1 \times 10^{-1}$ | no peeling | AB1-1 | 0.46 |
| Example I-65 | AC1-1' | $7.7 \times 10^{-1}$ | no peeling | AB1-1' | 0.93 |
| Example I-66 | AC1-111 | $1.7 \times 10^{0}$ | no peeling | AB1-111 | 1.52 |
| Example I-67 | AC1-2 | $4.3 \times 10^{-1}$ | no peeling | AB1-2 | 0.40 |
| Example I-68 | AC1-4 | $8.2 \times 10^{-1}$ | no peeling | AB1-4 | 0.64 |

TABLE 6-continued

| | | Copper-coated terminally-modified polybranched polyimide | | Terminally-modified polybranched polyimide for accelerating electroless plating | |
|---|---|---|---|---|---|
| | | surface resistance ($\Omega/\square$) | film adhesiveness | kind | amount of attached palladium; surface atom concentration (%) |
| Example I-69 | AC1-11 | $7.3 \times 10^{-1}$ | no peeling | AB1-11 | 0.71 |
| Example I-70 | AC4-1 | $3.1 \times 10^{0}$ | no peeling | AB4-1 | 0.4 |
| Example I-71 | AC7-1 | $1.2 \times 10^{0}$ | no peeling | AB7-1 | 0.41 |
| Example I-72 | AC7-11 | $7.7 \times 10^{-1}$ | no peeling | AB7-11 | 0.33 |
| Example I-73 | AC8-1 | $3.9 \times 10^{0}$ | no peeling | AB8-1 | 0.24 |
| Example I-74 | AF8-11 | $6.6 \times 10^{-1}$ | no peeling | AB8-11 | 0.67 |

With respect to the copper-coated terminally-modified polybranched polyimide film of Example I-64, by TEM analysis of the cross section of the film as illustrated in FIG. 1-4, it was observed that copper and the polybranched polyimide film were adhered to each other.

Comparative Example I-2

The polyimide film A for accelerating electroless plating prepared in Comparative Example I-1 was subjected to electroless copper plating and as a result, it was just observed that a copper thin film was slightly formed on a surface of the polyimide film A for accelerating electroless plating.

Conditions of Electroless Plating

Electroless copper plating conducted in Examples I-64 to 74 and Comparative Example I-2 were carried out by immersing the polyimide in the electroless copper plating solution with the following composition at room temperature for 60 seconds to 3 minutes.

Composition of electroless copper plating solution

Copper sulfate pentahydrate: 3.0 g, sodium potassium tartrate tetrahydrate: 14.0 g, sodium hydroxide: 4.0 g, 37% formalin: 10 mL, water: 100 mL.

Reference Example I-8

Synthesis of 3,5-di(4-nitrophenoxy)aniline

See Part V.

Reference Example I-9

Synthesis of 3,5-di(4-aminophenoxy)aniline

See Part V.

Reference Example I-10

Synthesis of tri(4-aminophenyl)amine

To a 300-mL, 3-necked flask equipped with a reflux tube were added 1.52 g (4.00 mmol) of tri(4-nitrophenyl)amine and 5% Pd/C (200 mg), and the inside was replaced with argon. Dioxane (50 mL) and ethanol (25 mL) were added thereto, and the resulting mixture was stirred at a temperature of 80° C., and hydrazine monohydrate (8.0 mL) was added dropwise thereto over 3 hours and further stirred at 80° C. for 20 hours. The catalyst was separated by filtration, and then the reaction mixture was added to ice water (400 mL). The obtained gray solid was obtained by filtration, washed with water and then vacuum-dried, whereby a desired product was obtained (Quantity: 1.02 g, 3.51 mmol, Yield: 88%).

Analysis Results

1) $^1$HNMR (300 MHz, DMSO-$d_6$): 6.62-6.54 (m, 6H), 6.46-6.40 (m, 6H), 4.68 (br, 6H).

2) Elemental Analysis: $C_{18}H_{18}N_4$.

Measured value C, 74.33%; H, 6.16%; N, 19.13%.

Theoretical value C, 74.46%; H, 6.25%; N, 19.30%.

Reference Example I-11

Synthesis of 1,3,5-tri(4-nitrophenoxy)benzene

To a 500-mL, 3-necked flask equipped with a Dean-Stark trap and a reflux tube were added 6.32 g (50.1 mmol) of phloroglucinol dihydrate and anhydrous DMF (120 mL), and the resulting mixture was stirred at room temperature. 18.0 g (130 mmol) of potassium carbonate and toluene (20 mL) were added under argon, and then stirred at a temperature of 100° C. for 2 hours. The reaction mixture was cooled, and 23.4 g (166 mmol) of p-fluoronitrobenzene was added thereto and stirred again at 100° C. for 25 hours. Toluene was removed away in vacuo and the reaction mixture was poured into 500 mL of ice water, and a yellow solid was then precipitated. The solid was obtained by filtration, washed with a trace of water and then recrystallized from pyridine-water (1:1), whereby a desired product was obtained (Quantity: 11.1 g, 22.6 mmol, Yield: 45%).

Analysis Results

1) $^1$HNMR (300 MHz, DMSO-$d_6$): 8.31-8.24 (m, 6H), 7.35-7.28 (m, 6H), 6.97 (s, 3H).

2) Elemental Analysis: $C_{24}H_{15}N_3O_9$.

Measured value C, 58.84%; H, 3.05%; N, 8.62%.

Theoretical value C, 58.90%; H, 3.09%; N, 8.59%.

Reference Example I-12

Synthesis of 1,3,5-tri(4-aminophenoxy)benzene

To a 300-mL, 4-necked flask were added 2.46 g (5.03 mmol) of 1,3,5-tri(4-nitrophenoxy)benzene and 5% Pd/C (149 mg), and the inside was replaced with argon. Ethanol (50 mL) and THF (50 mL) were added thereto, and then the flask was equipped with a hydrogen balloon, and the mixture was stirred in a normal-pressure hydrogen atmosphere at room temperature for 3 days. The catalyst was separated by filtration and then the solvent was removed away in vacuo, whereby a desired product was obtained (Quantity: 2.01 g, 5.03 mmol, Yield: 100%).

Analysis Results
1) $^1$HNMR (300 MHz, CDCl$_3$): 6.87-6.81 (m, 6H), 6.67-6.60 (m, 6H), 6.16 (s, 3H), 3.65-3.45 (br, 6H).
2) Elemental Analysis: C$_{24}$H$_{21}$N$_3$O$_3$.
Measured value C, 72.17%; H, 5.20%; N, 10.35%.
Theoretical value C, 72.16%; H, 5.30%; N, 10.52%.

Reference Example I-13

Synthesis of Electroless Plating Catalyst Precursor

Sodium Tetrachloropalladate

To a 50-mL flask were added 3.54 g (20.0 mmol) of palladium chloride and 2.34 g (40.1 mmol) of sodium chloride, and water (20 mL) was added thereto. The mixture was heated and stirred at a temperature of 120° C. for evaporating the solvent, whereby a desired product was quantitatively obtained.

Reference Example I-14

Synthesis of Electroless Plating Catalyst Precursor

Palladium Nanoparticle

To a 50-mL, 2-necked flask equipped with a condenser were added 400 mg (1.78 mmol) of palladium acetate and 500 mg (0.451 mmol) of tetraoctadecylammonium bromide, and the inside was replaced with argon. Toluene (20 mL) and THF (4 mL) were added thereto and then the resulting mixture was stirred at a temperature of 30° C. Ethanol (2.5 mL) was further added thereto, and the mixture was stirred at 65° C. for 14 hours and cooled down to room temperature. Then, while the mixture was vigorously stirred, ethanol was added, and the mixture was further stirred at room temperature for 5 hours. The precipitated gray solid was obtained by filtration, washed with ethanol and then vacuum-dried, whereby a desired product (338 mg) was obtained. From XRD analysis, it was turned out that the product was a zerovalent palladium nanoparticle of not more than 10 nm. Further, from ICP-AES analysis, it was turned out that the palladium concentration in the palladium nanoparticle was 47 weight %.

Part II

Examples of the Second Aspect

Reference Example II-8

Synthesis of 3,5-di(4-nitrophenoxy)aniline

See Part V.

Reference Example II-9

Synthesis of 3,5-di(4-aminophenoxy)aniline

See Part V.

Reference Example II-10

Synthesis of tri(4-aminophenyl)amine

See Reference Example I-10 of Part I.

Reference Example II-11

Synthesis of 1,3,5-tri(4-nitrophenoxy)benzene)

See Reference Example I-11 of Part I.

Reference Example II-12

Synthesis of 1,3,5-tri(4-aminophenoxy)benzene

See Reference Example I-12 of Part I.

Reference Example II-13

Synthesis of Electroless Plating Catalyst Precursor

Sodium Tetrachloropalladate

To a 50-mL flask were added 3.54 g (20.0 mmol) of palladium chloride and 2.34 g (40.1 mmol) of sodium chloride, and water (20 mL) was added thereto. The mixture was heated and stirred at a temperature of 120° C. for evaporating the solvent, whereby a desired product was quantitatively obtained.

Examples II-1 to II-12

Synthesis of terminally modified polyamic acid

The DMAc solution of 2.5 weight % polybranched polyamic acid A in amount by mass as illustrated in Table 7 and the terminal modifying agent in amount by mass as illustrated in Table 7 were added, and the resulting mixture was stirred at room temperature through the night, whereby a DMAc solution of 2.5 weight % terminally modified polybranched polyamic acid was obtained.

TABLE 7

| | Terminally-modified polyamic acid | | Polybranched polyamic acid solution | | | | |
|---|---|---|---|---|---|---|---|
| | | polymer concentration | kind of polybranched | | acid anhydride; number of terminal group | Terminal group modifying agent | |
| | kind | (mass %) | polyamic acid | mass (g) | (mmol) | kind | |
| Example II-1 | B1-1 | 2.5 | A1 | 80 | 2.23 | modifying agent B1 | 2.23 |
| Example II-2 | B1-2 | 2.5 | A1 | 80 | 2.23 | modifying agent B2 | 2.23 |
| Example II-3 | B1-3 | 2.5 | A1 | 80 | 2.23 | modifying agent B3 | 2.23 |
| Example II-4 | B1-4 | 2.5 | A1 | 80 | 2.23 | modifying agent B4 | 3.34 |
| Example II-5 | B2-1 | 2.5 | A2 | 10 | 0.284 | modifying agent B1 | 0.284 |

TABLE 7-continued

| | Terminally-modified polyamic acid | | Polybranched polyamic acid solution | | | |
|---|---|---|---|---|---|---|
| | | polymer concentration | kind of polybranched | mass | acid anhydride; number of terminal group | Terminal group modifying agent | |
| | kind | (mass %) | polyamic acid | (g) | (mmol) | kind | |
| Example II-6 | B3-1 | 2.5 | A3 | 20 | 0.506 | modifying agent B1 | 0.505 |
| Example II-7 | B4-1 | 2.5 | A4 | 49.2 | 1.65 | modifying agent B1 | 1.65 |
| Example II-8 | B5-1 | 2.5 | A5 | 10 | 0.209 | modifying agent B1 | 0.210 |
| Example II-9 | B6-1 | 2.5 | A6 | 10 | 0.269 | modifying agent B1 | 0.270 |
| Example II-10 | B7-1 | 2.5 | A7 | 7.5 | 0.089 | modifying agent B1 | 0.089 |
| Example II-11 | B7-2 | 2.5 | A7 | 7.5 | 0.089 | modifying agent B2 | 0.089 |
| Example II-12 | B7-4 | 2.5 | A7 | 7.5 | 0.089 | modifying agent B4 | 0.094 |

Examples II-13 to II-24

Synthesis of Terminally-Modified Polybranched Polyimide

To a recovery flask equipped with a Dean-Stark trap were added the DMAc solution of 2.5 weight % terminally modified polybranched polyamic acid (5.00 g) illustrated in Table 8 and xylene (2.5 mL), and the resulting material was heated and stirred at a temperature of 150 to 160° C. for 3 hours. After completion of the reaction, ethanol and hexane were added to precipitate a solid, and the precipitated solid was obtained by filtration. The solid was washed with ethanol and hexane, and then vacuum-dried, whereby a terminally-modified polybranched polyimide was obtained. TG-DTA analysis of the terminally-modified polybranched polyimide was carried out for obtaining the 10% weight loss temperature, and the results are shown in Table 8.

TABLE 8

| | Terminally-modified polyimide | | |
|---|---|---|---|
| | kind | 10 mass % loss temperature (° C.) | Terminally modified polyamic acid |
| Example II-13 | BP1-1 | 587 | B1-1 |
| Example II-14 | BP1-2 | 567 | B1-2 |
| Example II-15 | BP1-3 | 598 | B1-3 |
| Example II-16 | BP1-4 | 544 | B1-4 |
| Example II-17 | BP1-5 | 593 | B2-1 |
| Example II-18 | BP1-6 | 576 | B3-1 |
| Example II-19 | BP1-7 | 560 | B4-1 |
| Example II-20 | BP1-8 | 527 | B5-1 |
| Example II-21 | BP1-9 | 505 | B6-1 |
| Example II-22 | BP1-10 | 605 | B7-1 |
| Example II-23 | BP1-11 | 596 | B7-2 |
| Example II-24 | BP2-1 | 591 | B7-4 |

With respect to the terminally-modified polybranched polyimide of Example II-20, from $^1$H-NMR analysis (300 MHz, DMSO-$d_6$) of the terminal group-modified, polybranched polyimide BP1-8 illustrated in FIG. 2-1, absorption of hydrogen atom bonded to aromatic carbon of the polybranched polyimide was observed at 8.5 to 6.6 ppm.

Examples II-25 to II-29

Preparation of Terminally-Modified Polybranched Polyimide Film

The DMAc solution of 2.5 weight % terminally modified polybranched polyamic acid was concentrated under a reduced pressure, whereby a DMAc solution of the terminally modified polybranched polyamic acid with a concentration illustrated in Table 9 was prepared. The DMAc solution of the concentrated terminally modified polybranched polyamic acid was coated on a glass substrate by a spin coating method or a casting method. Subsequently, the resulting material was baked using a firing furnace in atmospheric air at 350° C., whereby a terminally-modified polybranched polyimide film illustrated in Table 9 was formed on the glass substrate.

The dielectric constant of the film of Example II-25 was 3.32. From, FTIR-ATR analysis illustrated in FIG. 2-2, absorption of carbonyl group of the terminal group-modified, polybranched polyimide was observed at 1714 cm$^{-1}$.

With respect to films of Example II-26 to II-29, from FTIR-ATR analysis, absorption of carbonyl group of the terminal group-modified, polybranched polyimide was observed at the range of 1710 to 1721 cm$^{-1}$.

TABLE 9

| | Terminally-modified polyimide film | Terminally-modified polyamic acid solution | |
|---|---|---|---|
| | | polyamic acid kind | polymer concentration (mass %) |
| Example II-25 | BF1-1 | B1-1 | 20 |
| Example II-26 | BF1-2 | B1-2 | 20 |
| Example II-27 | BF1-4 | B1-4 | 20 |
| Example II-28 | BF4-1 | B4-1 | 20 |
| Example II-29 | BF7-1 | B7-1 | 20 |
| Example II-30 | BF8-1 | B1-1 | 10 |

Example II-30

Preparation of Terminally-Modified Polybranched Polyimide Film 3,3',4,4'-biphenyltetracarboxylic dianhydride and p-phenylene diamine in equimolar amounts were reacted in a N,N-dimethylacetamide solvent at room temperature, whereby a 10 weight % polyamic acid solution was prepared. This solution was coated on a glass substrate according to a casting method, and then the DMAc solution of 10 weight % terminally modified polybranched polyamic acid A-1 obtained by concentrating the DMAc solution of 2.5 weight % terminally modified polybranched polyamic acid B1-1 under a reduced pressure was coated thereon according to a casting method. Subsequently, the resulting material was baked using a firing furnace in atmospheric air at 350° C., whereby a terminally-modified polybranched polyimide film BF8-1 was formed on the glass substrate. When a side on which the terminally modified polybranched polyamic acid B1-1 was coated was analyzed by FTIR-ATR, absorption of carbonyl group of the terminal group-modified, polybranched polyimide was observed at 1713 cm$^{-1}$.

Examples II-31, II-33 to 36, II-38

Synthesis of Multi-Layered Terminally-Modified Polybranched Polyimide for Accelerating Electroless Plating The terminally-modified polybranched polyimide film formed on the glass substrate illustrated in Table 10 was immersed in a sodium tetrachloropalladate-containing aqueous solution (pH 4.3) of 1.0×10$^{-3}$ mol·dm$^{-3}$ containing a small amount of sodium chloride at room temperature for 3 minutes. Next, the polyimide film was peeled away from the substrate, washed with water for 30 minutes and then air-dried to obtain a terminally-modified polybranched polyimide for accelerating electroless plating. According to the surface analysis by XPS of the terminally-modified polybranched polyimide film for accelerating electroless plating, the concentration of a palladium-attached atom on the surface and the concentration of a sulfur atom were measured, and the results are shown in Table 10.

Example II-32, II-37

Synthesis of Terminally-Modified Polybranched Polyimide for Accelerating Electroless Plating The terminally-modified polybranched polyimide film formed on the glass substrate illustrated in Table 10 was peeled away from the substrate, and immersed in a solution containing tin chloride dihydrate (2.0 g), concentrated hydrochloric acid (1 mL) and water (50 mL) at a temperature of 40° C. for 2 minutes. Next, the polyimide film was immersed in water at a temperature of 40° C. for 10 seconds, and further immersed in a solution containing palladium chloride (25 mg), concentrated hydrochloric acid (0.25 mL) and water (50 mL) at 40° C. for 2 minutes. Thereafter, the polyimide film was lightly washed with running water and then air-dried, whereby a terminally-modified polybranched polyimide for accelerating electroless plating was obtained. According to the surface analysis by XPS of the terminally-modified polybranched polyimide film for accelerating electroless plating, the concentration of a palladium-attached atom on the surface and the concentration of a sulfur atom were measured, and the results are shown in Table 10.

TABLE 10

| | Terminally-modified polybranched polyimide for accelerating electroless plating | | | |
|---|---|---|---|---|
| | Terminally-modified polyimide film | kind | amount of attached palladium; surface atom concentration (%) | sulfur surface atom concentration (%) |
| Example II-31 | BF1-1 | BB1-1 | 0.43 | 0.38 |
| Example II-32 | BF1-1 | BB1-11 | 0.73 | — |
| Example II-33 | BF1-2 | BB1-2 | 0.37 | 0.56 |
| Example II-34 | BF1-4 | BB1-4 | 0.55 | 0.24 |
| Example II-35 | BF4-1 | BB4-1 | 0.27 | 0.31 |
| Example II-36 | BF7-1 | BB7-1 | 0.41 | 0.34 |
| Example II-37 | BF7-1 | BB7-11 | 1.05 | — |
| Example II-38 | BF8-1 | BB8-1 | 0.90 | — |

Comparative Example II-1

Polyimide Film I 3,3',4,4'-biphenyltetracarboxylic dianhydride and p-phenylene diamine in equimolar amounts were reacted in a N,N-dimethylacetamide solvent at room temperature, whereby a 10 weight % polyamic acid solution was prepared. This solution was coated on a glass substrate and then the resulting material was baked at 350° C., whereby a polyimide film I was obtained. According to FTIR-ATR analysis, absorption of carbonyl group of the polyimide was observed at 1709 cm$^{-1}$.

The linear-chain polyimide film I formed on the glass substrate was immersed in a sodium tetrachloropalladate-containing aqueous solution (pH 4.3) of 1.0×10$^{-3}$ mol·dm$^{-3}$ containing a small amount of sodium chloride at room temperature for 3 minutes. Next, the polyimide film was peeled away from the substrate, washed with water for 30 minutes and then dried up by air to obtain a polyimide film I for accelerating plating. According to the surface analysis by XPS, it was turned out that palladium with a surface atomic concentration of 0.18% was attached to the polyimide film I for accelerating plating and the amount was smaller than a case in which a polybranched polyimide film was used.

Examples II-39 to 11-46

Preparation of Copper-Coated Terminally-Modified Polybranched Polyimide

The terminally-modified polybranched polyimide for accelerating electroless plating illustrated in Table 11 was subjected to electroless copper plating. As a result, a copper thin film was formed without unevenness on a surface of every terminally-modified polybranched polyimide for accelerating electroless plating to obtain copper-coated terminally-modified polybranched polyimide with a copper thin film formed thereon. The surface resistance of the copper-coated terminally-modified polybranched polyimide was measured and the results are shown in Table 11. Further, the copper-coated terminally-modified polybranched polyimide was subjected to a peel test using a cellophane tape manufactured by Nichiban Co., Ltd. and as a result, it was found that copper was not peeled away from each of the polyimide films.

TABLE 11

| | Copper-coated terminally-modified polybranched polyimide | | Terminally-modified polybranched polyimide for accelerating electroless plating | |
|---|---|---|---|---|
| | | surface resistance ($\Omega/\square$) | film adhesiveness | kind | amount of attached palladium; surface atom concentration (%) |
| Example II-39 | BC1-1 | $8.1 \times 10^{-1}$ | no peeling | BB1-1 | 0.43 |
| Example II-40 | BC1-11 | $4.2 \times 10^{-1}$ | no peeling | BB1-11 | 0.73 |
| Example II-41 | BC1-2 | $3.2 \times 10^{-1}$ | no peeling | BB1-2 | 0.37 |
| Example II-42 | BC1-4 | $5.1 \times 10^{-1}$ | no peeling | BB1-4 | 0.55 |
| Example II-43 | BC4-1 | $4.5 \times 10^{-1}$ | no peeling | BB4-1 | 0.27 |
| Example II-44 | BC7-1 | $5.8 \times 10^{-1}$ | no peeling | BB7-1 | 0.41 |
| Example II-45 | BC7-1 | $5.1 \times 10^{-1}$ | no peeling | BB7-1 | 1.05 |
| Example II-46 | BC8-1 | $8.8 \times 10^{-1}$ | no peeling | BB8-1 | 0.90 |

Comparative Example II-2

The polyimide film I for accelerating electroless plating prepared in Comparative Example II-1 was subjected to electroless copper plating and as a result, it was just observed that a copper thin film was slightly formed on a surface of the polyimide film I for accelerating electroless plating.

Conditions of Electroless Plating

Electroless copper plating conducted in Examples II-39 to 46 and Comparative Example II-2 were carried out by immersing the polyimide in the electroless copper plating solution with the following composition at room temperature for 1 to 3 minutes.

Composition of Electroless Copper Plating Solution
Copper sulfate pentahydrate: 3.0 g, potassium sodium tartrate tetrahydrate: 14.0 g, sodium hydroxide: 4.0 g, 37% formalin: 10 mL, water: 100 mL.

Part II

Examples of the Third Aspect

Reference Examples III-1 to III-5, III-7 to III-9

Synthesis of Polybranched Polyamic Acid

To a 4-necked flask equipped with a dropping funnel were added acidDianhydride illustrated in Table 12 and anhydrous N,N-dimethylacetamide (hereinafter abbreviated as DMAc). While the resulting mixture was stirred at room temperature, a solution obtained by dissolving a triamine and/or a diamine illustrated in Table 12 in anhydrous DMAc was gradually added over 5 to 7 hours. The mixture was stirred at room temperature through the night, whereby a DMAc solution of 2.5 weight % polybranched polyamic acid was obtained. The number average molecular weight of the polybranched polyamic acid was analyzed according to GPC and the results are shown in Table 12.

Reference Example III-6

Synthesis of Copolymer Polybranched Polyamic Acid

To a 200-mL, 3-necked flask equipped with a dropping funnel were added 3,5-di(4-aminophenoxy)aniline (1.38 mmol), 1,4-phenylene diamine (4.15 mmol) and anhydrous DMAc. While the resulting mixture was stirred at room temperature, 3,3',4,4'-biphenyltetracarboxylic dianhydride (5.53 mmol) was gradually added over 6 hours. The mixture was stirred at room temperature through the night, whereby a DMAc solution of 2.5 weight % polybranched polyamic acid A6' was obtained. According to GPC of the polybranched polyamic acid A6', the number average molecular weight was $4.0 \times 10^4$.

TABLE 12

| | Polybranched polyamic acid | | | | | | | | |
|---|---|---|---|---|---|---|---|---|---|
| | kind | number average molecular weight (Mn) | polymer concentration (mass %) | Acid dianhydride component | | Triamine component | | Diamine component | |
| | | | | kind | mmol | kind | mmol | kind | mmol |
| Reference Example III-1 | A1' | $3.7 \times 10^4$ | 2.5 | Acid A | 3.32 | triamine A | 3.32 | — | — |
| Reference Example III-2 | A2' | $3.4 \times 10^4$ | 2.5 | Acid C | 3.32 | triamine A | 3.32 | — | — |
| Reference Example III-3 | A3' | $2.3 \times 10^4$ | 2.5 | Acid B | 3.32 | triamine A | 3.32 | — | — |
| Reference Example III-4 | A4' | $2.8 \times 10^4$ | 2.5 | Acid D | 3.32 | triamine A | 3.32 | — | — |
| Reference Example III-5 | A5' | $3.0 \times 10^4$ | 2.5 | Acid A | 3.32 | triamine B | 3.32 | — | — |
| Reference Example III-6 | A6' | $4.0 \times 10^4$ | 2.5 | Acid A | 5.53 | triamine A | 1.38 | diamine A | 4.15 |

TABLE 12-continued

| | | Polybranched polyamic acid | | | | | | | |
|---|---|---|---|---|---|---|---|---|---|
| | | number average molecular weight | polymer concentration | Acid dianhydride component | | Triamine component | | Diamine component | |
| | kind | (Mn) | (mass %) | kind | mmol | kind | mmol | kind | mmol |
| Reference Example III-7 | A7' | $4.0 \times 10^4$ | 2.5 | Acid A | 5.53 | triamine C | 3.32 | — | — |
| Reference Example III-8 | A8' | $2.5 \times 10^4$ | 2.5 | Acid C | 5.53 | triamine A | 3.32 | — | — |
| Reference Example III-9 | A9' | $2.8 \times 10^4$ | 2.5 | Acid D | 5.53 | triamine A | 3.32 | — | — |

Examples III-1 to III-8

Synthesis of Terminally Modified Polyamic Acid

To a recovery flask were added the DMAc solution of 2.5 weight % polybranched polyamic acid (amount illustrated in Table 13) synthesized in Reference Examples of Table 12 and a terminal modifying agent (amount illustrated in Table 13) illustrated in Table 13. The resulting mixture was stirred at room temperature through the night, whereby a DMAc solution of 2.5 weight % terminally modified polybranched polyamic acid was obtained.

Synthesis of Terminally-Modified Polybranched Polyimide

To a Schlenk flask equipped with a Dean-Stark trap were added the DMAc solution of 2.5 weight % terminally modified polybranched polyamic acid (5.00 g) polymerized as above and xylene (2.5 mL), and the resulting material was heated and stirred at a temperature of 150 to 160° C. for 3 hours. After completion of the reaction, ethanol and hexane were added to precipitate a solid, and the precipitated solid was obtained by filtration. The solid was washed with ethanol and hexane, and then vacuum-dried, whereby a terminally-modified polybranched polyimide was obtained. The 10% weight loss temperature of the terminally-modified polybranched polyimide was obtained by TG-DTA analysis, and the results are shown in Table 13.

With respect to the terminally-modified polybranched polyimide of Example III-4, $^1$H-NMR analysis (300 MHz, DMSO-$d_6$) was carried out and its measurement results are illustrated in FIG. 3-1. Absorption caused by α-positioned hydrogen of nitrogen of a pyridyl group derived from 3,4-pyridinedicarboxylic anhydride incorporated into the polybranched polyimide was observed at 9.3 to 8.6 ppm from FIG. 3-1.

TABLE 13

| | Terminally-modified polyimide | | Terminally-modified polyamic acid | | Polybranched polyamic acid solution | | Amine number of terminal group | Terminal group modifying agent | |
|---|---|---|---|---|---|---|---|---|---|
| | kind | 10% mass loss temperature (° C.) | kind | polymer concentration (mass %) | kind of polybranched polyamic acid | mass (g) | (mmol) | kind | mmol |
| Example III-1 | CP1-1 | 539 | A1'-1 | 2.5 | A1' | 20 | 0.832 | modifying agent C1 | 0.829 |
| Example III-2 | CP1-2 | 556 | A1'-2 | 2.5 | A1' | 20 | 0.832 | modifying agent C2 | 0.830 |
| Example III-3 | CP1-3 | 462 | A1'-3 | 2.5 | A1' | 30 | 1.25 | modifying agent C3 | 1.25 |
| Example III-4 | CP2-2 | 527 | A2'-2 | 2.5 | A2' | 5.0 | 0.167 | modifying agent C2 | 0.166 |
| Example III-5 | CP3-1 | 510 | A3'-1 | 2.5 | A3' | 10 | 0.476 | modifying agent C1 | 0.475 |
| Example III-6 | CP4-1 | 538 | A4'-1 | 2.5 | A4' | 10 | 0.405 | modifying agent C1 | 0.406 |
| Example III-7 | CP5-1 | 586 | A5'-1 | 2.5 | A5' | 10 | 0.428 | modifying agent C1 | 0.428 |
| Example III-8 | CP6-1 | 590 | A6'-1 | 2.5 | A6' | 30 | 0.415 | modifying agent C1 | 0.414 |

Examples III-9 to III-12

Synthesis of Terminally-Modified Polybranched Polyimide Film

The DMAc solution of 2.5 weight % terminally modified polybranched polyamic acid synthesized in Examples III-1 to III-8 was concentrated under a reduced pressure, whereby a DMAc solution of the terminally modified polybranched polyamic acid of a concentration illustrated in Table 14 was prepared. The DMAc solution of the concentrated terminally modified polybranched polyamic acid was coated on the glass substrate by a spin coating method or a casting method. Subsequently, the resulting material was baked using a firing furnace in atmospheric air at 350° C., whereby a terminally-modified polybranched polyimide film was formed on the glass substrate.

According to FTIR-ATR analysis of the terminally-modified polybranched polyimide film formed on the glass substrate, absorption of carbonyl group of the terminal group-modified, polybranched polyimide was observed at a range of 1712 to 1714 cm$^{-1}$.

Synthesis of Terminally-Modified Polybranched Polyimide for Accelerating Electroless Plating The aforementioned terminally-modified polybranched polyimide film formed on the glass substrate was immersed in a sodium tetrachloropalladate-containing aqueous solution (pH 4.3) of $1.0 \times 10^{-3}$ mol·dm$^{-3}$ containing a small amount of sodium chloride at room temperature for 3 minutes. Next, the polyimide film was peeled away from the substrate, washed with water for 30 minutes and then air-dried to obtain a terminally-modified polybranched polyimide for accelerating electroless plating. According to the surface analysis by XPS of the terminally-modified polybranched polyimide for accelerating electroless plating, the surface atomic concentration of palladium attached to a surface of the terminally-modified polybranched polyimide for accelerating electroless plating was measured, and the results are shown in Table 14.

Comparative Example III-1

Polyimide Film A 3,3',4,4'-biphenyltetracarboxylic acid dianhydride and p-phenylene diamine in equimolar amounts were reacted in a N,N-dimethylacetamide solvent at room temperature, whereby a 10 weight % polyamic acid solution was prepared. This solution was spin-coated on a glass substrate and then the resulting material was baked at 350° C., whereby a polyimide film A was obtained.

The linear-chain polyimide film A formed on the glass substrate was immersed in a sodium tetrachloropalladate-containing aqueous solution (pH 4.3) of $1.0 \times 10^{-3}$ mol·dm$^{-3}$ containing a small amount of sodium chloride at room temperature for 3 minutes. Next, the polyimide film was peeled away from the substrate, washed with water for 30 minutes and then air-dried to obtain a polyimide film A for accelerating electroless plating. According to the surface analysis by XPS, it was turned out that palladium with a surface atomic concentration of 0.18% was attached to the polyimide film A

TABLE 14

| | terminally-modified polyamic acid | | Terminally-modified polybranched polyimide for accelerating electroless plating | |
|---|---|---|---|---|
| | kind | Concentrated polymer concentration (mass %) | Terminally-modified polyimide film | kind | amount of attached palladium; surface atom concentration (%) |
| Example III-9 | A1'-1 | 10 | CPa1-1 | CBa1-1 | 0.44 |
| Example III-10 | A1'-2 | 8.6 | CPa1-2 | CBa1-2 | 0.46 |
| Example III-10a | A1'-2 | 8.6 | CPa1-2 | CBa1-21 | 1.63 |
| Example III-11 | A1'-3 | 10 | CPa1-1 | CBa1-1 | 0.56 |
| Example III-12 | A6'-1 | 10 | CPa6-1 | CBa6-1 | 0.31 |

Example III-10a

Synthesis of Terminally-Modified Polybranched Polyimide for Accelerating Electroless Plating The terminally-modified polybranched polyimide film CPa-2 formed on the glass substrate was peeled away from the substrate, and immersed in a solution containing tin chloride dihydrate (2.0 g), concentrated hydrochloric acid (1 mL) and water (50 mL) at a temperature of 40° C. for 2 minutes. Next, the polyimide film was immersed in water at a temperature of 40° C. for 10 seconds, and further immersed in a solution containing palladium chloride (25 mg), concentrated hydrochloric acid (0.25 mL) and water (50 mL) at 40° C. for 2 minutes. Thereafter, the polyimide film was lightly washed with running water and then air-dried, whereby a terminally-modified polybranched polyimide for accelerating electroless plating was obtained. According to the surface analysis by XPS, it was turned out that palladium with a surface atomic concentration of 1.63% was attached to the terminally-modified polybranched polyimide for accelerating electroless plating CBa1-21.

for accelerating electroless plating and the amount was smaller than a case in which a polybranched polyimide film was used.

Examples III-13 to III-16

Synthesis of Copper-Coated Terminally-Modified Polybranched Polyimide

The aforementioned terminally-modified polybranched polyimide for accelerating electroless plating illustrated in the Table 14 was subjected to electroless copper plating. As a result, a copper-coated terminally-modified polybranched polyimide with a copper thin film formed without unevenness on a surface of the terminally-modified polybranched polyimide for accelerating electroless plating was obtained. The surface resistance of the copper-coated terminally-modified polybranched polyimide was obtained and the results are shown in Table 15. The obtained copper-coated terminally-modified polybranched polyimide was subjected to a peel test using a cellophane tape manufactured by Nichiban Co., Ltd. and as a result, copper was not peeled away from each of the polyimide films, exhibiting good adhesiveness.

TABLE 15

| | Copper-coated terminally-modified polybranched polyimide | | Terminally-modified polybranched polyimide for accelerating electroless plating | amount of attached palladium; surface atom concentration (%) |
|---|---|---|---|---|
| | surface resistance (Ω/□) | film adhesiveness | kind | |
| Example III-13 | CCa1-1 | $1.1 \times 10^0$ | no peeling | CBa1-1 | 0.44 |
| Example III-14 | CCa1-2 | $2.5 \times 10^{-1}$ | no peeling | CBa1-2 | 0.46 |
| Example III-14a | CCa1-21 | $8.9 \times 10^{-1}$ | no peeling | CBa1-21 | 1.63 |
| Example III-15 | CCa1-1 | $4.4 \times 10^0$ | no peeling | CBa1-1 | 0.56 |
| Example III-16 | CCa6-1 | $8.3 \times 10^{-1}$ | no peeling | CBa6-1 | 0.31 |

Comparative Example III-2

The polyimide film A for accelerating electroless plating prepared in Comparative Example III-1 was subjected to electroless copper plating and as a result, it was just observed that a copper thin film was slightly formed on a surface of the polyimide film A for accelerating electroless plating.

Conditions of Electroless Plating

Electroless copper plating conducted in Examples III-13 to III-16 and Comparative Example III-2 was carried out by immersing the polyimide in the electroless copper plating solution with the following composition at room temperature for 1 to 3 minutes.

Composition of Electroless Copper Plating Solution

Copper sulfate pentahydrate: 3.0 g, potassium sodium tartrate tetrahydrate: 14.0 g, sodium hydroxide: 4.0 g, 37% formalin: 10 mL, water: 100 mL.

Reference Example III-7

Synthesis of 3,5-di(4-nitrophenoxy)aniline

See Part V.

Reference Example III-8

Synthesis of 3,5-di(4-aminophenoxy)aniline

See Part V.

Reference Example III-9

Synthesis of tri(4-aminophenyl)amine

See Part I.

Reference Example III-10

Synthesis of Electroless Plating Catalyst Precursor

Sodium Tetrachloropalladate

To a 50-mL flask were added palladium chloride (3.54 g, 20.0 mmol) and sodium chloride (2.34 g, 40.1 mmol), and water (20 mL) was added thereto. The mixture was heated and stirred at a temperature of 120° C. for evaporating the solvent, whereby a desired product was quantitatively obtained.

Part IV

Examples of the Fourth Aspect

Examples IV-1 to IV-9

Process for Production of Terminally-Modified, Polybranched Polyimide

To a flask including the 2.5 weight % terminally modified polybranched polyamic acid solution (10.1 g) illustrated in Table 12 was added xylene (5.0 mL). A Dean-Stark trap was then equipped with and then the resulting material was heated and stirred at a temperature of 150 to 160° C. for 3 hours. After completion of the reaction, ethanol and hexane were added to precipitate a solid, and the precipitated solid was obtained by filtration. The solid was washed with ethanol and hexane, and then vacuum-dried, whereby a terminally-modified polybranched polyimide was obtained. According to TG-DTA of the terminally-modified polybranched polyimide, the 10% weight loss temperature of the terminally-modified polybranched polyimide was obtained and the results are shown in Table 16.

The obtained terminally-modified polybranched polyimides each exhibited solubility to every DMAc and DMSO.

With respect to the terminally-modified polybranched polyimide of Example IV-1 and Examples IV-4 to IV-9, $^1$H-NMR analysis (300 MHz, DMSO-$d_6$) was carried out and as a result, absorption of hydrogen atom bonded to an imino group carbon formed by reacting a terminal amino group of the polybranched polyamic acid with salicylaldehyde as shown in FIG. 4-1 and FIGS. 4-4 to 4-9 was observed at 9.1 to 8.8 ppm.

Figures 1, 2, 3, 4:
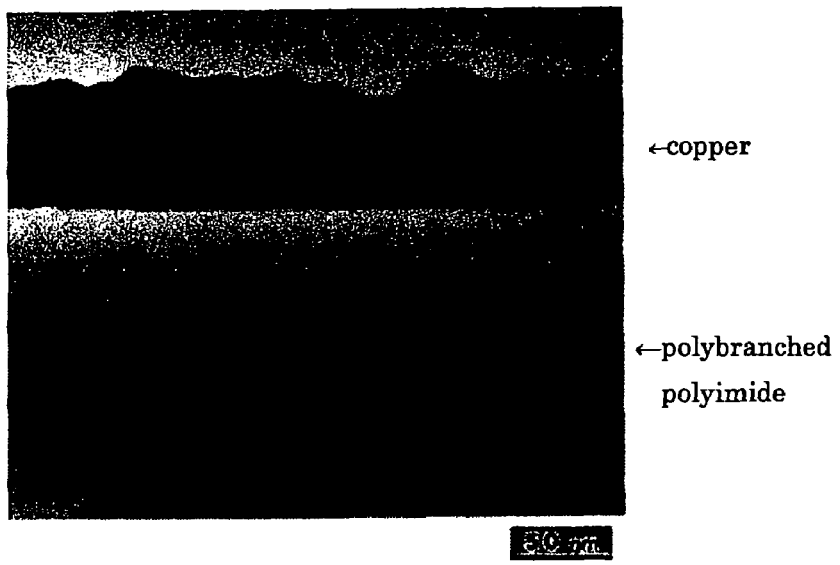
Figures 1, 2:
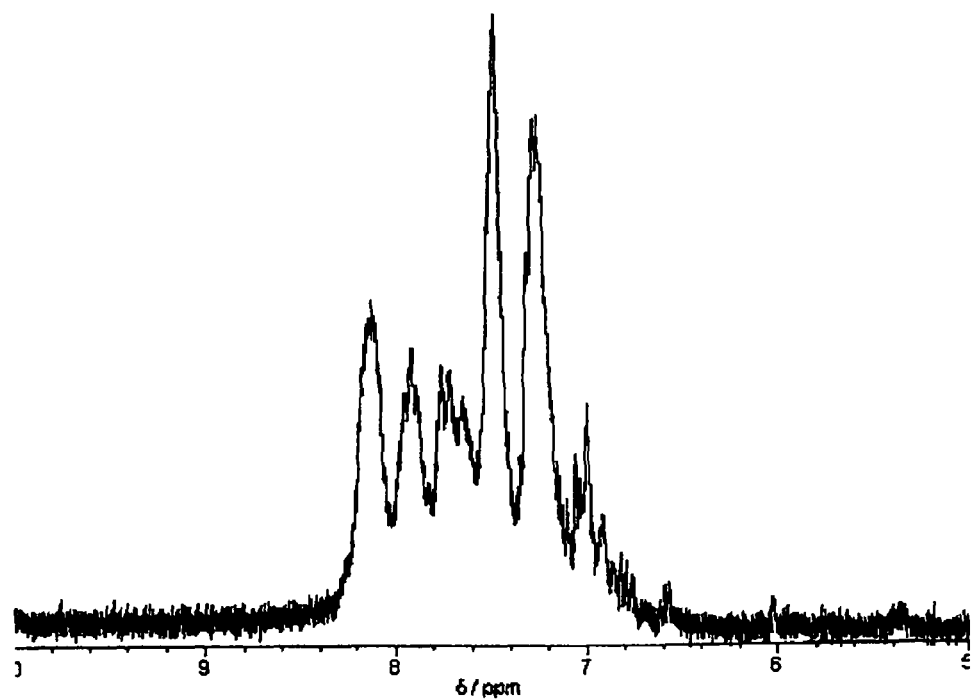
Figure 2:
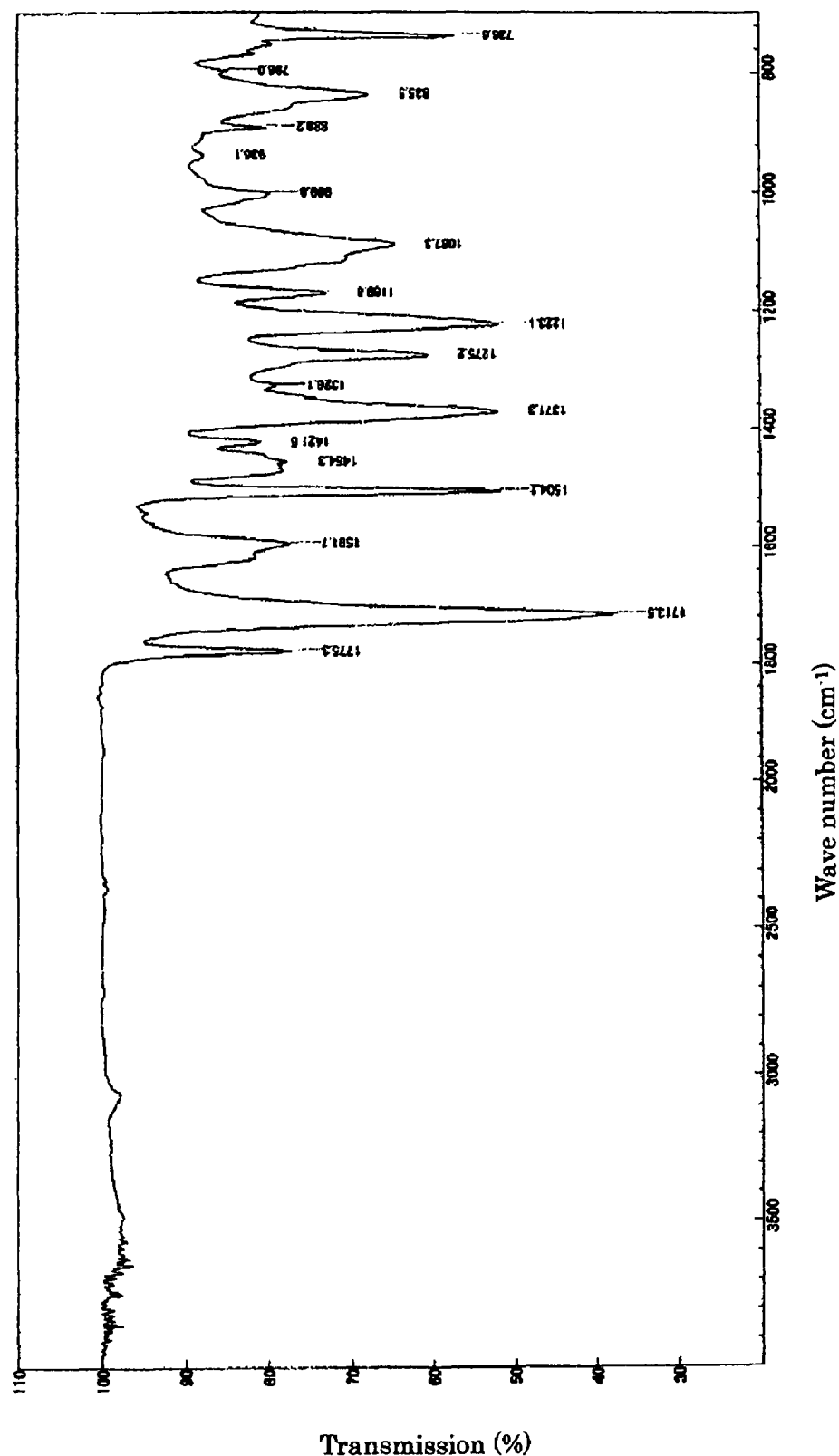
Figures 1, 3:
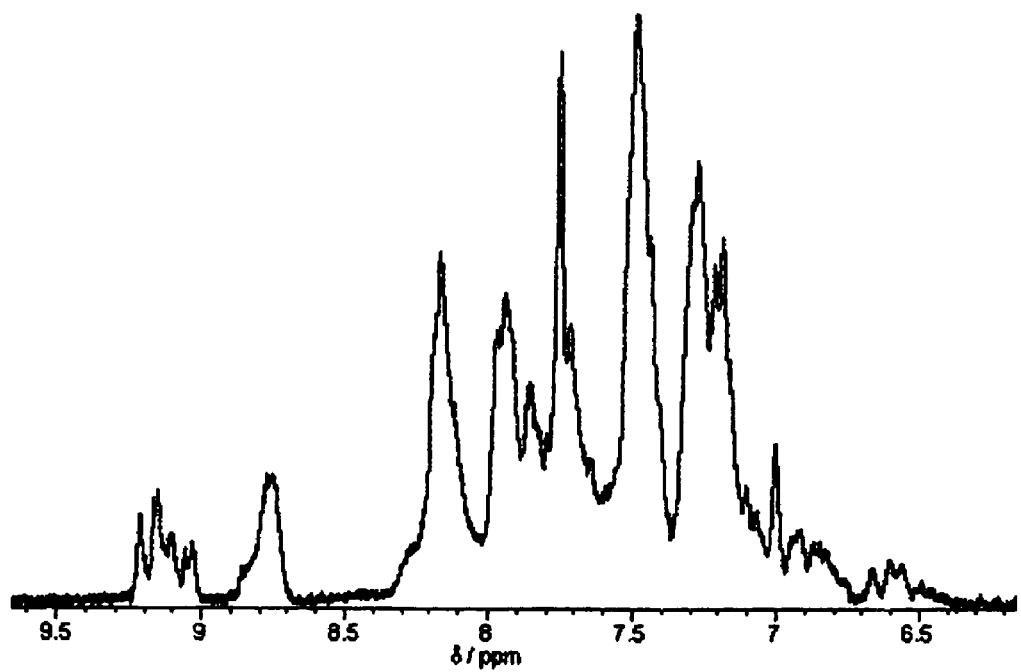

With respect to the terminally-modified polybranched polyimide of Example IV-2, $^1$H-NMR analysis (300 MHz, DMSO-$d_6$) was carried out and as a result, absorption of hydrogen atom bonded to an imino group carbon formed by reacting a terminal amino group of the polybranched polyamic acid with 2-hydroxy-5-nitrobenzaldehyde as shown in FIG. 4-2 was observed at 9.3 to 8.9 ppm.

With respect to the terminally-modified polybranched polyimide of Example IV-3, $^1$H-NMR analysis (300 MHz, DMSO-$d_6$) was carried out and as a result, absorption of hydrogen atom bonded to an imino group carbon formed by reacting a terminal amino group of the terminally-modified polybranched polyimide with o-vanillin as shown in FIG. 4-3 was observed at 9.1 to 8.8 ppm.

TABLE 16

| | Terminally-modified polyimide | | Terminally-modified polyamic acid | | Polybranched polyamic acid solution | | Amine; number of terminal group | Terminal group modifying agent | |
|---|---|---|---|---|---|---|---|---|---|
| | kind | 10% mass loss temperature (° C.) | kind | polymer concentration (mass %) | kind of polybranched polyamic acid | mass (g) | (mmol) | kind | mmol |
| Example IV-1 | DP1-1 | 487 | D1'-1 | 2.5 | A1' | 10 | 0.416 | modifying agent D1 | 0.629 |
| Example IV-2 | DP1-2 | 460 | D1'-2 | 2.5 | A1' | 10 | 0.416 | modifying agent D2 | 0.629 |
| Example IV-3 | DP1-3 | 458 | D1'-3 | 2.5 | A1' | 10 | 0.416 | modifying agent D3 | 0.629 |
| Example IV-4 | DP5-1 | 517 | D5'-1 | 2.5 | A5' | 5.0 | 0.214 | modifying agent D1 | 0.321 |
| Example IV-5 | DP7-1 | 519 | D7'-1 | 2.5 | A7' | 5.0 | 0.180 | modifying agent D1 | 0.270 |
| Example IV-6 | DP3-1 | 551 | D3'-1 | 2.5 | A3' | 5.0 | 0.238 | modifying agent D1 | 0.351 |
| Example IV-7 | DP8-1 | 518 | D8'-1 | 2.5 | A8' | 5.0 | 0.166 | modifying agent D1 | 0.252 |
| Example IV-8 | DP9-1 | 524 | D9'-1 | 2.5 | A9' | 5.0 | 0.202 | modifying agent D1 | 0.301 |
| Example IV-9 | DP6-1 | 599 | D6'-1 | 2.5 | A6' | 5.0 | 0.069 | modifying agent D1 | 0.102 |

Example IV-10

Polybranched Polyimide Film

The terminally-modified polybranched polyimide DP1-1 synthesized in Example IV-1 was dissolved in DMAc to prepare a 20 weight % terminally-modified polybranched polyimide solution, and the solution was coated on a glass substrate in the form of a film using a spin coating method. Subsequently, the resulting material was baked using a firing furnace in atmospheric air at 180° C. for evaporating the solvent, whereby a film of the terminally-modified polybranched polyimide was formed on the glass substrate.

According to FTIR-ATR analysis of the terminally-modified polybranched polyimide film illustrated in FIG. 4-10, absorption caused by a carbonyl group of the terminally-modified polybranched polyimide was observed at 1715 cm$^{-1}$.

Example IV-11

Synthesis of Palladium-Attached Polybranched Polyimide Film

The terminally-modified polybranched polyimide film formed on the glass substrate prepared in Example IV-10 was immersed in an ethanol solution containing palladium acetate of $1.0\times10^{-3}$ mol·dm$^{-3}$ at room temperature for 3 minutes, subsequently washed with ethanol and water for 30 minutes, and then air-dried to obtain a palladium-attached polybranched polyimide film. According to the surface analysis by XPS, it was turned out that palladium with a surface atomic concentration of 0.40% was attached to this palladium-attached polybranched polyimide film.

Example IV-12

Synthesis of Copper-Coated Polybranched Polyimide

The palladium-attached polybranched polyimide film obtained in Example IV-11 was immersed in an electroless copper plating solution at room temperature (about 25° C.) for 60 seconds to carry out electroless copper plating. A copper thin film was formed without unevenness on a surface of the obtained palladium-attached polybranched polyimide A-1 film, exhibiting the surface resistance of $4.0\times10^{-1}$ Ω/□. The obtained copper-coated polybranched polyimide film was subjected to a peel test using a cellophane tape manufactured by Nichiban Co., Ltd. and as a result, copper was not peeled away from the polybranched polyimide film, exhibiting good adhesiveness.

Part V

Examples of the Fifth Aspect

Example V-1

Synthesis of 3,5-dihydroxyaniline

To a 200-mL, 2-necked flask was added 31.5 g (250 mmol) of 1,3,5-trihydroxybenzene. After replaced with argon, 25 mL of 28% ammonia and water were added thereto, and the resulting mixture was stirred in a water bath for 18 hours. Water was removed away in vacuo and 50 mL of isopropanol was added. The obtained mixture was ice-cooled for 2 hours to precipitate a solid and the precipitated solid was obtained by filtration. The solid was washed with isopropanol and then vacuum-dried, whereby a desired product was obtained (Quantity: 11.4 g, 91.3 mmol, Yield: 37%).

The obtained compound was analyzed in the following manner. Here, the absorption of an amino group was wide and not able to assign.

1) $^1$HNMR (300 MHz, CD$_3$OD): δ5.75 (d, 2H), 5.69 (t, 1H).

Synthesis of 3,5-di(4-nitrophenoxy)aniline

To a 100-mL, 3-necked flask equipped with a Dean-Stark trap and a reflux tube were added 15.8 g (126 mmol) of 3,5-dihydroxyaniline and 250 mL of anhydrous N,N-dimethylformamide (DMF), and the resulting mixture was stirred at room temperature. 30.0 g (217 mmol) of potassium carbonate and 25 mL of toluene were added thereto, and then the mixture was stirred at a temperature of 100° C. for 2 hours. The reaction mixture was cooled down to 70° C. and 38.9 g (276 mmol) of p-fluoronitrobenzene was added thereto, and the reaction mixture was again stirred at 100° C. for 7 hours. Toluene was removed away in vacuo and the reaction mixture was poured into 1 L of ice water, and a yellow solid was precipitated. The solid was obtained by filtration, washed with a small amount of water and then vacuum-dried, whereby a desired product was obtained (Quantity: 39.0 g, 106 mmol, Yield: 84%).

The obtained compound was analyzed as follows.
1) $^1$HNMR (300 MHz, CDCL$_3$): 8.25-8.17 (m, 4H), 7.12-7.04 (m, 4H), 6.25 (d, 2H), 6.18 (t, 1H), 4.04-3.84 (br, 2H).
2) Melting point: 180 to 182° C.
3) Elemental Analysis: $C_{18}H_{13}N_3O_6$.
Measured value C, 58.74%; H, 3.53%; N, 11.42%.
Theoretical value C, 58.86%; H, 3.57%; N, 11.44%.

Example V-2

Synthesis of 3,5-di(4-aminophenoxy)aniline

To a 500-mL, 2-necked flask were added 7.34 g (20.0 mmoL) of 3,5-di(4-nitrophenoxy)aniline and 5% Pd/C (427 mg), and 400 mL of anhydrous ethanol was added thereto. Thereafter, the mixture was stirred in a normal-pressure hydrogen atmosphere at room temperature for 13 hours. After completion of the reaction, the catalyst was separated by filtration and the solvent was removed away in vacuo, whereby a desired product was obtained (Quantity: 5.89 g, 19.2 mmoL, Yield: 96%).

The obtained compound was analyzed as follows.
1) $^1$HNMR (300 MHz, CDCL$_3$): δ6.90-6.81 (m, 4H), 6.78-6.60 (m, 4H), 5.98 (t, 1H), 5.87 (d, 2H), 4.20-2.80 (br, 6H).
2) Melting point: 177 to 178° C.
3) Elemental Analysis: $C_{18}H_{17}N_3O_2$.
Measured value C, 70.15%; H, 5.39%; N, 13.50%.
Theoretical value C, 70.34%; H, 5.58%; N, 13.67%.

Example V-3

Synthesis of Polyamic Acid

To a 100-mL, 3-necked flask equipped with a dropping funnel were added 3.32 mmoL of 3,5-di(4-aminophenoxy)aniline obtained in Example V-2 and anhydrous N,N-dimethylacetamide. While the resulting mixture was stirred at room temperature, 3.32 mmoL of 3,3',4,4'-biphenyltetracarboxylic dianhydride was added thereto over 6 hours and the mixture was stirred at room temperature through the night, whereby a 2.5 weight % polyamic acid VA solution was obtained. According to GPC analysis, the number average molecular weight of the polyamic acid VA was 3.7×10$^4$.

Example V-4

Synthesis of Polyamic Acid

To a 500-mL, 4-necked flask equipped with a dropping funnel were added 11.2 mmoL of 3,3',4,4'-biphenyltetracarboxylic dianhydride and anhydrous N,N-dimethylacetamide. While the resulting mixture was stirred at room temperature, a solution obtained by dissolving 5.58 mmoL of 3,5-di(4-aminophenoxy)aniline obtained in Example V-2 in anhydrous N,N-dimethylacetamide was added dropwise thereto over 5 hours. The mixture was stirred at room temperature through the night, whereby a 2.5 weight % polyamic acid VB solution was obtained. According to GPC analysis, the number average molecular weight of the polyamic acid was 1.7×10$^4$.

The molar ratio (acid/diamine) of 3,3',4,4'-biphenyltetracarboxylic acid dianhydride and 3,5-di(4-aminophenoxy)aniline was 2.01.

Examples V-5 and V-6

Synthesis of Polyimide

To a 25-mL Schlenk flask equipped with a Dean-Stark trap were added the polyamic acid solution (5.00 g) synthesized in Examples V-3 and V-4, and xylene (2.5 mL), and the resulting mixture was heated and stirred at a temperature of 150 to 160° C. for 3 hours. After completion of the reaction, ethanol and hexane were added to precipitate a solid, and the precipitated solid was obtained by filtration. The solid was washed with ethanol and hexane, and then vacuum-dried, whereby polyimide VA and polyimide VB were respectively obtained. According to TG-DTA analysis, the 10% weight loss temperatures of the polyimide VA and polyimide VB were 562 and 596° C.

Examples V-7 and V-8

Polyimide Film

Figures 1, 4:
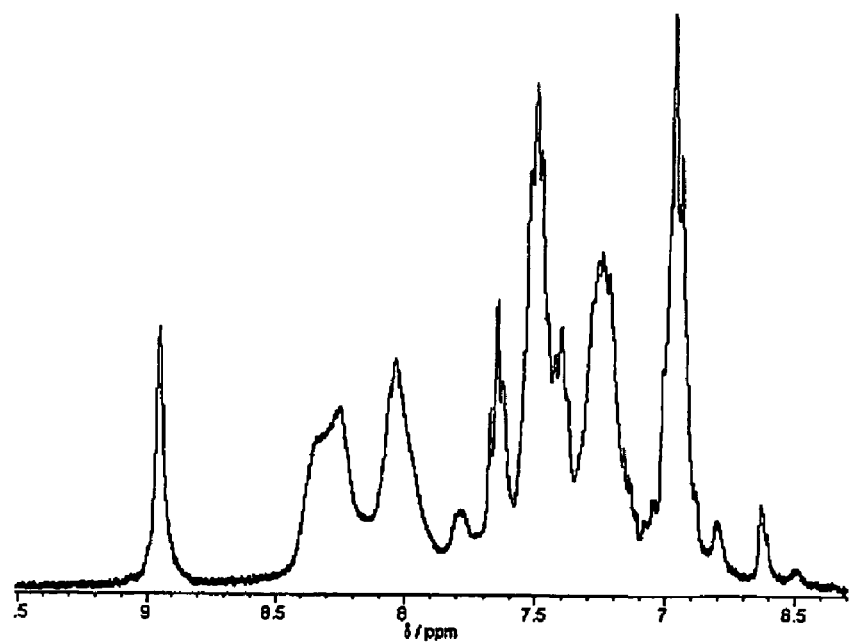
Figures 2, 4:
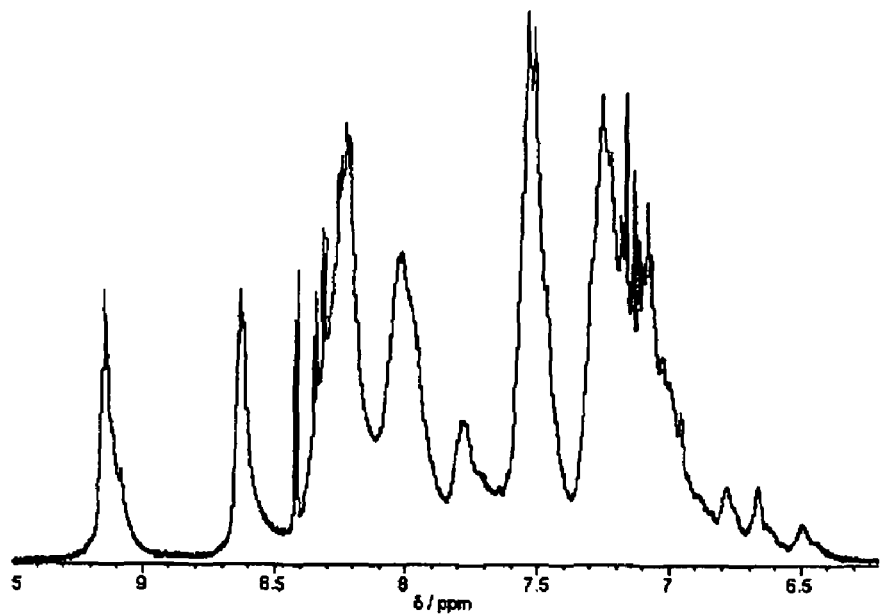
Figures 3, 4:
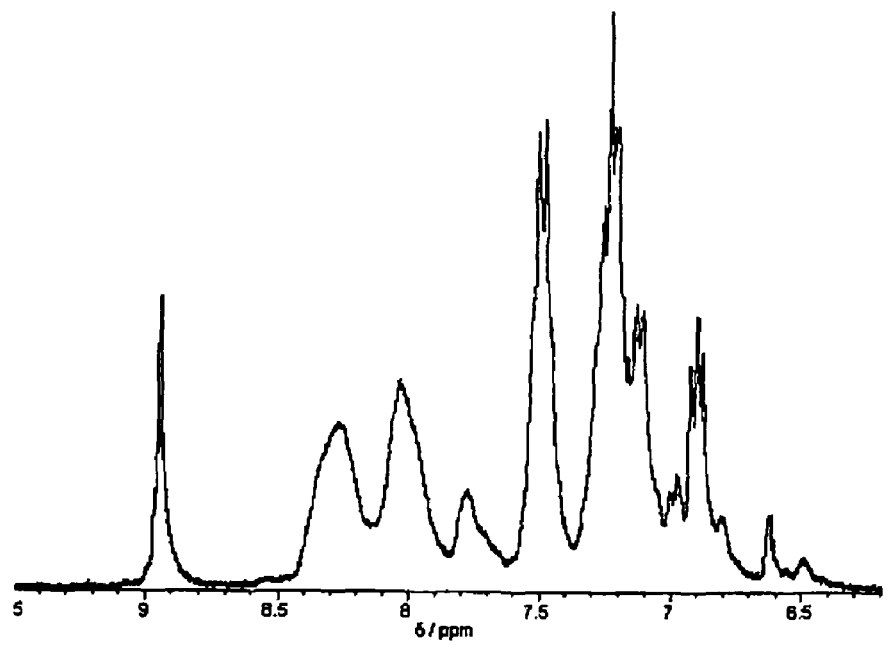
Figure 4:
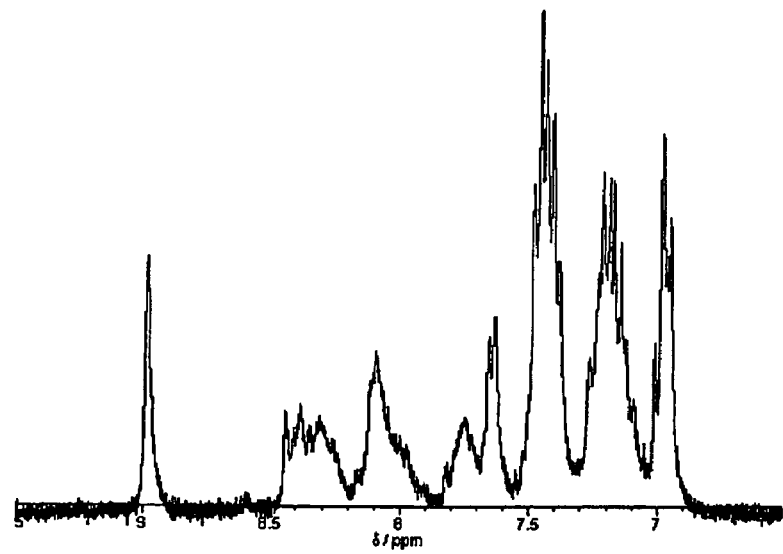
Figures 4, 5:
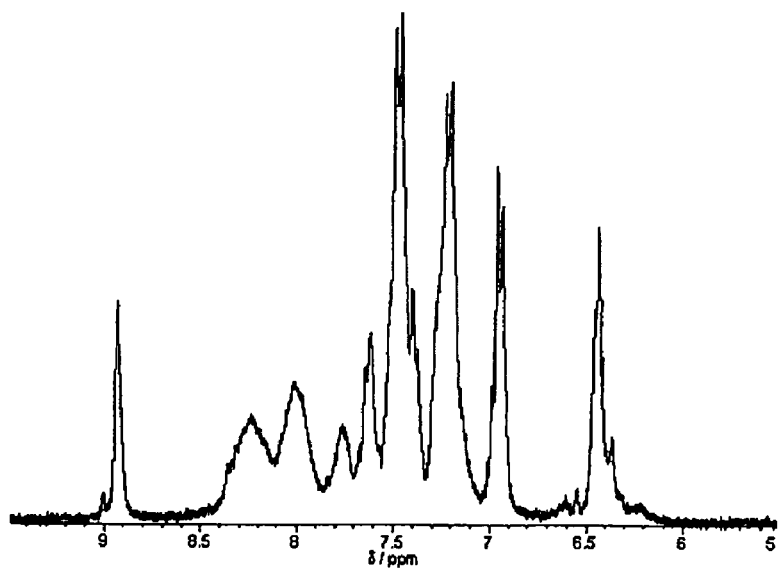
Figures 4, 5, 6, 7, 8:
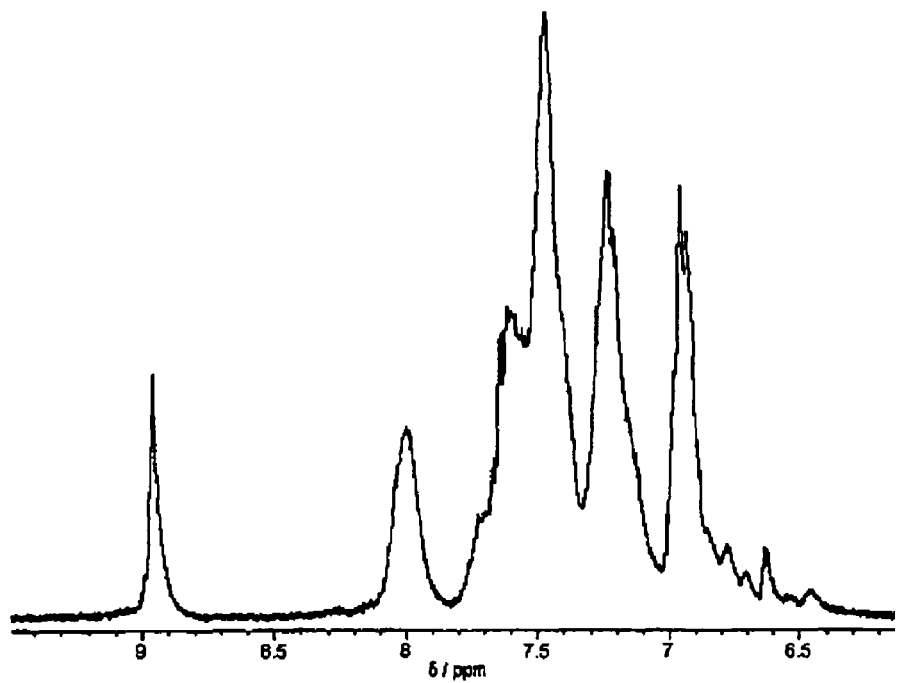
Figures 4, 5, 6, 7, 8, 9:
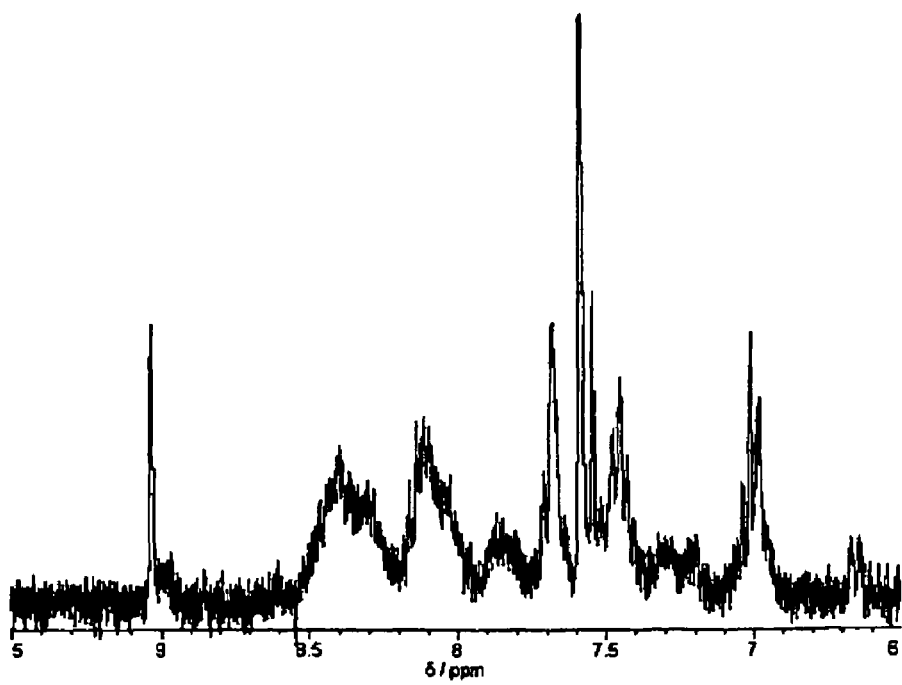
Figures 4, 5, 6, 7, 8, 9, 10:
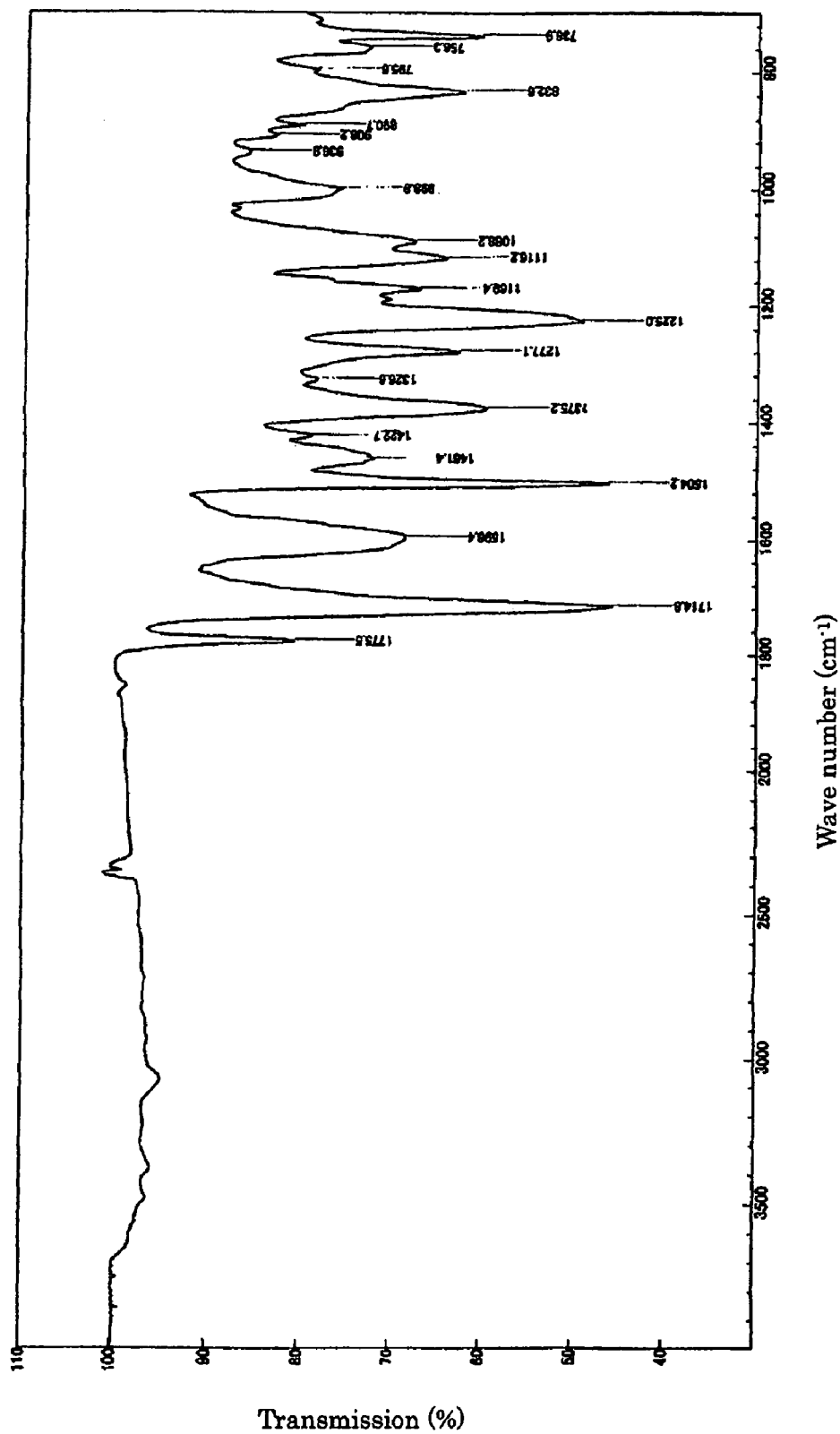
Figures 1, 5:
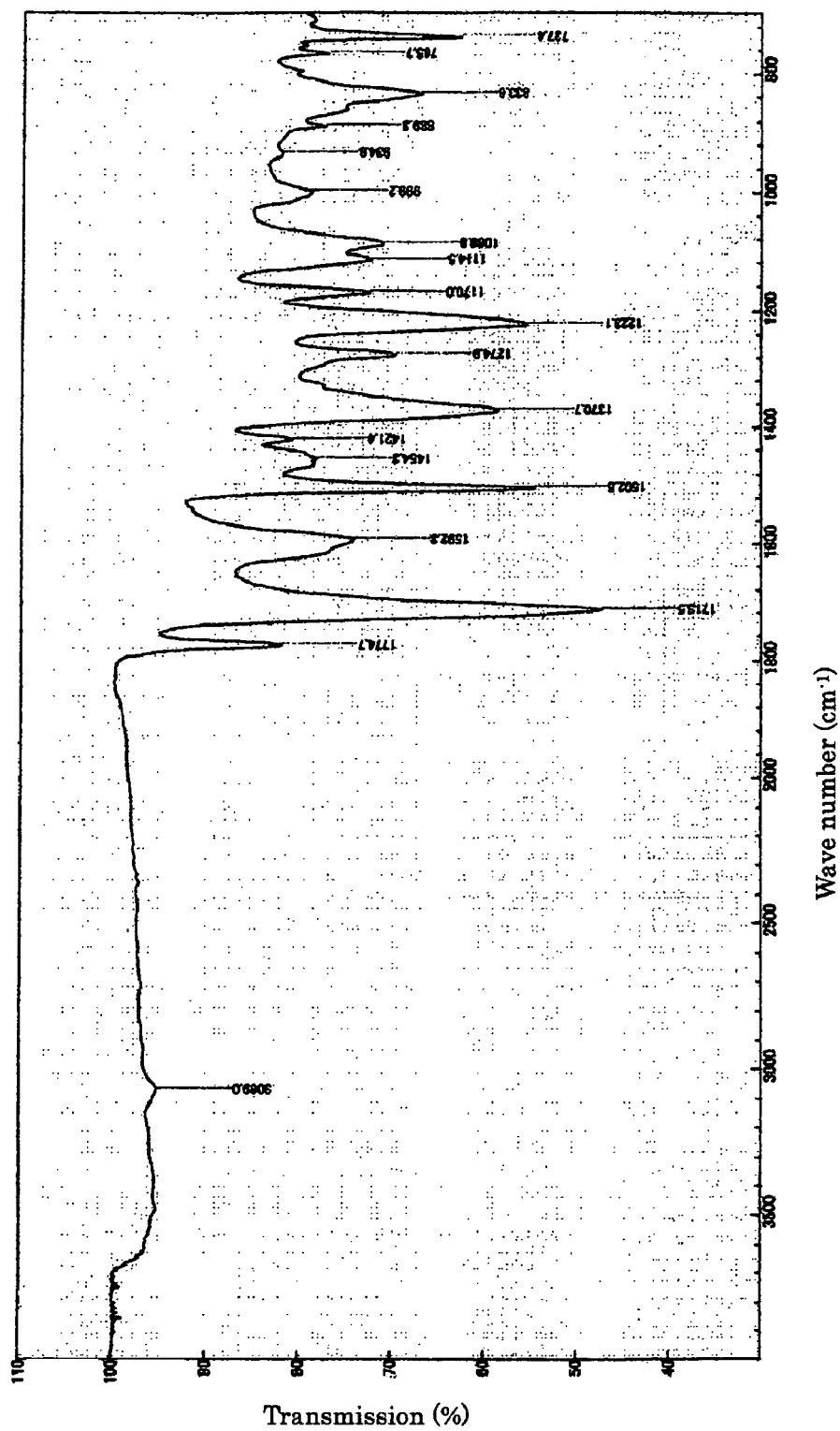
Figures 2, 5:
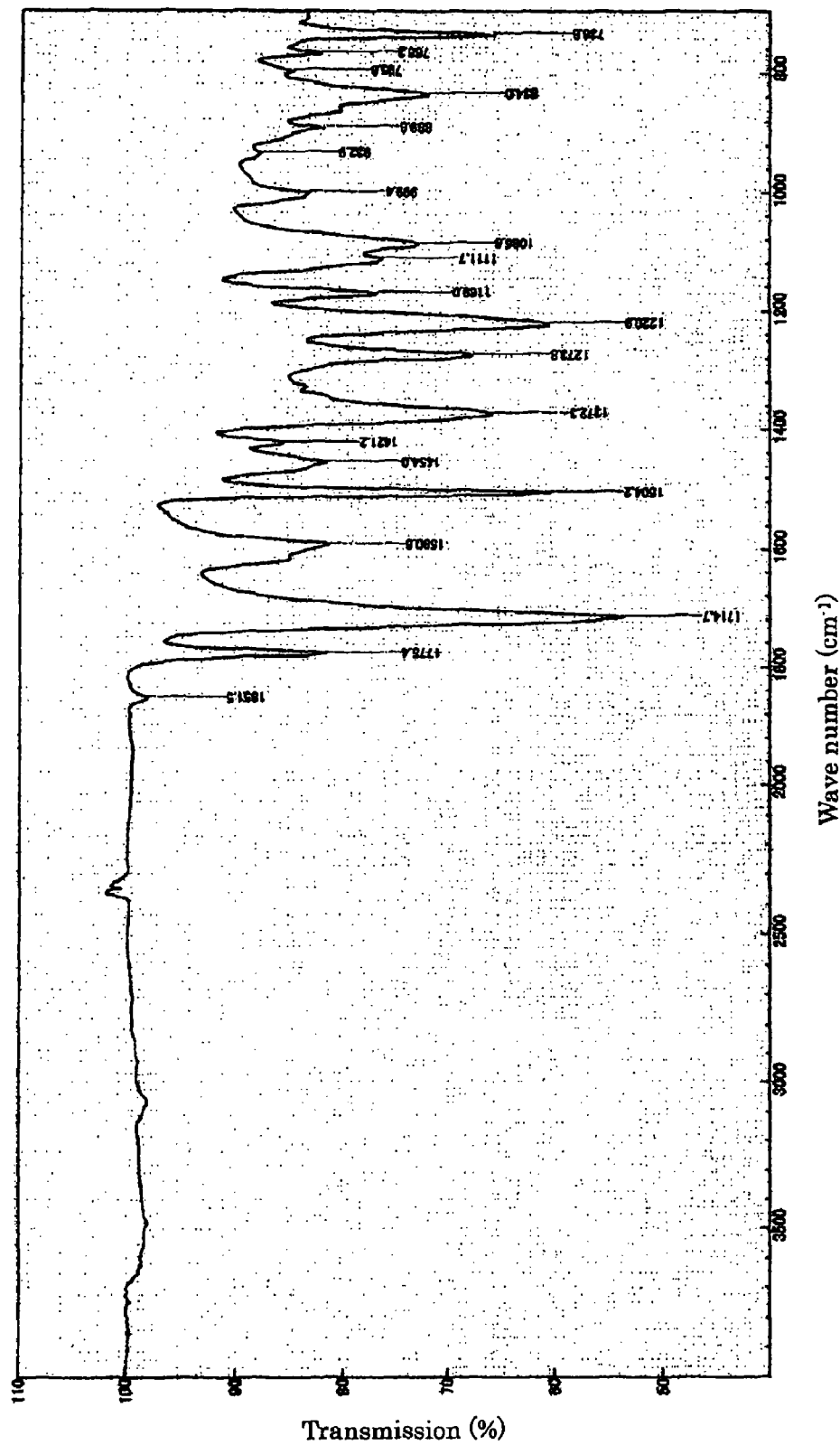

The 2.5 weight % polyamic acid solution synthesized in Examples V-3 and V-4 was concentrated under a reduced pressure, whereby a 10 weight % polyamic acid solution was prepared. The concentrated solution was transparent and fluid. The 10 weight % polyamic acid solution was coated on a glass substrate by spin coating method. Subsequently, the resulting material was baked using a firing furnace in atmospheric air at 350° C., whereby polyimide film VA2 and polyimide film VB2 were respectively formed on the glass substrate. The FT-IR spectra of the obtained films were measured and the results are illustrated in FIGS. 5-1 and 5-2. From FIG. 5-1, absorption of imidocarbonyl group could be confirmed at 1714 cm$^{-1}$. From FIG. 5-2, absorption of imidocarbonyl group could be confirmed at 1715 cm$^{-1}$.

Example V-9

Synthesis of Polyimide Film for Accelerating Electroless Plating

The polyimide film formed on the glass substrate obtained in Example V-7 was immersed in a sodium tetrachloropalladate-containing aqueous solution (pH 4.3) of 1.0×10$^{-3}$ mol/dm$^3$ containing a small amount of sodium chloride at room temperature for 3 minutes. Next, the polyimide film was peeled away from the substrate, washed with water for 30 minutes and then air-dried. According to the surface analysis by XPS, it was turned out that palladium with a surface atomic concentration of 0.38% was attached to the polyimide film.

The palladium-attached polyimide film was subjected to electroless copper plating (plating condition: room temperature, immersion time: 2 minutes), washed and dried to obtain a copper-plated polyimide film with a copper thin film formed without unevenness on a surface of the polyimide film.

The surface resistance of a copper-plated side of the copper-plated polyimide film was 9.8×10$^{-1}$Ω/□. The obtained copper-plated polyimide film was subjected to a peel test using a cellophane tape manufactured by Nichiban Co., Ltd. and as a result, copper was not peeled away from the polyimide film, exhibiting good adhesiveness.

Composition of Electroless Copper Plating Solution

Copper sulfate pentahydrate: 3.0 g, potassium sodium tartrate tetrahydrate: 14.0 g, sodium hydroxide: 4.0 g, 37% formalin: 10 mL, water: 100 mL.

INDUSTRIAL APPLICABILITY

The terminally-modified polybranched polyimide of the present invention is useful as materials for a flexible printed circuit board, TAB or the like.

The invention claimed is:

1. A terminally-modified polybranched polyimide obtained by reacting:

component (a): tetracarboxylic dianhydride:

component (b): as an amine component, a mixture of a triamine and a diamine, wherein the mixture may be composed of a triamine only; and component (c): as a terminal component, a compound selected from general formulae (1-1) to (1-4);

such that at least a part of polymer terminal is derived from the compound selected from the general formulae (1-1) to (1-4);

$$H_2N\text{—}X\text{—}R^1 \quad (1\text{-}1)$$

wherein, in the general formula (1-1), X represents a single bond or an alkylene group having 1 to 3 carbon atoms; $R^1$ represents a nitrogen-containing heterocyclic group substituted with any group selected from a substituent group α; and the substituent group α represents hydrogen atom, halogen atom, hydroxyl group, nitro group, carboxylic acid group and salt thereof, sulfonic acid group and salt thereof, ester group, amide group, cyano group, alkyl group, alkoxy group or aryl group;

$$H_2N\text{—}X\text{—}R^1 \quad (1\text{-}2)$$

wherein, in the general formula (1-2), X represents a single bond or an alkylene group having 1 to 3 carbon atoms; $R^1$ represents a sulfur-containing heterocyclic group or an aryl group having a thiol or thioether group in the molecule, which are substituted with any group selected from the substituent group α; wherein the substituent group α is as defined in the general formula (1-1);

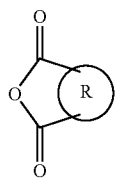
(1-3)

wherein, in the general formula (1-3), R represents a nitrogen-containing heterocyclic group substituted with any group selected from the substituent group α; wherein the substituent group α is as defined in the general formula (1-1);

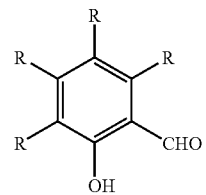
(1-4)

wherein, in the general formula (1-4), R each represents a monovalent residue and have the same meaning as the substituent group α defined in the general formula (1-1); and R may be the same or different each other.

2. The terminally-modified polybranched polyimide according to claim 1, wherein the terminal component is selected from the compounds represented by the general formulae (1-1) and (1-2) and the amine component is composed of triamine only, and the polyimide is obtained by reacting tetracarboxylic dianhydride and triamine of the molar ratio {the molar ratio of (tetracarboxylic dianhydride)/(triamine)} of not less than 3/2 with a compound selected from those represented by the general formulae (1-1) and (1-2).

3. The terminally-modified polybranched polyimide according to claim 1, wherein the terminal component is selected from those represented by the general formulae (1-3) and (1-4) and the amine component is composed of triamine only, and the polyimide is obtained by reacting tetracarboxylic acid dianhydride and triamine of the molar ratio {the molar ratio of (tetracarboxylic dianhydride)/(triamine)} of from 1/2 to less than 3/2 with a compound selected from those represented by the general formulae (1-3) and (I-4).

4. The terminally-modified polybranched polyimide according to claim 1, obtained by reacting:

(i) a polyamic acid obtained by reacting the component (a): tetracarboxylic dianhydride and the component (b): the amine component, and (ii) the component (c): the terminal component.

5. The terminally-modified polybranched polyimide according to claim 1, wherein the compound represented by the general formula (I-I) has at least one pyridyl group in the molecule.

6. The terminally-modified polybranched polyimide according to claim 1, wherein the compound represented by the general formula (1-2) has at least one thioether moiety in the molecule.

7. The terminally-modified polybranched polyimide according to claim 1, wherein the compound represented by the general formula (1-3) has at least one pyridyl group in the molecule.

8. The terminally-modified polybranched polyimide according to claim 1, wherein the compound represented by the general formula (1-4) is salicylaldehyde.

9. The terminally-modified polybranched polyimide according to claim 1, which is formed on one side or both sides of a heat resistant polyimide film.

10. The terminally-modified polybranched polyimide according to claim 9, obtained by:

applying a polyamic acid solution capable of forming a terminally-modified polybranched polyimide on a cast layer of the polyamic acid solution or a self-supporting film obtained by heat-drying the cast layer of the polyamic acid solution both of which are capable of forming heat resistant polyimide film, by a coating method, a casting method or a printing method, and then heat-drying and imidizing the resulting film.

11. The terminally-modified polybranched polyimide according to claim 9, wherein the heat resistant polyimide film is a polyimide obtained from an acid component containing 3,3',4,4'-biphenyltetracarboxylic dianhydride and a diamine component containing p-phenylene diamine or a polyimide obtained from an acid component containing pyromellitic dianhydride and an amine component containing 4,4'-diaminodiphenyl ether.

12. A terminally-modified polybranched polyimide for accelerating electroless plating, wherein an electroless plating catalyst precursor has been adsorbed on the terminally-modified polybranched polyimide according to claim 1.

13. The terminally-modified polybranched polyimide for accelerating electroless plating according to claim 12, wherein the electroless plating catalyst precursor is a palladium compound.

14. A metal-coated terminally-modified polybranched polyimide, wherein electroless metal plating has been carried out on the terminally-modified polybranched polyimide for accelerating electroless plating according to claim 12.

15. A method for producing a metal-coated terminally-modified polybranched polyimide comprising steps of:
  (1) producing a terminally-modified polybranched polyimide by reacting:
  component (a): tetracarboxylic acid dianhydride:
  component (b): as an amine component, a mixture of triamine and diamine, wherein the mixture may be composed of triamine only; and
  component (c): as a terminal component, a compound selected from general formulae (1-1) to (1-4)
  such that at least a part of polymer terminal IS derived from the compound selected from general formulae (1-1) to (1-4);
  (2) producing a terminally-modified polybranched polyimide for accelerating electroless plating by causing adsorption of an electroless plating catalyst precursor onto the terminally-modified polybranched polyimide: and
  (3) producing a metal-coated terminally-modified polybranched polyimide by carrying out electroless metal plating on the terminally-modified polybranched polyimide for accelerating electroless plating;

(1-1)

wherein, in the general formula (1-1), X represents a single bond or an alkylene group having 1 to 3 carbon atoms; $R^1$ represents a nitrogen-containing heterocyclic group substituted with any group selected from a substituent group α; and the substituent group α represents hydrogen atom, halogen atom, hydroxyl group, nitro group, carboxylic acid group and salt thereof, sulfonic acid group and salt thereof, ester group, amide group, cyano group, alkyl group, alkoxy group or aryl group;

(1-2)

wherein, in the general formula (1-2), X represents a single bond or an alkylene group having 1 to 3 carbon atoms; $R^1$ represents a sulfur-containing heterocyclic group or an aryl group having a thiol or thioether group in the molecule, which are substituted with any group selected from the substituent group α; wherein the substituent group α is as defined in the general formula (1-1);

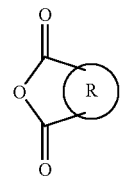
(1-3)

wherein, in the general formula (1-3), R represents a nitrogen-containing heterocyclic group substituted with any group selected from the substituent group α; wherein the substituent group α is as defined in the general formula (1-1);

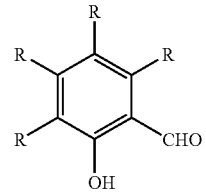
(1-4)

wherein, in the general formula (1-4), R each represent a monovalent residue and have the same meaning as the substituent group α defined in the general formula (1-1); and R may be the same or different each other.

16. The method for producing a metal-coated terminally-modified polybranched polyimide according to claim 15, in which, in the step (1), the terminal component is selected from the compounds represented by the general formulae (1-1) and (1-2) and the amine component is composed of triamine only, and tetracarboxylic dianhydride and triamine of the molar ratio {the molar ratio of (tetracarboxylic dianhydride)/(triamine)} of not less than 3/2 are reacted with a compound selected from those represented by the general formulae (1-1) and (1-2).

17. The method for producing a metal-coated terminally-modified polybranched polyimide according to claim 15, in which, in the step (1), the terminal component is selected from those represented by the general formulae (1-3) and (1-4) and the amine component is composed of triamine only, and tetracarboxylic dianhydride and triamine of the molar ratio {the molar ratio of (tetracarboxylic dianhydride)/(triamine)} of from 1/2 to less than 3/2 are reacted with a compound selected from those represented by the general formulae (1-3) and (1-4).

18. The method for producing a metal-coated terminally-modified polybranched polyimide according to claim 15, in which, in the step (1) of producing a terminally-modified polybranched polyimide, a polyamic acid obtained by reacting the component (a): tetracarboxylic dianhydride and the component (b): the amine component is reacted with the component (c): the terminal component.

19. The terminally-modified polybranched polyimide according to claim 1, wherein the triamine is an aromatic triamine represented by the general formula (I)

(I) 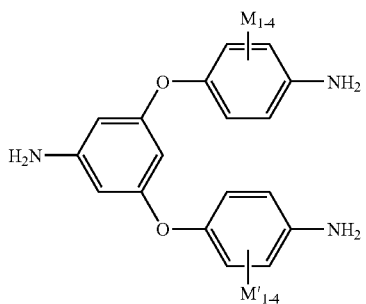

wherein, in the general formula (I), $M_1$ to $M_4$ and $M'_1$ to $M'_4$ each represent —H, —CN, —OCH$_3$, —COOH, —CH$_3$, —C$_2$H$_5$ or —CF$_3$; and $M_1$ to $M_4$ and $M'_1$ to $M'_4$ may each independently be the same or different.

20. The terminally-modified polybranched polyimide for accelerating electroless plating according to claim 12, wherein the triamine is an aromatic triamine represented by the general formula (I).

21. The metal-coated terminally-modified polybranched polyimide according to claim 14, wherein the triamine is an aromatic triamine represented by the general formula (I).

* * * * *